United States Patent
Matsumoto et al.

(10) Patent No.: US 8,223,050 B2
(45) Date of Patent: Jul. 17, 2012

(54) DELTA-SIGMA A/D CONVERTER

(75) Inventors: Takashi Matsumoto, Kanagawa (JP);
Toshio Kumamoto, Kanagawa (JP);
Takashi Okuda, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 40 days.

(21) Appl. No.: 12/911,345

(22) Filed: Oct. 25, 2010

(65) Prior Publication Data
US 2011/0095925 A1 Apr. 28, 2011

(30) Foreign Application Priority Data
Oct. 28, 2009 (JP) .................. 2009-247694

(51) Int. Cl.
*H03M 1/20* (2006.01)
(52) U.S. Cl. ........................ 341/131; 341/143
(58) Field of Classification Search .................. 341/131, 341/143, 155, 120, 118, 144, 172
See application file for complete search history.

(56) References Cited

U.S. PATENT DOCUMENTS
2004/0036636 A1* 2/2004 Mai et al. .................. 341/131

FOREIGN PATENT DOCUMENTS
JP 06-120837 4/1994
JP 2003-163596 6/2003

OTHER PUBLICATIONS
Schreier, R., et al., "Understanding Delta-Sigma Data Converters", 2007, pp. 34-37, Maruzen Co., Ltd.

* cited by examiner

*Primary Examiner* — Joseph Lauture
(74) *Attorney, Agent, or Firm* — McDermott Will & Emery LLP

(57) ABSTRACT

In a delta-sigma A/D converter provided with plural channels for converting an analog input signal into a digital signal, an adverse influence of an idle tone is reduced in each channel. The delta-sigma A/D converter comprises: a first quantizer which quantizes and outputs a received signal; a first D/A converter which converts an output signal of the first quantizer into an analog signal, and outputs the converted analog signal; a first operation unit which outputs a signal indicative of a difference of the first analog input signal and an output signal of the first D/A converter; a first integrator which integrates an output signal of the first operation unit and outputs the integrated signal; a first dither circuit which generates a first dither signal; and a second operation unit which adds the first dither signal to the output signal of the first integrator and outputs the added signal to the first quantizer.

9 Claims, 35 Drawing Sheets

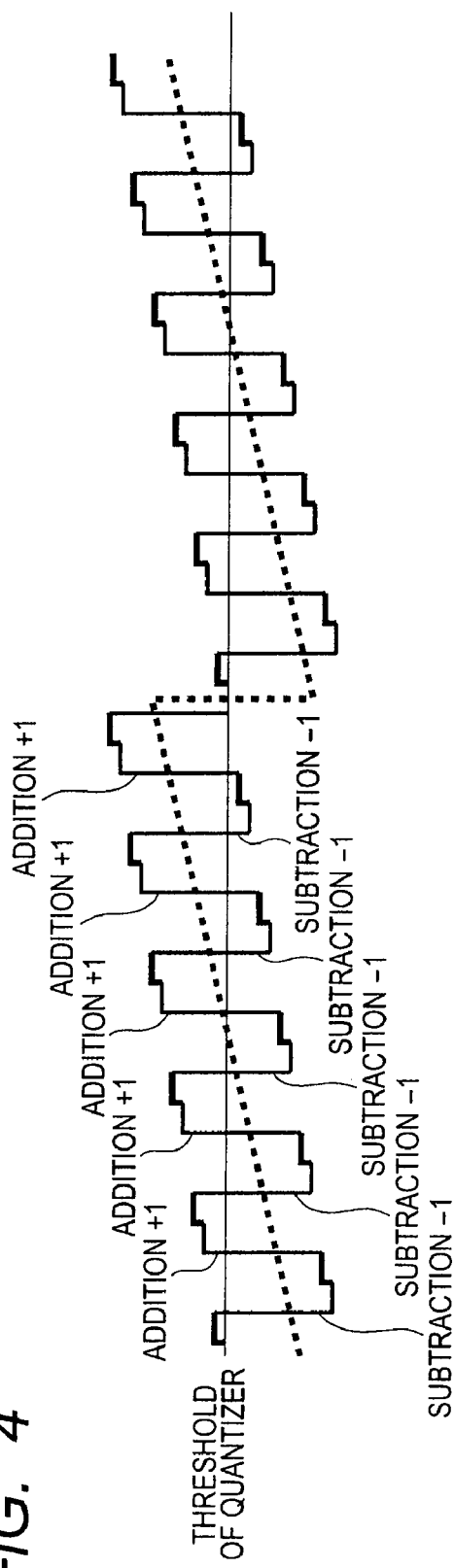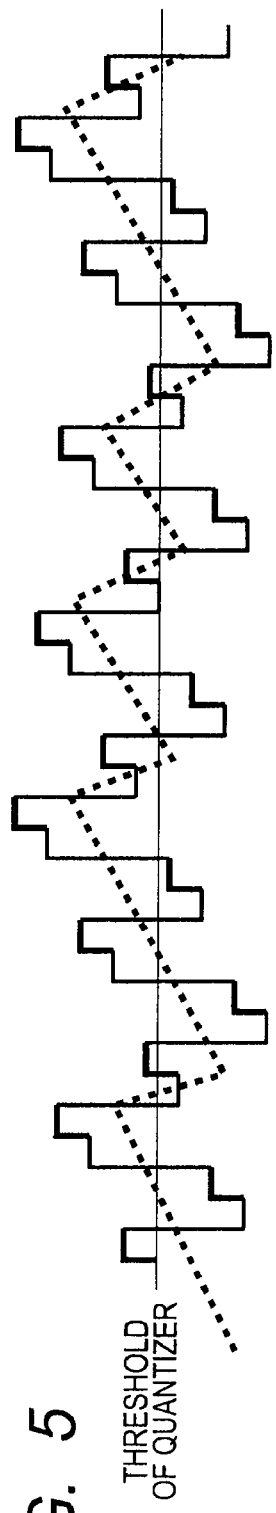

US 8,223,050 B2

DELTA-SIGMA A/D CONVERTER

CROSS REFERENCES TO RELATED APPLICATIONS

The disclosure of Japanese Patent Application No. 2009-247694 filed on Oct. 28, 2009 including the specification, drawings and abstract is incorporated herein by reference in its entirety.

BACKGROUND OF THE INVENTION

The present invention relates to a delta-sigma (LS) A/D converter, especially, to a delta-sigma A/D converter provided with plural channels for converting an analog input signal into a digital signal.

Various arts on a delta-sigma A/D converter have been proposed up to now. For example, Patent Document 1 describes an art which can control zeros in the quantization noise shape with a high degree of accuracy, and without the necessity of considering the minimum size of a process in use. Patent Document 2 describes an art which suppresses an adverse influence of an idle tone generated in a delta-sigma A/D converter, with the use of a direct-current (DC) dither signal (DC addition voltage). Here, an idle tone is a periodic noise signal caused by an integrating circuit and a feedback loop of the delta-sigma A/D converter, when there is no analog input signal to the delta-sigma A/D converter, or when the analog input signal concerned is very small. Details of the idle tone are described in Non-patent Document 1, for example.

(Patent Document 1) Japanese Patent Laid-open No. Hei 6 (1994)-120837
(Patent Document 2) Japanese Patent Laid-open No. 2003-163596
(Non-patent Document 1) "Understanding Delta-Sigma Data Converters": authored by Richard Schreier and Gabor C. Temes, Japanese translation edition supervised by Takao Waho and Akira Yasuda (Literal translation of the title of Japanese edition is "An introduction to delta-sigma analog-to-digital converter"), published by Maruzen Co., Ltd., October 10, Heisei 19 (2007), pp. 34-37.

SUMMARY OF THE INVENTION

Now, in a delta-sigma A/D converter provided with plural channels for converting an analog input signal into a digital signal like a delta-sigma A/D converter for audios, even if the converter utilizes simply a DC dither signal, that is a DC addition voltage, as described in the art of Patent Document 2, it is not easy to sufficiently suppress an adverse influence of an idle tone in each channel due to mutual interference between the channels.

The present invention has been made in view of the above circumstances to solve the above-described subject and provides a delta-sigma A/D converter which can reduce an adverse influence of an idle tone in each channel in a delta-sigma A/D converter provided with plural channels for converting an analog input signal into a digital signal.

In a delta-sigma A/D converter according to one embodiment of the present invention, in summary, a dither signal is added in an output stage of an integrator or in an input stage of a quantizer, and different dither signals are added in each channel.

According to one embodiment of the present invention, it is possible to move a frequency of an idle tone to a frequency region higher than a desired frequency band in each channel, because different dither signals are superimposed in each channel. Therefore, it is possible to suppress an adverse influence of an idle tone in each channel.

BRIEF DESCRIPTION OF THE DRAWINGS

FIG. 4 is an explanatory drawing for an idle tone generated in a delta-sigma modulator;

FIG. 5 is an explanatory drawing for an idle tone generated in a delta-sigma modulator;

FIG. 13 (b) is an explanatory drawing for the reason that the input voltage range of the delta-sigma A/D converter 200 is limited;

FIG. 13 (c) is an explanatory drawing for the reason that the input voltage range of the delta-sigma A/D converter 200 is limited;

FIG. 13 (d) is an explanatory drawing for the reason that the input voltage range of the delta-sigma A/D converter 200 is limited;

DETAILED DESCRIPTION OF THE PREFERRED EMBODIMENTS

Hereinafter, with reference to the accompanying drawings, the embodiments of the present invention are explained in detail. In drawings, the same reference symbol will be given to the same portion or the corresponding portion, and the explanation thereof will not be repeated.

A Comparative Example

A Delta-Sigma A/D Converter 200

Figure 1:
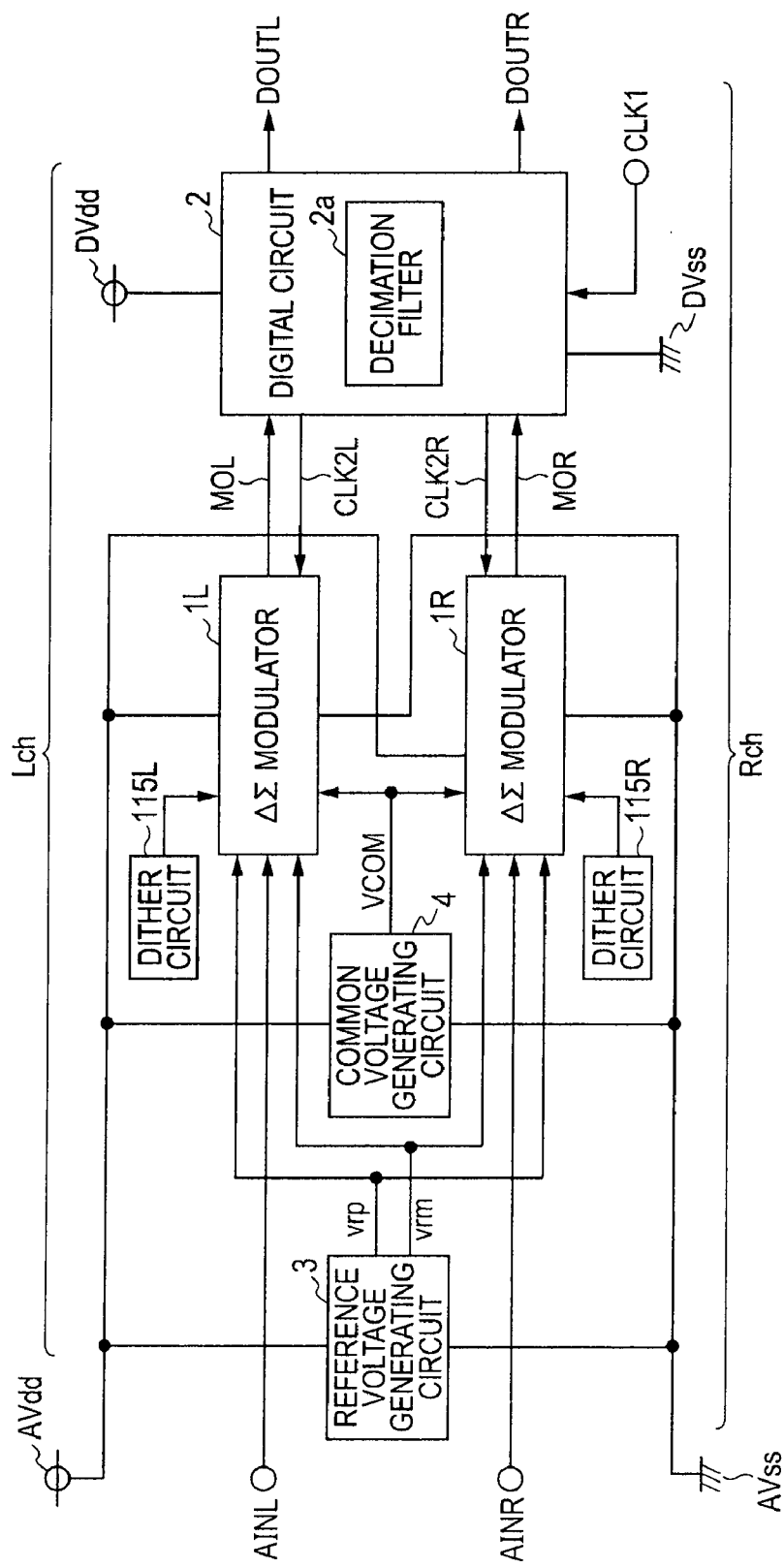
FIG. 1 is a drawing illustrating a configuration of a comparative example to a delta-sigma A/D converter according to each embodiment of the present invention.

FIG. 1 illustrates a configuration of a comparative example to a delta-sigma A/D converter according to each embodiment of the present invention.

As illustrated in FIG. 1, the delta-sigma A/D converter 200 corresponds to an audio-use oversampling A/D converter, for example. The delta-sigma A/D converter 200 is formed on a single semiconductor substrate together with other circuits, such as a CPU for example, and configures a semiconductor device, combined with the other circuits concerned.

As illustrated in FIG. 1, the delta-sigma A/D converter 200 comprises an L channel Lch for converting an analog input signal AINL for the left-hand side into a digital signal, and an R channel Rch for converting an analog input signal AINR for the right-hand side into a digital signal. The L channel Lch comprises a delta-sigma modulator 1L and the R channel Rch comprises a delta-sigma modulator 1R. A digital circuit 2, a reference voltage generating circuit 3, and a common voltage generating circuit 4 are provided to be shared by the L channel Lch and the R channel Rch.

The reference voltage generating circuit 3 generates a plus-side reference voltage vrp and a minus-side reference voltage vrn based on a power supply voltage AVdd and a ground voltage AVss for analog circuits. The reference voltage generating circuit 3 outputs the plus-side reference voltages vrp and the minus-side reference voltages vrn to each of the delta-sigma modulators 1L and 1R. The common voltage generating circuit 4 generates a common voltage VCOM based on the power supply voltage AVdd and the ground voltage AVss. The common voltage generating circuit 4 outputs the generated common voltage VCOM to each of the delta-sigma modulators 1L and 1R.

Each of the delta-sigma modulators 1L and 1R operates based on the power supply voltage AVdd and the ground voltage AVss. The delta-sigma modulator 1L performs oversampling of the analog input signal AINL for the left-hand side based on a clock signal CLK2L for oversampling outputted from the digital circuit 2. The delta-sigma modulator 1L integrates a difference of the obtained sampling signal and a signal which has been converted from the own output signal MOL of a digital format into an analog format, quantizes the obtained integration signal, and outputs the quantized signal as the output signal MOL.

Similarly, the delta-sigma modulator 1R performs oversampling of the analog input signal AINR for the right-hand side based on a clock signal CLK2R for oversampling outputted from the digital circuit 2. The delta-sigma modulator 1R integrates a difference of the obtained sampling signal and a signal which has been converted from the own output signal MOR of a digital format into an analog format, quantizes the obtained integration signal, and outputs the quantized signal as the output signal MOR.

The delta-sigma A/D converter 200 comprises further dither circuits 115L and 115R which generate DC addition voltages for the L channel Lch and for the R channel Rch, respectively. The DC addition voltage is employed in order to suppress an adverse influence of an idle tone generated in the delta-sigma modulators 1L and 1R.

Each frequency of the clock signals CLK2L and CLK2R for oversampling is set up as 64 times the original sampling frequency fs, for example. That is, the oversampling rate in the delta-sigma modulators 1L and 1R is set up as 64 times.

The digital circuit 2 operates based on the power supply voltage DVdd and the ground voltage DVss. The digital circuit 2 divides a system clock signal CLK1 inputted to generates the clock signals CLK2L and CLK2R, and outputs them. The digital circuit 2 comprises a decimation filter 2a which performs filtering and skipping to the output signal MOL. Thereby, the sampling frequency to the analog input signal AINL falls to the original sampling frequency fs. The decimation filter 2a outputs serially the obtained binary code signal as a digital output signal DOUTL. The present digital output signal DOUTL is the resultant digital signal converted from the analog input signal AINL for the left-hand side.

The decimation filter 2a performs filtering and skipping to the output signal MOR as well. Thereby, the sampling frequency to the analog input signal AINR falls to the original sampling frequency fs. The decimation filter 2a outputs serially the obtained binary code signal as a digital output signal DOUTR. The present digital output signal DOUTR is the resultant digital signal converted from the analog input signal AINR for the right-hand side.

It is assumed that, for example, the power supply voltages AVdd and DVdd and the plus-side reference voltage vrp are set as the same positive value (for example, +5 V), and that the minus-side reference voltage vrn is set as the same value (0 V) as the ground voltages AVss and DVss. It is also assumed that, for example, the common voltage VCOM is set as a middle voltage of the power supply voltage AVdd and the ground voltage AVss, in other words as a middle voltage of the plus-side reference voltage vrp and the minus-side reference voltage vrn.

Figure 2:
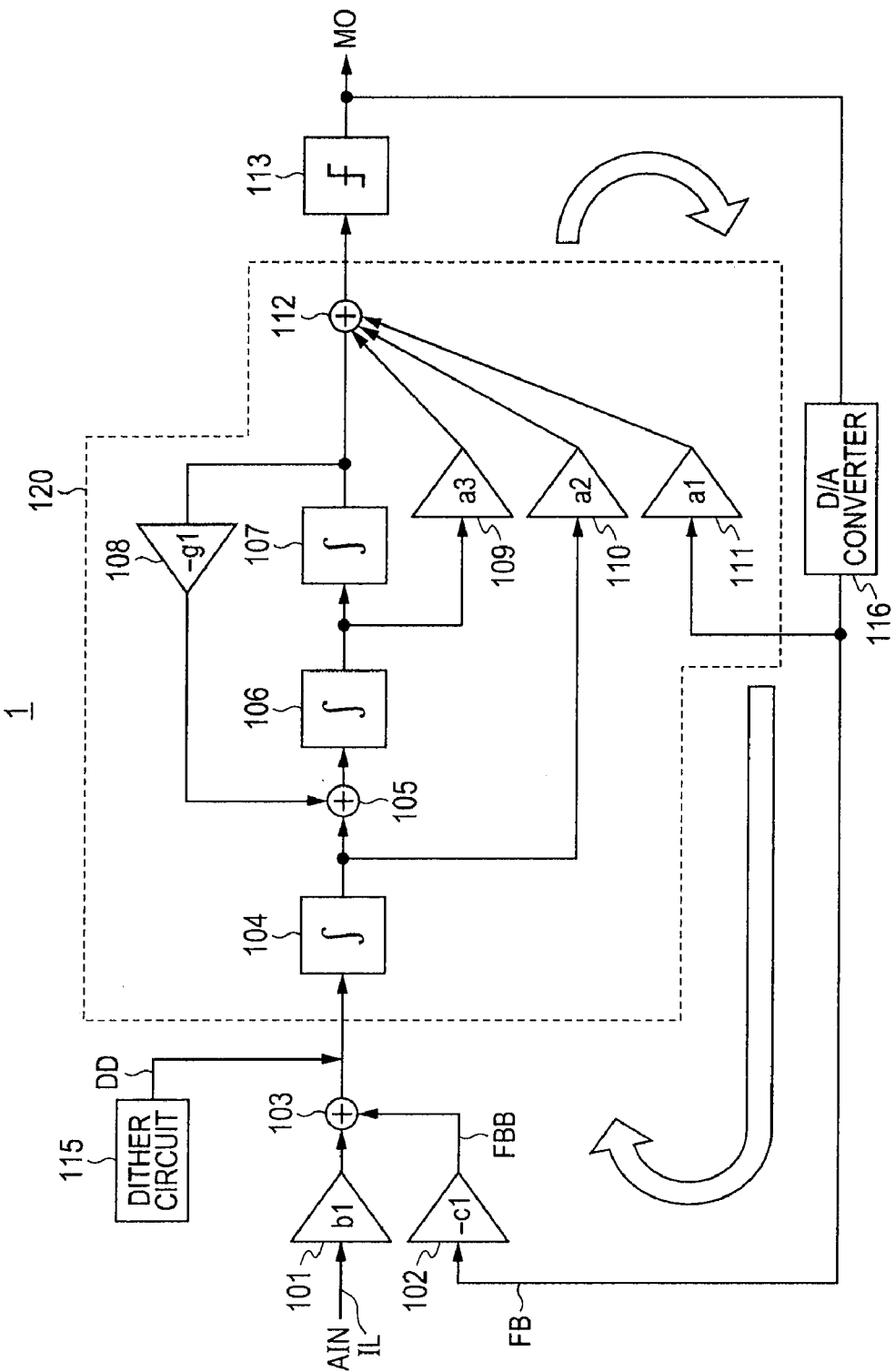
FIG. 2 is a block diagram illustrating an example of configuration of delta-sigma modulators 1L and 1R.

FIG. 2 is a block diagram illustrating an example of configuration of the delta-sigma modulators 1L and 1R. The delta-sigma modulators 1L and 1R have the same configuration with each other. Henceforth, the delta-sigma modulators 1L and 1R are collectively called a "delta-sigma modulator 1." The dither circuits 115L and 115R have the same configuration with each other. Henceforth, the dither circuits 115L and 115R are collectively called a "dither circuit 115." The analog input signals AINL and AINR are collectively called an "analog input signal AIN", the output signals MOL and MOR is collectively called an "output signal MO", and the clock signals CLK2L and CLK2R are collectively called a "clock signal CLK2."

As illustrated in FIG. 2, each delta-sigma modulator 1 of the L channel Lch and the R channel Rch is the third-order modulator, for example, and comprises gain stages 101 and 102, an addition unit 103, an integrating circuit 120, a quantizer 113, a dither circuit 115, and a D/A converter 116. By utilizing the DC addition voltage DD which the dither circuit 115 outputs, an adverse influence of an idle tone generated in the delta-sigma modulator 1 is suppressed.

The gain stage 101 amplifies a signal of an input line IL, to which the analog input signal AIN is inputted, to increase the signal level b1 times (b1 is a positive value), and outputs the amplified signal as an output signal. The gain stage 102 amplifies a feedback signal FB outputted from the D/A converter 116 to increase the signal level −c1 times (c1 is a positive value), and outputs the amplified signal as an inverted feedback signal FBB. The addition unit 103 adds and outputs the output signal of the gain stage 101 and the inverted feedback signal FBB outputted from the gain stage 102. That is, a difference signal of the output signal of the gain stage 101 and the feedback signal FB is outputted from the addition unit 103. In the state where the analog input signal AIN is inputted to the input line IL, a difference signal of the analog input signal AIN and the feedback signal FB is outputted from the addition unit 103.

Here, the signal line from the input line IL to the addition unit 103 is a signal line which propagates the analog input signal AIN concerned when the analog input signal AIN is inputted into the L channel Lch or the R channel Rch. Therefore, in the addition unit 103, when the analog input signal AIN is inputted into the L channel Lch or the R channel Rch, a difference of a signal of the signal line which propagates the analog input signal AIN concerned and the feedback signal FB will be obtained.

The dither circuit 115 generates a DC addition voltage DD, and superimposes the DC addition voltage on the difference signal obtained by the addition unit 103. The integrating circuit 120 comprises three stages of integrators 104, 106, and 107, addition units 105 and 112, and gain stages 108-111. The integrating circuit 120 integrates and outputs the difference signal obtained by the addition unit 103, when describing more precisely, the difference signal on which the DC addition voltage DD has been superimposed.

The integrator 104 integrates and outputs a signal obtained by superimposing the DC addition voltage DD on the difference signal obtained by the addition unit 103. The addition unit 105 adds and outputs an output signal of the integrator 104 and an output signal of the gain stage 108. The integrator 106 integrates and outputs an output signal of the addition unit 105. The integrator 107 integrates and outputs an output signal of the integrator 106. The gain stage 108 amplifies an output signal of the integrator 107 to increase the signal level −g1 times (g1 is a positive value), and outputs the amplified signal. The gain stage 109 amplifies an output signal of the integrator 106 to increase the signal level a3 times (a3 is a positive value), and outputs the amplified signal. The gain stage 110 amplifies an output signal of the integrator 104 to increase the signal level a2 times (a2 is a positive value), and outputs the amplified signal. The gain stage 111 amplifies the feedback signal FB outputted from the D/A converter 116 to increase the signal level a1 times (a1 is a positive value), and outputs the amplified signal. The addition unit 112 adds and outputs an output signal of the integrator 107 and output signals of the gain stages 109-111.

The quantizer 113 is a one-bit quantizer, for example, quantizes an output signal of the addition unit 112 by one bit, and outputs the quantized signal obtained, as an output signal MO. The D/A converter 116 converts into an analog signal the output signal MO which is a one-bit digital signal, and outputs the converted analog signal as the feedback signal FB.

In the delta-sigma modulator 1 configured as described above, since the analog input signal AIN is oversampled, a signal level of a quantization error included in the output signal MO in a desired frequency band is reduced greatly. Furthermore, since the delta-sigma modulator 1 has a feedback loop which returns the output signal MO to the input side as illustrated by two outline arrows of FIG. 2, the quantization error included in the output signal MO tends to be distributed, dominating at high frequencies. Therefore, the quantization error can be greatly reduced by filtering the output signal MO with a low pass filter in the digital circuit 2 of the subsequent stage. It is called "noise shaping" to distribute the quantization error dominantly at high frequencies, as described above.

Figure 3:
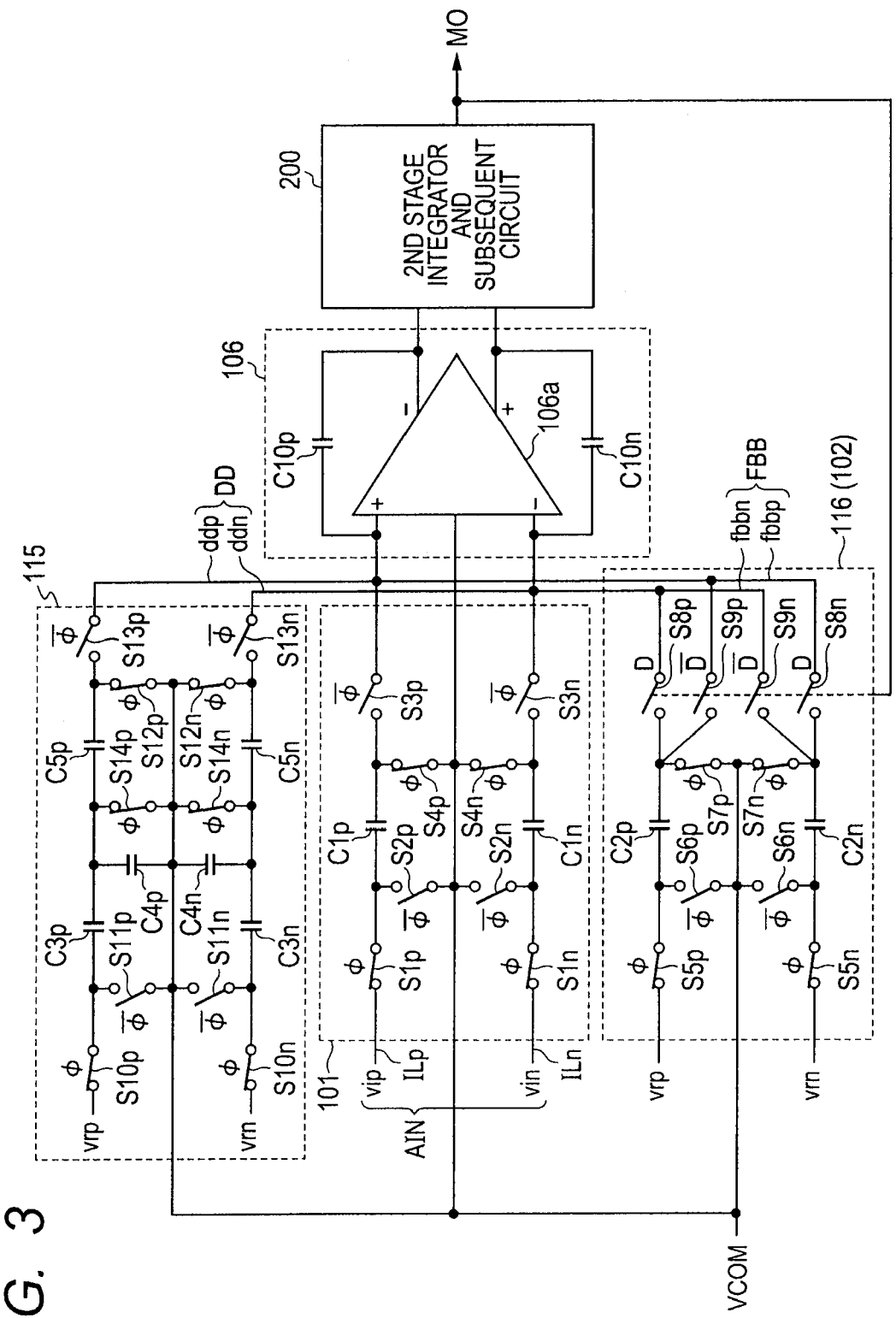
FIG. 3 is a drawing illustrating a circuit configuration of a preceding stage of the delta-sigma modulator 1.

FIG. 3 illustrates a circuit configuration of a preceding stage of the delta-sigma modulator 1. The analog input signal AIN is a differential signal comprising a pair of input signals vip and vin which are complementary with each other. Each signal level of the input signals vip and vin changes in the opposite direction with respect to the common voltage VCOM, accordingly, the input signal vin is a signal obtained by inverting the input signal vip with respect to the common voltage VCOM. The signal level of the analog input signal AIN is given by a value obtained by subtracting the signal voltage of the input signal vin from the signal voltage of the input signal vip.

Corresponding to the fact that the analog input signal AIN is a differential signal, an input signal and an output signal (except for the output signal MO of a digital format) of each element which is comprised in the delta-sigma modulator 1 are a differential signal. For example, the DC addition voltage DD and the inverted feedback signal FBB are respectively a differential signal. The input line IL where the analog input signal AIN is inputted comprises a pair of signal lines ILp and ILn. It is also preferable that each signal in the delta-sigma modulator 1 is treated as a single-ended signal.

The DC addition voltage DD is a differential signal obtained from a pair of DC signals ddn and ddp which are complementary with each other. A signal level of the DC signal ddp is positive with respect to a reference level (for example, the common voltage VCOM), and a signal level of the DC signal ddn is negative with respect to the reference level (for example, the common voltage VCOM). The signal level of the DC addition voltage DD is a value corresponding to a value obtained by subtracting the signal level of the DC signal ddn from the signal level of the DC signal ddp. The inverted feedback signal FBB is a differential signal obtained from a pair of signals fbbn and fbbp which are complementary with each other. The signal level of the inverted feedback signal FBB corresponds to a value obtained by subtracting the signal level of the signal fbbn from the signal level of the signal fbbp.

As illustrated in FIG. 3, the gain stage 101 comprises a switched-capacitor circuit which is provided with switching devices S1$n$-S4$n$ and S1$p$-S4$p$, and capacitors C1$n$ and C1$p$. The integrator 106 is provided with a differential output operational amplifier 106$a$, and a holding capacitors (integral capacity) C10$n$ and C10$p$.

In the integrator 106, one end of the holding capacitor C10$p$ is coupled to a noninverting input terminal of the differential output operational amplifier 106$a$. The other end of the holding capacitor C10$p$ is coupled to an inverted output terminal of the differential output operational amplifier 106$a$ and a circuit 200 which comprises the second-stage integrator 107 and the subsequent stages thereof in the delta-sigma modulator 1. One end of the holding capacitor C10$n$ is coupled to an inverting input terminal of the differential output operational amplifier 106$a$. The other end of the holding capacitor C10$n$ is coupled to a noninverting output terminal of the differential output operational amplifier 106$a$ and the circuit 200 which comprises the second-stage integrator 107 and the subsequent stages thereof in the delta-sigma modulator 1. The common voltage VCOM is supplied to the differential output operational amplifier 106$a$ as an operating reference voltage.

In the gain stage 101, one end of the switching device S1$p$ is coupled to the signal line ILp to which the input signal vip is inputted, and the other end of the switching device S1$p$ is coupled to one end of the capacitor C1$p$ and one end of the switching device S2$p$. The other end of the capacitor C1$p$ is coupled to one end of the switching device S4$p$ and one end of the switching device S3$p$. The other end of the switching device S3$p$ is coupled to the noninverting input terminal of the differential output operational amplifier 106$a$ of the integrator 106. The common voltage VCOM is supplied to the other end of the switching device S2$p$ and the other end of the switching device S4$p$.

One end of the switching device S1$n$ is coupled to the signal line ILn to which the input signal vin is inputted, and the other end of the switching device S1$n$ is coupled to one end of the capacitor C1$n$ and one end of the switching device S2$n$. The other end of the capacitor C1$n$ is coupled to one end of the switching device S4$n$ and one end of the switching device S3$n$. The other end of the switching device S3$n$ is coupled to the inverting input terminal of the differential output operational amplifier 106$a$. The common voltage VCOM is supplied to the other end of the switching device S2$n$ and the other end of the switching device S4$n$.

Each of the switching devices S1$n$, S4$n$, S1$p$, and S4$p$ turns to an on state from an off state at a phase $\phi$ of each cycle of the clock signal CLK2, and maintains the on state for a prescribed period. On the other hand, each of the switching device S2$n$, S3$n$, S2$p$, and S3$p$ turns to an on state from an off state at a phase $\phi$ bar (in the figure, "$\phi$ bar" is expressed with a horizontal line drawn over the character $\phi$) of each cycle of the clock signal CLK2, and maintains the on state for a prescribed period. Phase $\phi$ and phase $\phi$ bar are in a relation of reversed phase, namely, in a relation different by 180 degrees.

In the gain stage 101 configured as described above, each of the switching devices S1$p$-S4$p$ performs a regular switching operation based on the clock signal CLK2, the input signal vip inputted into the signal line ILp is sampled at a frequency of, for example, 64 times the sampling frequency fs, and a signal level of the sampled input signal vip is adjusted. Also in the gain stage 101, each of the switching devices S1$n$-S4$n$ performs a regular switching operation based on the clock signal CLK2, the input signal vin inputted into the signal line ILn is sampled at a frequency of the same 64 times the sampling frequency fs, and a signal level of the sampled input signal vin is adjusted.

As is the case with the gain stage 101, the D/A converter 116 comprises a switched-capacitor circuit which is provided with switching devices S5$n$-S9$n$ and S5$p$-S9$p$, and capacitors C2$n$ and C2$p$. The D/A converter 116 illustrated in FIG. 3 has also a function of the gain stage 102 described above.

One end of the switching device S5$p$ is supplied with the plus-side reference voltage vrp, and the other end of the switching device S5$p$ is coupled to one end of the capacitor C2$p$ and one end of the switching device S6$p$. The other end of the capacitor C2$p$ is coupled to one end of the switching device S7$p$, one end of the switching device S8$p$, and one end of the switching device S9$p$. The other end of the switching device S8$p$ is coupled to the inverting input terminal of the differential output operational amplifier 106$a$ of the integrator 106, and the other end of the switching device S9$p$ is coupled to the noninverting input terminal of the differential output operational amplifier 106$a$. The common voltage VCOM is supplied to the other end of the switching device S6$p$ and the other end of the switching device S7$p$.

One end of the switching device S5$n$ is supplied with the minus-side reference voltage vrn, and the other end of the switching device S5$n$ is coupled to one end of the capacitor C2$n$ and one end of the switching device S6$n$. The other end of the capacitor C2$n$ is coupled to one end of the switching device S7$n$, one end of the switching device S8$n$, and one end of the switching device S9$n$. The other end of the switching device S8$n$ is coupled to the noninverting input terminal of the differential output operational amplifier 106$a$. The other end of the switching device S9$n$ is coupled to the inverting input terminal of the differential output operational amplifier 106$a$. The common voltage VCOM is supplied to the other end of the switching device S6$n$ and the other end of the switching device S7$n$.

Each of the switching devices S5n, S7n, S5p, and S7p turns to an on state from an off state at a phase ϕ of each cycle of the clock signal CLK2, and maintains the on state for a prescribed period. On the other hand, each of the switching devices S6n and S6p turns to an on state from an off state at a phase ϕ bar of each cycle of the clock signal CLK2, and maintain the on state for a prescribed period. At a phase ϕ bar of each cycle of the clock signal CLK2, each of the switching devices S8n and S8p turns to an on state when the output signal MO outputted from the quantizer 113 is a signal D which indicates a logic high level, and each of the switching devices S9n and S9p turns to an on state when the output signal MO is a signal D bar (in the figure, "D bar" is expressed with a horizontal line drawn over the character D) which indicates a logic low level. At a phase ϕ of each cycle of the clock signal CLK2, each of the switching devices S8n, S8p, S9n, and S9p turns to an off state.

In the D/A converter 116 configured as described above, the output signal MO from the quantizer 113 is converted into a differential signal of an analog format, and each of a pair of analog signals which form the differential signal concerned is reversed. Thereby, a pair of signals fbbn and fbbp which form the inverted feedback signal FBB are obtained. When the phase of the clock signal CLK2 turns to a phase ϕ bar, the signals fbbn and fbbp are added to output signals from the switching devices S3n and S3p of the gain stage 101, respectively. In this way, the difference signal of the output signal of the gain stage 101 and the feedback signal FB is obtained every cycle of the clock signal CLK2.

As is the case with the gain stage 101 and the D/A converter 116, the dither circuit 115 comprises a switched-capacitor circuit which is provided with switching devices S10n-S14n and S10p-S14p, and capacitors C3n-C5n and C3p-C5p. One end of the switching device S10p is supplied with the plus-side reference voltage vrp, and the other end of the switching device S10p is coupled to one end of the switching device S11p and one end of the capacitor C3p. The other end of the capacitor C3p is coupled to one end of the capacitor C4p, one end of the capacitor C5p, and one end of the switching device S14p. The other end of the capacitor C5p is coupled to one end of the switching device S12p and one end of the switching device S13p. The other end of the switching device S13p is coupled to the noninverting input terminal of the differential output operational amplifier 106a. The common voltage VCOM is supplied to the other end of the switching device S11p, the other end of the capacitor C4p, the other end of the switching device S12p, and the other end of the switching device S14p.

One end of the switching device S10n is supplied with the minus-side reference voltage vrn, and the other end of the switching device S10n is coupled to one end of the switching device S11n and one end of the capacitor C3n. The other end of the capacitor C3n is coupled to one end of the capacitor C4n, one end of the capacitor C5n, and one end of the switching device S14n. The other end of the capacitor C5n is coupled to one end of the switching device S12n and one end of the switching device S13n. The other end of the switching device S13n is coupled to the inverting input terminal of the differential output operational amplifier 106a. The common voltage VCOM is supplied to the other end of the switching device S11n, the other end of the capacitor C4n, the other end of the switching device S12n, and the other end of the switching device S14n.

Each of the switching devices S10n, S12n, S14n, S10p, S12p, and S14p turns to an on state from an off state at a phase ϕ of each cycle of the clock signal CLK2, and maintains the on state for a prescribed period. On the other hand, each of the switching devices S11n, S13n, S11p, and S13p turns to an on state from an off state at a phase ϕ bar of each cycle of the clock signal CLK2, and maintains the on state for a prescribed period.

In the dither circuit 115 configured as described above, each of the switching devices S11p-S14p performs a regular switching operation based on the clock signal CLK2, and the DC signal ddp outputted from the switching device S13p is superimposed on the difference signal of the output signal from the switching device S3p of the gain stage 101 and the signal fbbp from the D/A converter 116.

In the dither circuit 115, each of the switching devices S11n-S14n performs a regular switching operation based on the clock signal CLK2, and the DC signal ddn outputted from the switching device 513n is superimposed on the difference signal of the output signal from the switching device S3n of the gain stage 101 and the signal fbbn from the D/A converter 116.

The difference signal of the output signal of the switching device S3n and the signal fbbn, and the difference signal of the output signal of the switching device S3p and the signal fbbp are generated every cycle of the clock signal CLK2. The DC signals ddn and ddp are also generated every cycle of the clock signal CLK2. Therefore, a signal after the DC addition voltage DD is superimposed on the difference signal of the output signal of the gain stage 101 and the feedback signal FB is inputted into the integrator 106 every cycle of the clock signal CLK2, more specifically, for every phase ϕ bar of the cycle of the clock signal CLK2. Therefore, the integrator 106 integrates the difference of the output signal of the gain stage 101 and the feedback signal FB, every cycle of the clock signal CLK2.

Here, the signal level of the DC signal ddp generated by the dither circuit 115 depends on a value of capacitance of a synthetic capacitor comprising the capacitors C3p-C5p. For example, when the power supply voltage AVdd is set to 5 V, the signal level of the DC signal ddp is set as small as a value of several mV to several tens of mV. Therefore, the value of capacitance of the synthetic capacitor comprising the capacitors C3p-C5p is set as a small value.

On the other hand, when the value of capacitance of each of the capacitors C3p-C5p becomes small, error of the DC signal ddp due to a mismatch of these values of capacitance, generated at the time of switching operation of the switching devices S10p-S13p, becomes large.

In the dither circuit 115, the values of capacitance of the capacitors C3p and C5p are the same with each other, and the value of capacitance of the capacitor C4p is K times (K=1) as large as the value of capacitance of the capacitors C3p and C5p. The capacitors C3p-C5p are coupled in the shape of the letter T. When the value of capacitance of the capacitors C3p and C5p is assumed to be "C", the value of capacitance of the synthetic capacitor of the capacitors C3p-C5p coupled in such a shape becomes C/(K+2). As understood from the expression, in the dither circuit 115, it is possible to reduce the value of capacitance of the synthetic capacitor comprising the capacitors C3p-C5p, allowing a large value of capacitance to be set to each of the capacitors C3p-C5p. Therefore, it is possible to generate the DC signal ddp of a very small magnitude, suppressing an error of the DC signal ddp due to a mismatch of the value of capacitance, generated at the time of the switching operation of the switching devices S10p-S13p.

Similarly, in the dither circuit 115, it is possible to generate the DC signal ddn of a very small magnitude, suppressing an error of the DC signal ddn due to a mismatch of the value of capacitance, generated at the time of the switching operation of the switching devices S10n-S13n.

Next, an idle tone generated in the delta-sigma modulator 1 is explained. FIGS. 4 and 5 are explanatory drawings for an idle tone. FIG. 4 illustrates a generating image of an idle tone in a dashed line when a comparatively small DC signal is inputted into the delta-sigma modulator 1. FIG. 5 illustrates a generating image of an idle tone in a dashed line when a comparatively large DC signal is inputted into the delta-sigma modulator 1. A solid line illustrated in FIGS. 4 and 5 indicates an input signal to the quantizer 113 when no analog input signal AIN is inputted into the delta-sigma modulator 1. In order to simplify explanation, however, FIGS. 4 and 5 illustrate a waveform of the input signal for the case where the input signal to the quantizer 113 is a single-ended signal. A thick solid line illustrated in FIGS. 4 and 5 indicates quantity that a DC signal inputted into the delta-sigma modulator 1 during one cycle of the clock signal CLK2 is integrated by the integrating circuit 120.

As illustrated in FIGS. 4 and 5, a DC signal intentionally applied to the delta-sigma modulator 1 or a DC offset (DC signal) automatically caused in the delta-sigma modulator 1 are integrated by the integrating circuit 120, and a level of the input signal to the quantizer 113 rises. When the input signal exceeds a threshold of the quantizer 113, the output signal MO of a logic high level is outputted from the quantizer 113, and the output signal MO concerned is fed back negatively to the input side. As a result, the level of the input signal to the integrating circuit 120 decreases, and the level of the input signal to the quantizer 113 decreases by a specified quantity (subtraction −1). Since a DC signal inputted into the delta-sigma modulator 1 is superimposed on the input signal to the integrating circuit 120 at this time, the level of the input signal to the quantizer 113 rises as much as a quantity that the DC signal concerned is integrated by the integrating circuit 120 (a thick solid line).

When the level of the input signal to the quantizer 113 decreases to a level less than the threshold of the quantizer 113, the output signal MO of a logic low level is outputted from the quantizer 113. The output signal MO concerned is fed back negatively to the input side. As a result, the level of the input signal to the integrating circuit 120 rises, and the level of the input signal to the quantizer 113 rises by a specified quantity (addition +1). Since the DC signal is superimposed on the input signal to the integrating circuit 120 at this time, the level of the input signal to the quantizer 113 rises as much as a quantity that the DC signal concerned is integrated by the integrating circuit 120 (a thick solid line).

In the delta-sigma modulator 1, the DC signal is integrated every cycle of the clock signal CLK2, and "subtraction −1" or "addition +1" is performed. As a result, as illustrated in FIGS. 4 and 5, an idle tone of a triangular wave indicated by a dashed line is included in the input signal to the quantizer 113. Consequently, the idle tone appears also in the output signal MO of the quantizer 113. Frequency of the idle tone becomes higher as the level of the DC signal inputted into the delta-sigma modulator 1 becomes larger, as illustrated in FIGS. 4 and 5. This is because, when the level of the DC signal becomes large, the integral quantity of the DC signal concerned in one cycle of the clock signal CLK2 becomes large, and time after the level of the input signal to the quantizer 113 exceeds the threshold of the quantizer 113 until the level decreases less than the threshold concerned again becomes short.

In FIGS. 4 and 5, in order to help understand the influence which the DC signal inputted into the delta-sigma modulator 1 has on the input signal of the quantizer 113, timing at which the input signal of the quantizer 113 changes by the negative feedback of the output signal MO to the input side, and timing at which the input signal of the quantizer 113 changes due to the integration of the DC signal inputted to the delta-sigma modulator 1 are shifted for the illustration. However, in the actual operation of the delta-sigma modulator 1, the negative feedback of the output signal MO to the input side and the integration of the DC signal inputted into the delta-sigma modulator 1 are carried out almost simultaneously. Accordingly, it hardly occurs that the input signal to the quantizer 113 changes as much as the integral quantity of the DC signal after having changed due to the negative feedback of the output signal MO. However, the change occurs at once as much as the integral quantity of the DC signal added to the amount of change due to the negative feedback of the output signal MO (addition +1 or subtraction −1).

As described above, when the DC signal inputted into the delta-sigma modulator 1 becomes large, the frequency of the idle tone becomes high. Therefore, by superimposing the DC addition voltage DD on the input signal of the integrating circuit 120 as described above, the frequency of the idle tone can be moved to a frequency region higher than the desired frequency band. In the case of a delta-sigma A/D converter for audios like the delta-sigma A/D converter 200, the frequency of the idle tone can be moved to a frequency region higher than the audible frequency range; accordingly, it is possible to prevent people from hearing an unnecessary harsh sound.

In this regard, a phenomenon in which the frequency of an idle tone is shifted by a DC addition voltage DD occurs in a delta-sigma A/D converter in which only one channel exists for converting an analog input signal into a digital signal. However, in a delta-sigma A/D converter provided with plural channels for converting an analog input signal into a digital signal like the delta-sigma A/D converter 200, it cannot be said that the phenomenon occurs necessarily by simple use of the DC addition voltage DD, because of mutual interference between the channels. These contents are explained in detail later.

Figure 6:
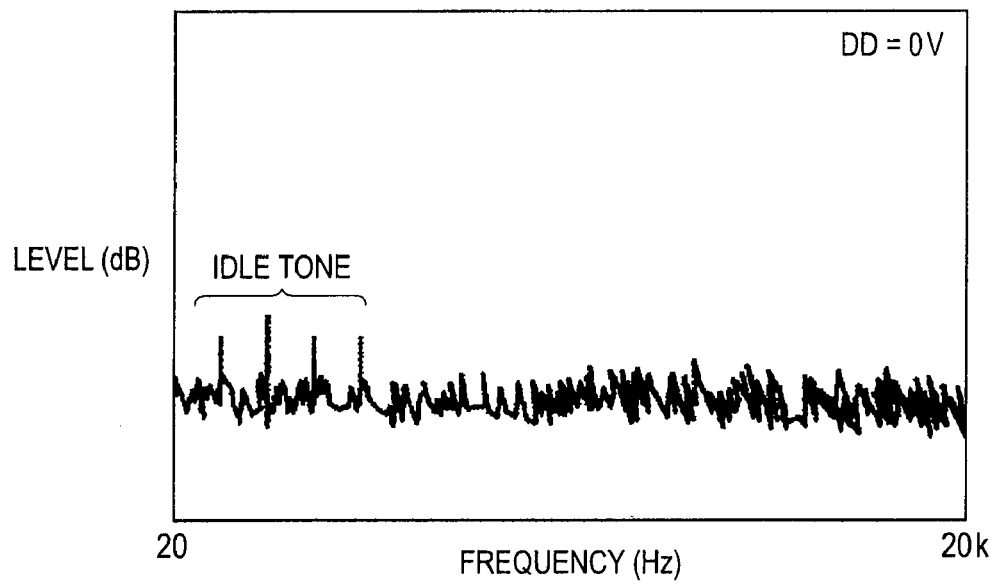
FIG. 6 is a drawing illustrating a frequency characteristic of an output signal of one channel of a delta-sigma modulator when no DC addition voltage is supplied.
Figure 7:
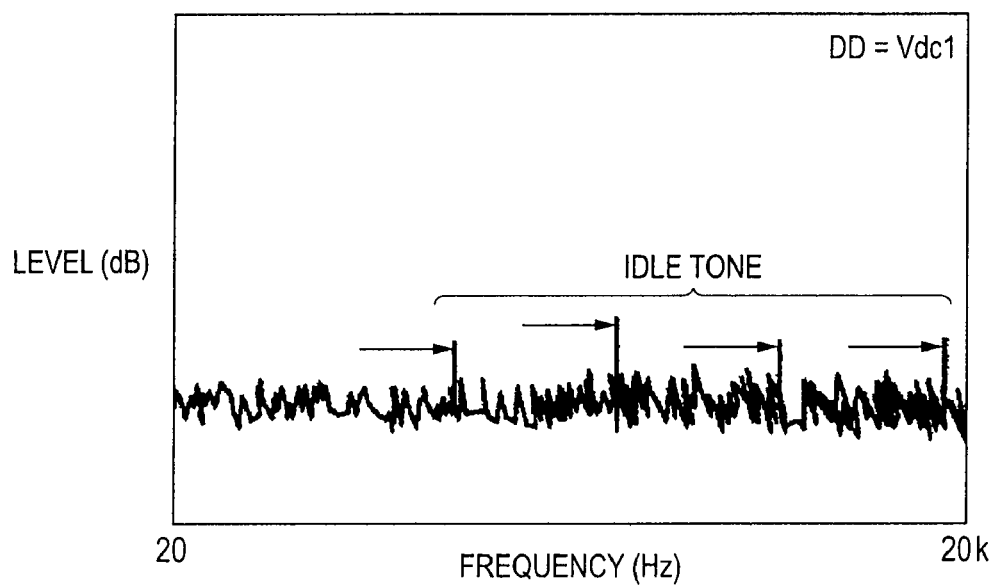
FIG. 7 is a drawing illustrating a frequency characteristic of an output signal of one channel of the delta-sigma modulator when the DC addition voltage is supplied.
Figure 8:
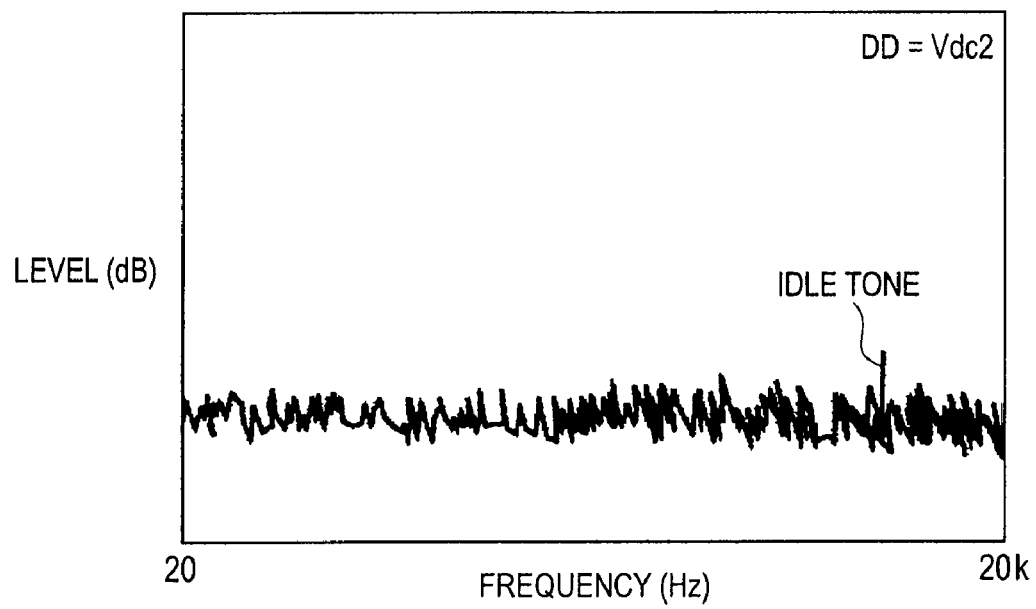
FIG. 8 is a drawing illustrating a frequency characteristic of an output signal of one channel of the delta-sigma modulator when the DC addition voltage is supplied.

FIGS. 6-8 illustrate the frequency characteristic of an output signal MO of the delta-sigma modulator 1 of one of the L channel Lch and the R channel Rch in the delta-sigma A/D converter 200, in which the other channel is assumed to be deleted temporarily. That is, FIGS. 6-8 illustrates the frequency characteristic of an output signal of the delta-sigma modulator in the delta-sigma A/D converter in which only one channel exists for converting an analog input signal into a digital signal.

FIGS. 6-8 illustrate the frequency characteristic of the output signal MO in a case where an analog input signal AIN is not inputted into the delta-sigma modulator 1. The same may be said of the frequency characteristic of the output signal MO illustrated in FIGS. 9-12, which will be explained later.

FIG. 6 illustrates the frequency characteristic of the output signal MO when the DC addition voltage DD is not superimposed on the input signal of the integrating circuit 120. FIG. 7 illustrates the frequency characteristic of the output signal MO when the DC addition voltage DD=Vdc1 (>0 V) is superimposed. FIG. 8 illustrates the frequency characteristic of the output signal MO when the DC addition voltage DD=Vdc2 (>Vdc1) is superimposed.

As illustrated in FIG. 6, when the DC addition voltage DD is not employed, an idle tone which has frequency in the audible frequency range occurs in the delta-sigma modulator 1 due to the input of a DC signal to the integrating circuit 120. When the DC addition voltage DD is employed in the delta-sigma modulator 1, the frequency of the idle tone moves to a high frequency region, as illustrated in FIG. 7. When the DC addition voltage DD with a larger level is employed, the frequency of most idle tones moves to a higher frequency region of the audible frequency range.

On the other hand, in the delta-sigma A/D converter 200 provided with two channels, the L channel Lch and the R channel Rch, when a signal level of the DC addition voltage DD in the delta-sigma modulator 1L of the L channel Lch and a signal level of the DC addition voltage DD in the delta-sigma modulator 1R of the R channel Rch are matched with each other, in each of the L channel Lch and the R channel Rch, a phenomenon is confirmed, in which the frequency of the idle tone does not move so much and it is hard to move the frequency of the idle tone to a higher frequency region of the audible frequency range, because of mutual interference between the channels. This phenomenon is explained in the following.

Figure 9:
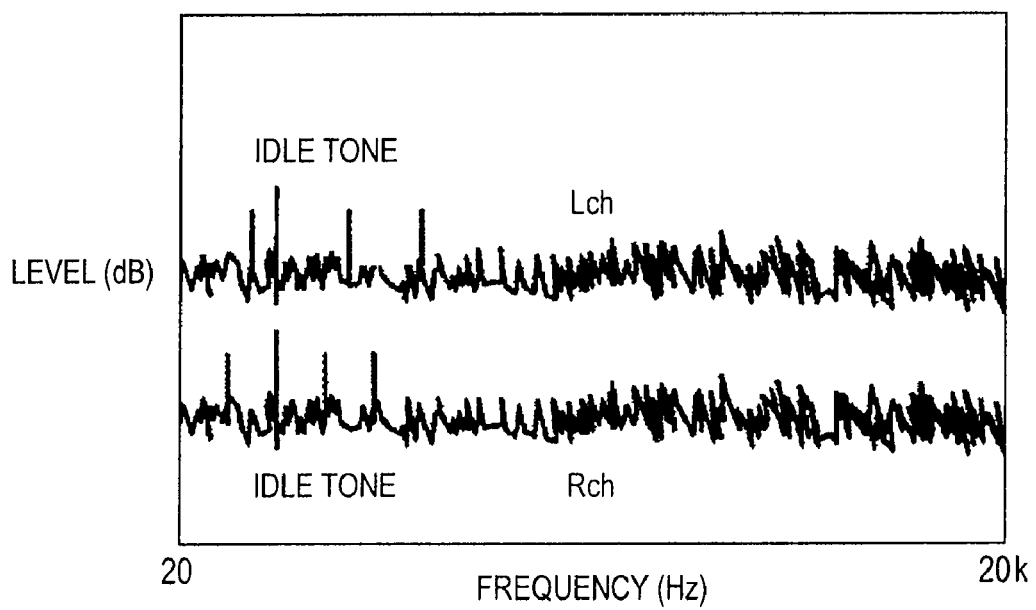
FIG. 9 is a drawing illustrating a frequency characteristic of output signals of two channels of a delta-sigma modulator when no DC addition voltage is supplied.

FIG. 9 illustrates the frequency characteristic of the output signal MO of the delta-sigma modulators 1L and 1R in a case where the DC addition voltage DD is not employed in each of the delta-sigma modulators 1L and 1R in the delta-sigma A/D converter 200. In FIG. 9, the upper waveform illustrates the output signal MO of the delta-sigma modulator 1L, and the bottom waveform illustrates the output signal MO of the delta-sigma modulator 1R, respectively. Also in FIGS. 10-12 to be explained later, the upper and the bottom waveform illustrate the output signal MO of the delta-sigma modulators 1L and 1R, respectively.

As illustrated in FIG. 9, in the output signal MO of the delta-sigma modulator 1L of the L channel Lch, and the output signal MO of the delta-sigma modulator 1R of the R channel Rch, idle tones with similar frequencies are generated. This is because a layout pattern of a circuit for the L channel Lch and a layout pattern of a circuit for the R channel Rch are formed almost similarly.

Figure 10:
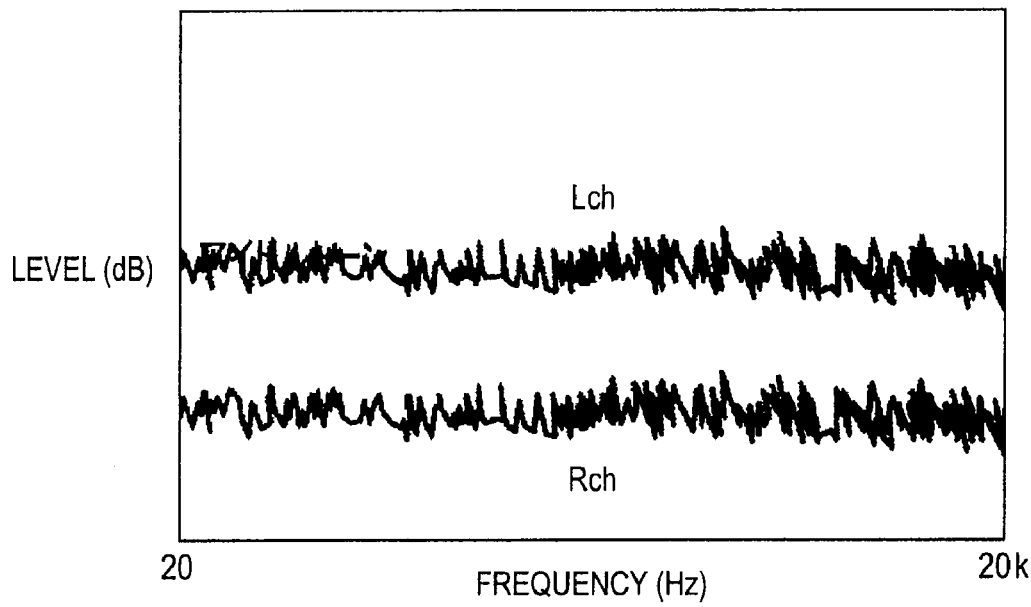
FIG. 10 is a drawing illustrating an ideal frequency characteristic of output signals of two channels of a delta-sigma modulator when the same DC addition voltage is applied to the channels.

Assuming that mutual interference between channels does not arise at all in the delta-sigma A/D converter in which the output signal MO of the delta-sigma modulators 1L and 1R has the frequency characteristic as illustrated in FIG. 9, if the DC addition voltage DD of the same signal level is generated in the delta-sigma modulators 1L and 1R, it will be possible to move the frequency of idle tones to the high frequency region of the audible frequency range in each of the L channel Lch and the R channel Rch, as illustrated in FIG. 10.

However, in the delta-sigma A/D converter 200 provided with plural channels for converting an analog input signal into a digital signal, mutual interference between the channels arises practically. When manufacturing the delta-sigma A/D converter 200, in order to simplify structure of the device, a circuit of the L channel Lch and a circuit of the R channel Rch are formed on the same semiconductor substrate. As illustrated in FIG. 1, the reference voltage generating circuit 3 and the common voltage generating circuit 4 are shared by the L channel Lch and the R channel Rch, and the power supply voltage AVdd and the ground voltage AVss are supplied in common to the delta-sigma modulators 1L and 1R. Therefore, there exists by any means common impedance of wiring between the L channel Lch and the R channel Rch. Accordingly, it is hard to avoid mutual interference between the L channel Lch and the R channel Rch, and the circuit of the L channel Lch and the circuit of the R channel Rch couple together. As a result, a signal of the L channel Lch passes through the R channel Rch, or a signal of the R channel Rch passes through the L channel Lch.

Figure 11:
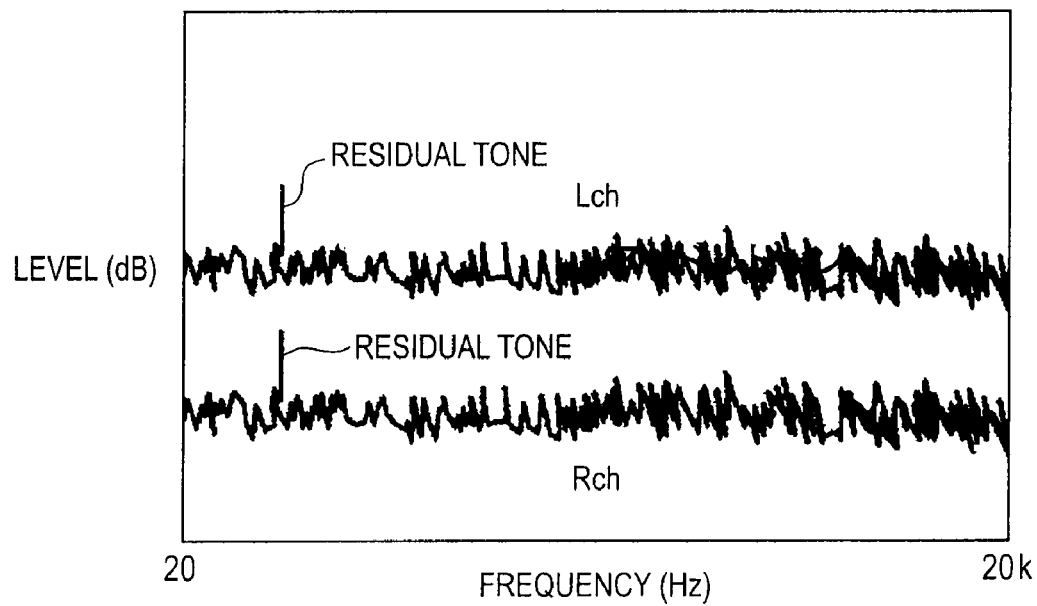
FIG. 11 is a drawing illustrating an actual frequency characteristic of output signals of two channels of a delta-sigma modulator when the same DC addition voltage is applied to the channels.

In the delta-sigma A/D converter in which mutual interference between channels exists as described above, it is confirmed that, when the DC addition voltage DD of the same signal level is generated in the delta-sigma modulators 1L and 1R, the output signal MO of the delta-sigma modulators 1L and 1R does not exhibit the ideal frequency characteristic as illustrated in FIG. 10, but exhibits a frequency characteristic as illustrated in FIG. 11.

When the DC addition voltage DD is employed in the L channel Lch and the R channel Rch, plural idle tones, which have existed in different frequencies with each other as illustrated in FIG. 9, come to gather in a certain frequency in the audible frequency range in each channel, as illustrated in FIG. 11. Even when the level of the DC addition voltage DD is increased, the idle tone hardly moves at all from the frequency.

In this way, when the DC addition voltage DD with the same level is employed for the L channel Lch and the R channel Rch, in each of the L channel Lch and the R channel Rch, the frequency of the idle tone hardly moves, and it becomes difficult to move the frequency of the idle tone to a frequency region higher than the desired frequency band. The reason is as follows: although the frequencies of idle tones generated in each of the L channel Lch and the R channel Rch are moved to a higher frequency region by the DC addition voltage DD, an idle tone having frequency which corresponds to a difference of the above-described frequencies is generated due to mutual interference.

It is possible to reduce the mutual interference of the L channel Lch and the R channel Rch, by taking measures such as separating the substrate, the power supply line, or the ground line between the channels, or strengthening the power supply line and the ground line, etc. By the measures described above, it is possible to lower the level of an idle tone generated due to the mutual interference. However, when such interference preventive measures are taken, a layout pattern of the circuit becomes complicated; accordingly, it becomes difficult to make the delta-sigma A/D converter small and a cost rise of the device will be brought in.

Therefore, in the delta-sigma A/D converter 200, a signal level of the DC addition voltage DD in the delta-sigma modulator 1L provided in the L channel Lch and a signal level of the DC addition voltage DD in the delta-sigma modulator 1R provided in the R channel Rch is set differently with each other. For example, when the power supply voltage AVdd is set to 5 V, the difference of the signal level of the DC addition voltage DD in the delta-sigma modulator 1L provided in the L channel Lch and the signal level of the DC addition voltage DD in the delta-sigma modulator 1R provided in the R channel Rch is set as several mV to several tens of mV.

Figure 12:
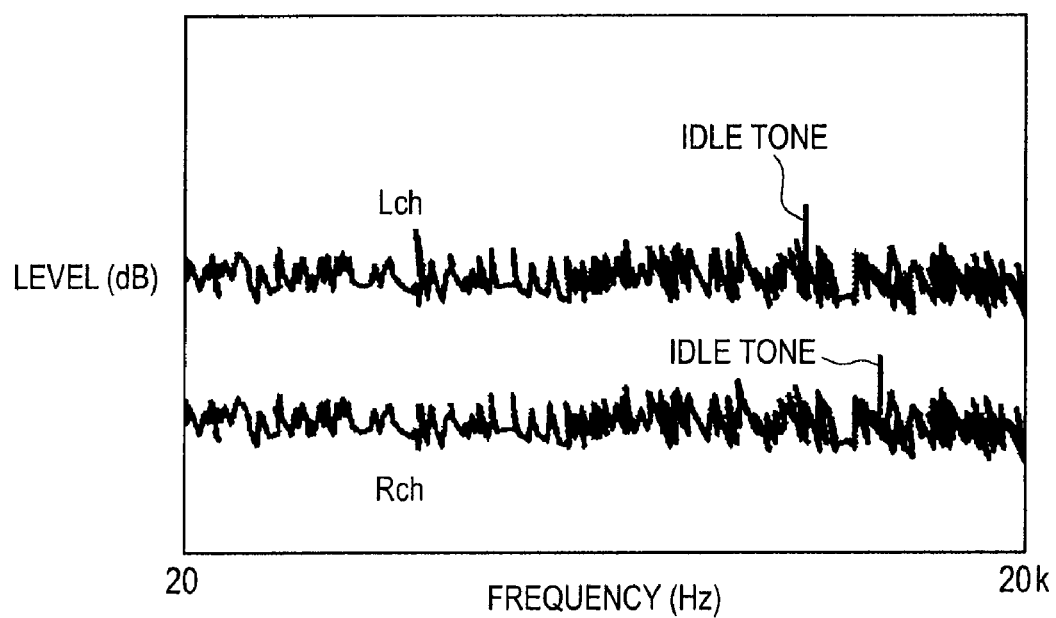
FIG. 12 is a drawing illustrating a frequency characteristic of output signals of two channels of a delta-sigma modulator when different DC addition voltages are applied to the channels.
Figure 13B:
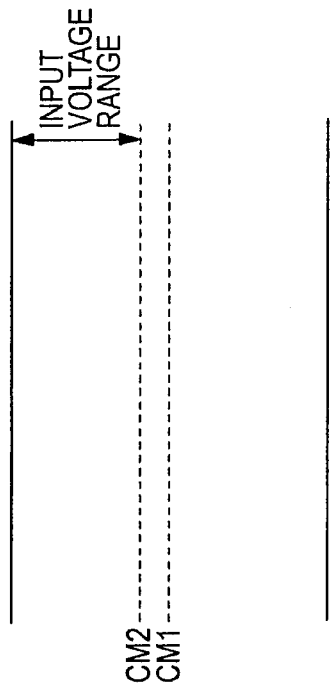
FIG. 13 (a) is an explanatory drawing for the reason that an input voltage range of a delta-sigma A/D converter 200 is limited.
Figure 13D:
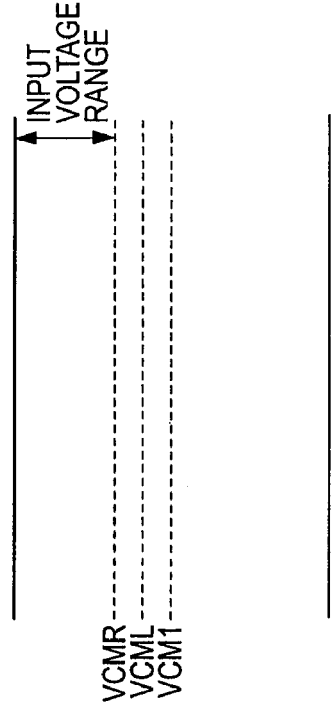
Figure 13A:
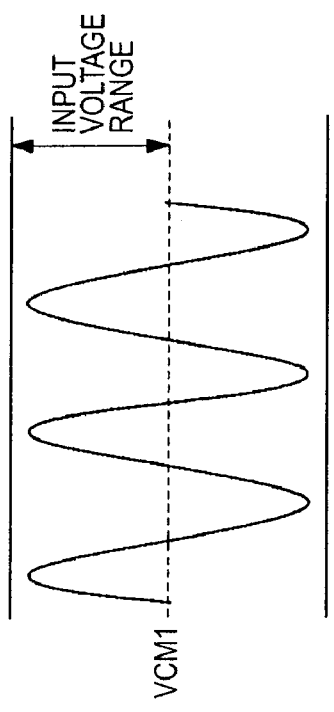
Figure 13C:
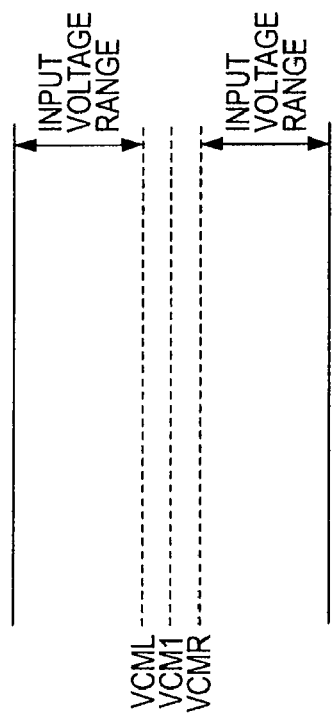

FIG. 12 illustrates the frequency characteristic of the output signal MO of the delta-sigma modulators 1L and 1R in the delta-sigma A/D converter which has the characteristics illustrated in FIG. 9 under the assumption that no DC addition voltage DD is employed, when the signal levels of the DC addition voltage DD in the delta-sigma modulators 1L and 1R are set as different values.

It can be understood from FIGS. 9 and 12 that, when the DC addition voltage DD having different levels in the L channel Lch and the R channel Rch is generated, the frequency of the idle tone is moved in each of the L channel Lch and the R channel Rch.

In order to set the signal level of the DC addition voltage DD in the delta-sigma modulator 1L and the signal level of the DC addition voltage DD in the delta-sigma modulator 1R differently with each other, what is necessary is just to assign a value of capacitance of capacitors differently between the delta-sigma modulator 1L and the delta-sigma modulator 1R. For example, the value of capacitance of each of the capacitors C4$p$ and C4$n$ is assigned differently between the delta-sigma modulators 1L and 1R.

As described above, in the delta-sigma A/D converter 200, a different DC addition voltage DD is employed in the L channel Lch and the R channel Rch; accordingly, it is possible to move the frequency of the idle tone to a frequency region higher than the desired frequency band, in each of the L channel Lch and the R channel Rch. Accordingly, it is possible to suppress an adverse influence of an idle tone in each of the L channel Lch and the R channel Rch.

As described above, in the delta-sigma A/D converter, an idle tone (pattern noise) caused by forming a feedback loop poses a problem. In particular, in a highly precise A/D converter for audios, an idle tone in the audible frequency range is a defect on audibility. As a measure against an idle tone, employment of a dither circuit is known widely.

However, when a delta-sigma A/D converter of two channels is employed, a tone arises also due to channel-to-channel interference, and it has been difficult to remove the tone by the dither circuit in the past. Therefore, in the delta-sigma A/D converter 200, a DC addition voltage with a different voltage level is supplied to the input section of each channel.

FIG. 13 (*a*)-FIG. 13 (*d*) explain the reason why the input voltage range of the delta-sigma A/D converter 200 is limited.

As illustrated in FIG. 13(*a*), when the delta-sigma A/D converter is not provided with a dither circuit which supplies a DC addition voltage, an input voltage range of the delta-sigma A/D converter is decided by an amplifier and other system configuration in the delta-sigma A/D converter, on the basis of a common voltage VCM1. Here, in the delta-sigma A/D converter 200, the common voltage VCM1 corresponds to the common voltage VCOM.

As illustrated in FIG. 13(*b*), when the delta-sigma A/D converter is provided with a dither circuit which supplies a DC addition voltage, an offset voltage of an input signal increases, that is, the common voltage rises from VCM1 to VCM2. Thereby, the input voltage range of the delta-sigma A/D converter is narrowed as much as the DC addition voltage.

As illustrated in FIG. 13(*c*), in the delta-sigma A/D converter 200, the DC addition voltages supplied to the L channel Lch and the R channel Rch are assumed to be V1 and V2, respectively. When V1 and V2 have an opposite polarity with each other, the input voltage range of each channel just becomes narrow as much as the DC addition voltage supplied to each channel. That is, in the L channel Lch, the common voltage rises from VCM1 to VCML, and the input voltage range of the L channel Lch becomes narrow as much as the DC addition voltage supplied to the L channel Lch. In the R channel Rch, the common voltage rises from VCM1 to VCMR, and the input voltage range of the R channel Rch becomes narrow as much as the DC addition voltage supplied to the R channel Rch.

However, the suppression effect of an idle tone corresponds to "a difference of the absolute value of V1 and the absolute value of V2" rather than "a difference of V1 and V2." Therefore, it becomes difficult to suppress an idle tone, when V1 and V2 are set as an opposite polarity and with the same magnitude.

Therefore, in the delta-sigma A/D converter 200, as illustrated in FIG. 13 (*d*), V1 and V2 are set as the same polarity. In the present case, the suppression effect of an idle tone corresponds to "a difference of the absolute value of V1 and the absolute value of V2" rather than "a difference of V1 and V2."

Therefore, in the delta-sigma A/D converter 200, in order to remove an idle tone due to channel-to-channel interference, sufficiently large DC voltage needs to be added. For example, the DC addition voltage supplied to the R channel needs to be larger enough than the DC addition voltage supplied to the L channel. Then, the common voltage VCMR increases, and the offset voltage of an input signal of the R channel Rch increases; consequently, the input voltage range as the entire delta-sigma A/D converter becomes narrow.

Figure 14:
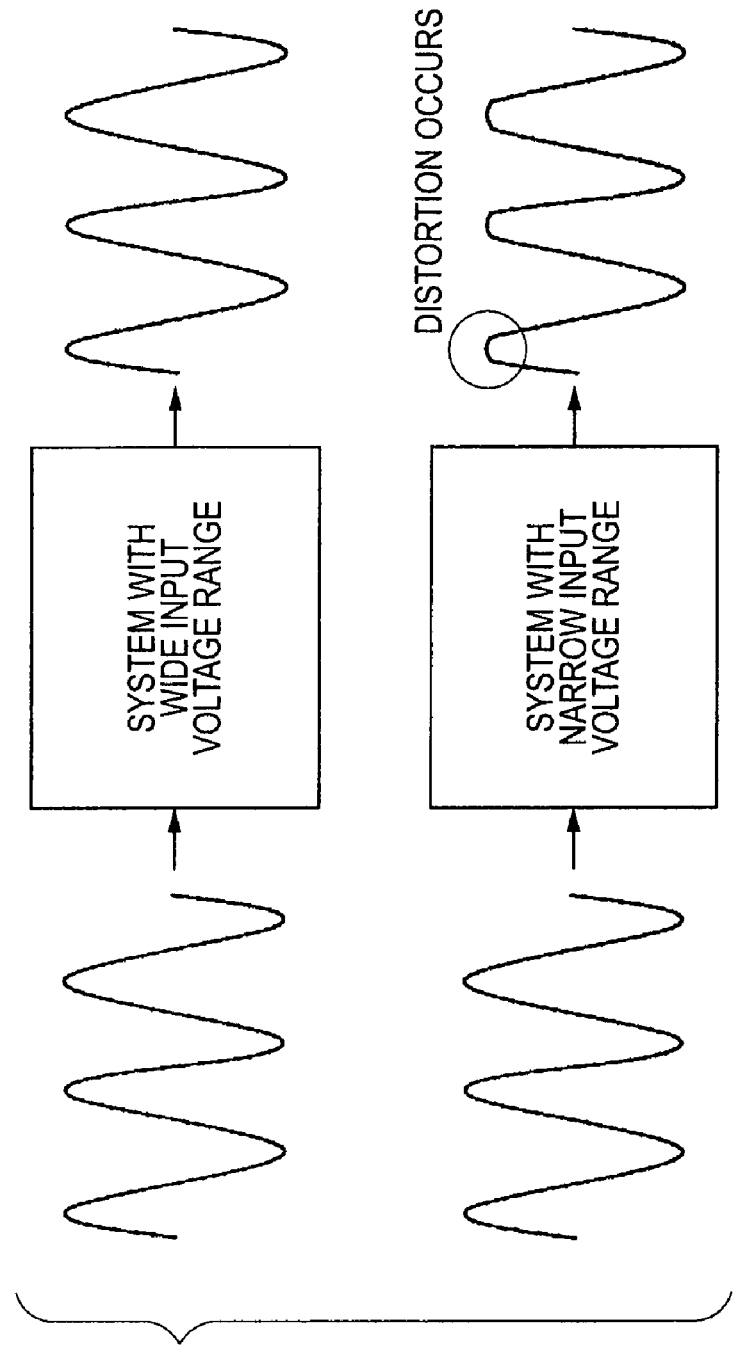
FIG. 14 is a drawing illustrating distortion of an output voltage due to a limited input voltage range of the delta-sigma A/D converter 200.

FIG. 14 illustrates distortion of an output voltage due to a limited input voltage range of the delta-sigma A/D converter 200.

As illustrated in FIG. 14, even by an input voltage which does not produce distortion in the output signal in a system (delta-sigma A/D converter) of a wide input voltage range, distortion will be produced in the output signal in a system of a narrow input voltage range.

Figure 15:
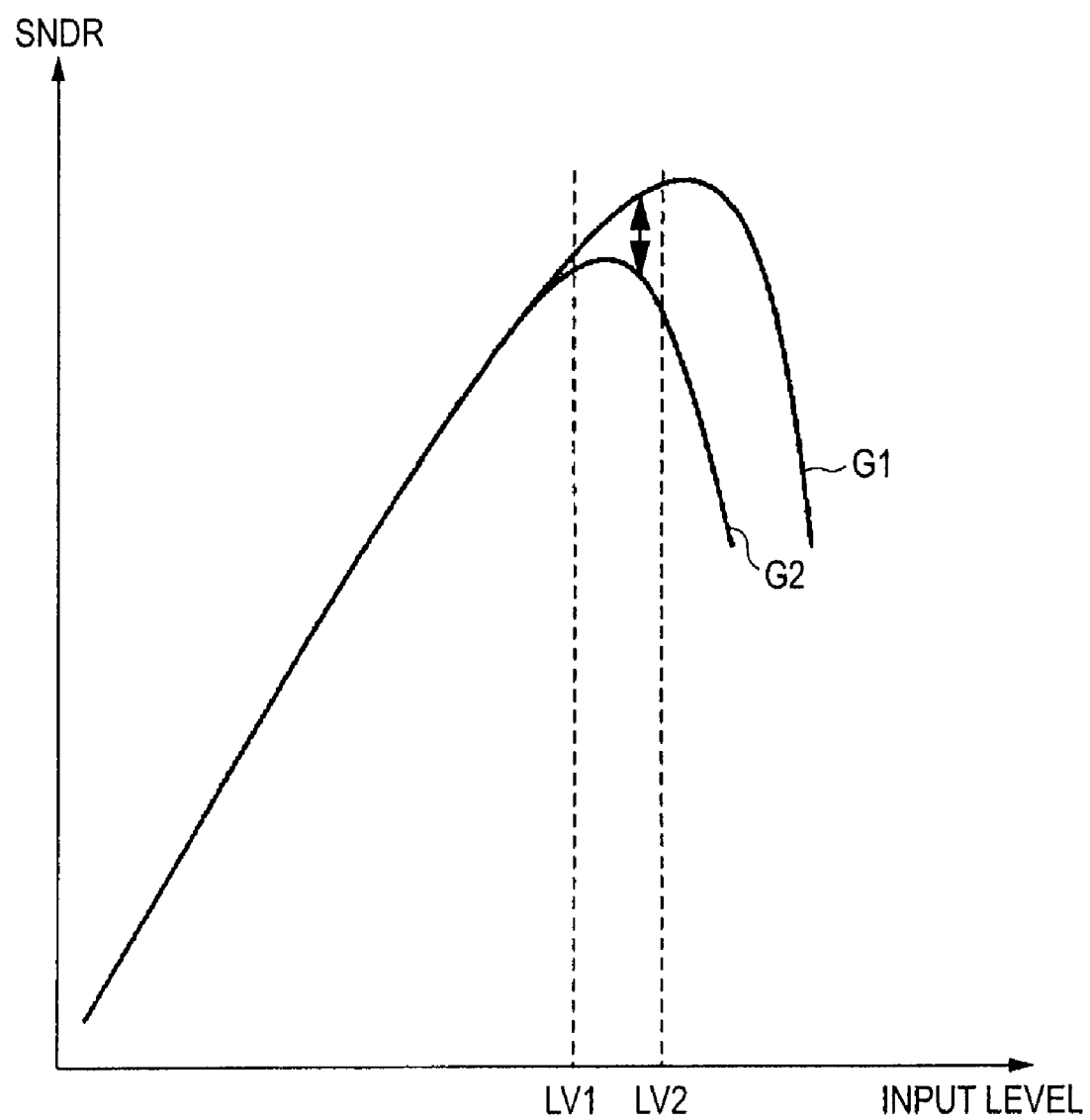
FIG. 15 is a drawing illustrating relation between an input level and an SNDR of a delta-sigma A/D converter.

FIG. 15 illustrates relation between an input level and an SNDR (Signal to Noise and Distortion Ratio) of a delta-sigma A/D converter. As illustrated in FIG. 15, in a system of a wide input voltage range, the SNDR deteriorates after the input voltage exceeds an input level LV2 (graph G1). On the other hand, in a system of a narrow input voltage range, when the input voltage exceeds an input level LV1 which is lower than the input level LV2, the SNDR starts deteriorating (graph G2).

In order to solve the above-described problems regarding the delta-sigma A/D converters 200, one embodiment of the present invention provides, in summary, a delta-sigma A/D converter comprising an integrator and a quantizer in each of plural channels, in which a dither signal is added to an output stage of the integrator or an input stage of the quantizer of each channel, and a different dither signal is added between the channels.

When the delta-sigma A/D converter comprises plural integrators coupled in series in each channel, the dither signal is added to at least one of the respective output stages of the plural integrators, and a different dither signal is added between the channels. In almost all cases, each of the channels is provided with the same number of integrators coupled in series. When the same N pieces of integrators are coupled in series in each of the channels, from a viewpoint of performing easier design of a circuit layout, it is desirable to add a dither signal to an output of the same k-th integrator (k is an integer of 1 thru N) in each of the channels, assuming that an integrator of a head of the series coupling is the first one.

As the above-mentioned dither signal, a DC dither, a random dither, a square wave dither, a saw-tooth wave dither, etc. are exemplified. When a DC dither is applied to each channel, a DC signal of a certain voltage level is added. However, the level of the DC signal is rendered different between the channels. When a random dither is applied to each channel, a pseudo random signal (digital signal) is generated, and converted from the digital signal to an analog signal by using a switched-capacitor circuit, etc. Then, the converted analog signal is added. In the present case, a digital pattern of the pseudo random signal generated concurrently is rendered different between the channels. When a square wave dither is applied to each channel, a square wave signal having a certain amplitude and a certain frequency is added. However, the amplitude or frequency of the square wave signal is rendered different between the channels. When a saw-tooth wave dither is applied to each channel, the saw-tooth wave signal with a certain amplitude and a certain frequency is D/A-converted and added. However, the amplitude or frequency of the saw-tooth wave signal is rendered different between the channels.

According to another embodiment, in one channel of plural channels, a first dither signal (for example, a DC dither or a square wave dither) is added to an input stage of the first integrator into which an analog signal is inputted. In another channel, a second dither signal (an arbitrary dither, such as a DC dither, a random dither, a square wave dither, and a saw-tooth wave dither) that is different from the first dither signal is added to an output stage of one of integrators in the delta-sigma A/D converter.

Hereinafter, each embodiment of the present invention is explained in full detail.

Embodiment 1

Delta-Sigma A/D Converter 201

A delta-sigma A/D converter according to Embodiment 1 of the present invention is explained, with reference to the accompanying drawings. In Embodiment 1 of the present invention, the same symbol as in the delta-sigma A/D converter 200 is attached to the same member or the corresponding member of the delta-sigma A/D converter 200, and the repetitive explanation thereof is omitted. That is, contents except what is explained below are the same as that of the delta-sigma A/D converter 200.

Figure 16:
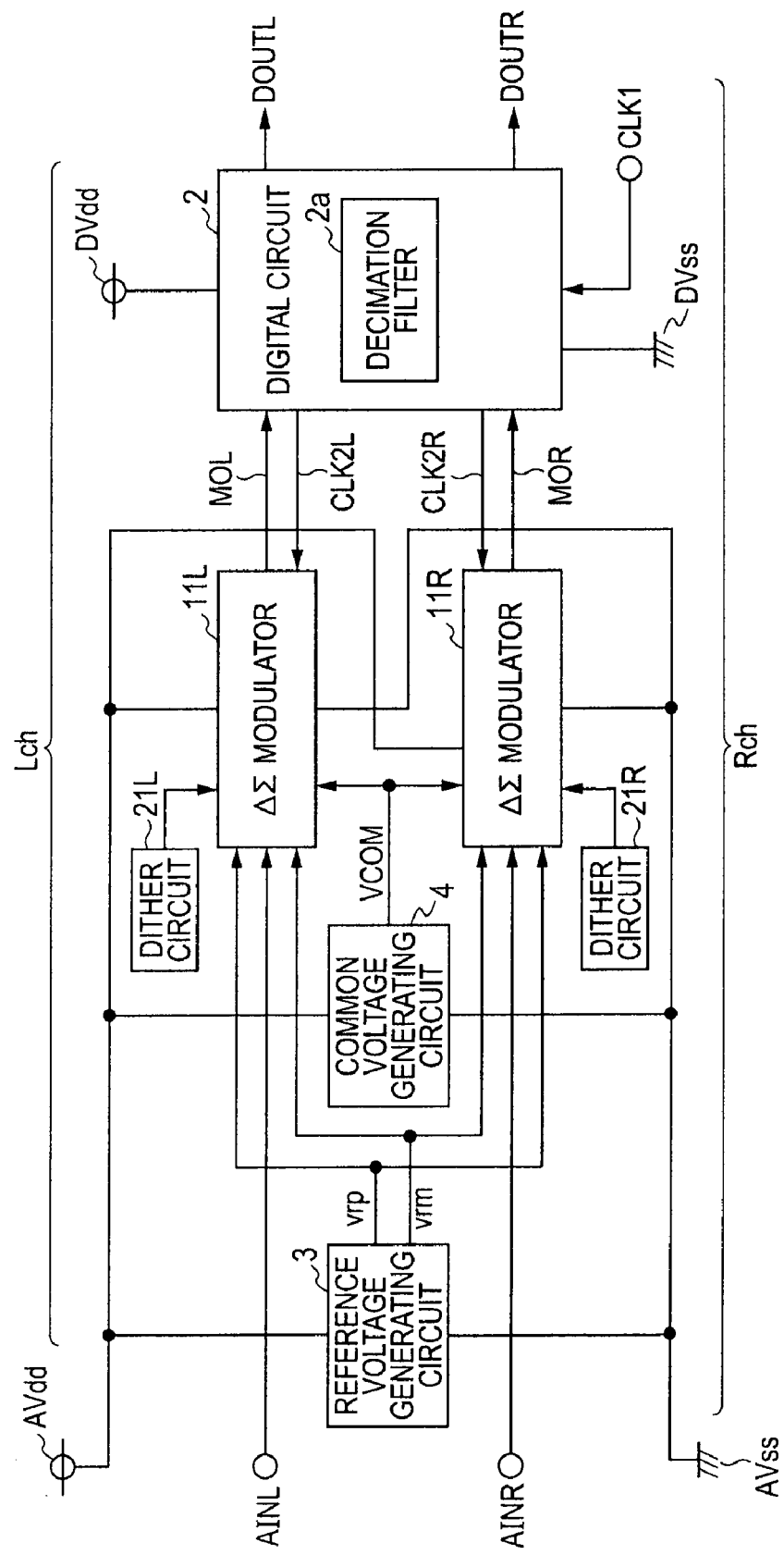
FIG. 16 is a drawing illustrating a configuration of a delta-sigma A/D converter according to Embodiment 1.

FIG. 16 illustrates a configuration of a delta-sigma A/D converter according to Embodiment 1. As illustrated in FIG. 16, compared with the delta-sigma A/D converter 200, the delta-sigma A/D converter 201 is provided with dither circuits 21L and 21R instead of the dither circuits 115L and 115R, and is provided with delta-sigma modulators 11L and 11R instead of the delta-sigma modulators 1L and 1R.

Figure 17:
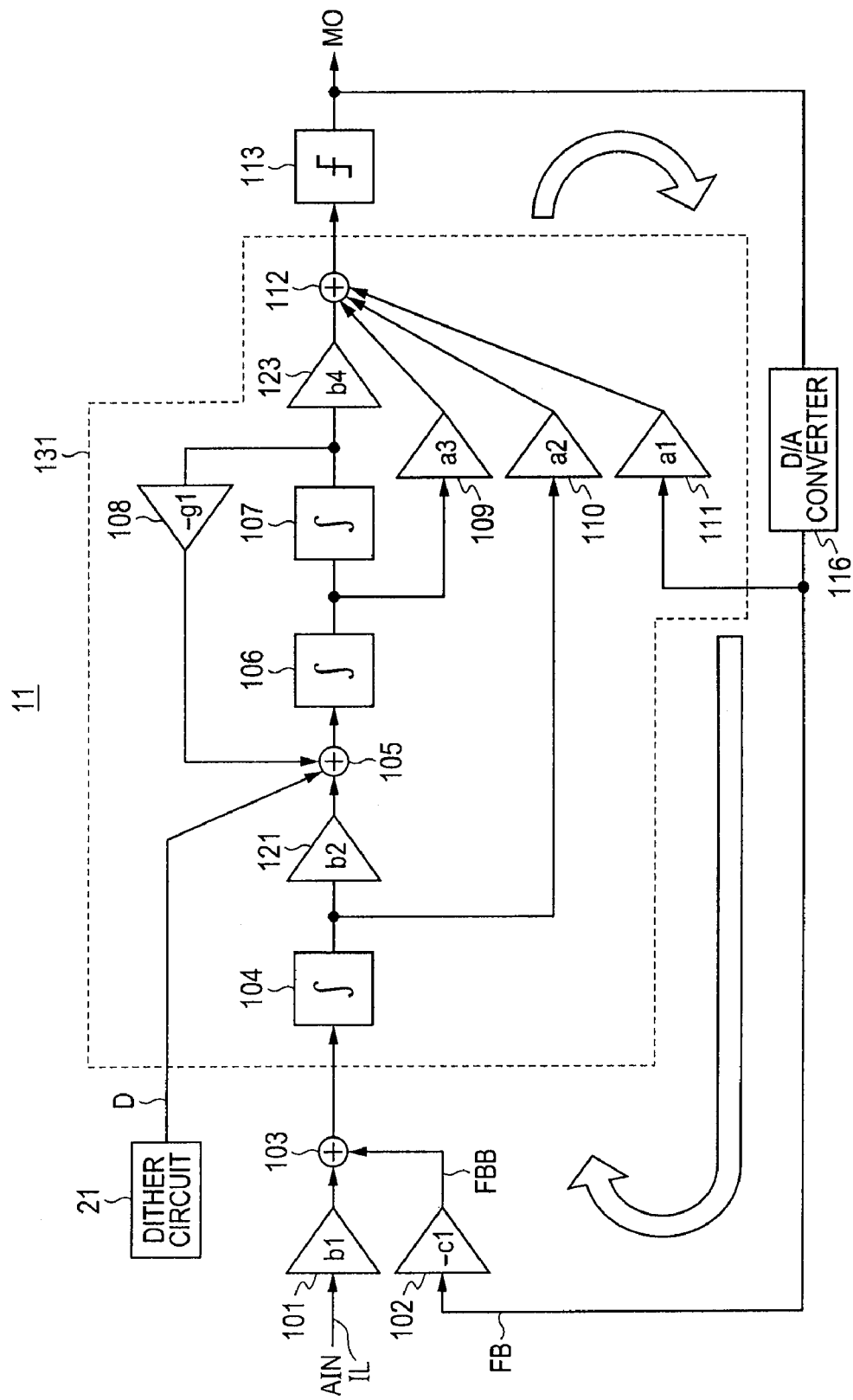
FIG. 17 is a block diagram illustrating an example of a configuration of delta-sigma modulators 11L and 11R.

FIG. 17 is a block diagram illustrating an example of a configuration of the delta-sigma modulators 11L and 11R. In Embodiment 1, the configuration of the delta-sigma modulators 11L and 11R is the same with each other. Henceforth, the delta-sigma modulators 11L and 11R are collectively called a "delta-sigma modulator 11." The dither circuits 21L and 21R are collectively called a "dither circuit 21."

As illustrated in FIG. 17, each delta-sigma modulator 11 of the L channel Lch and the R channel Rch is the third-order modulator, for example, and comprises gain stages 101 and 102, an addition unit 103, an integrating circuit 131, a quantizer 113, a dither circuit 21, and a D/A converter 116.

The gain stage 101 amplifies a signal of an input line IL, to which the analog input signal AIN is inputted, to increase the signal level b1 times (b1 is a positive value), and outputs the amplified signal. The gain stage 102 amplifies a feedback signal FB outputted from the D/A converter 116 to increase the signal level $-c1$ times (c1 is a positive value), and outputs the amplified signal as an inverted feedback signal FBB. The addition unit 103 adds and outputs the output signal of the gain stage 101 and the inverted feedback signal FBB outputted from the gain stage 102. That is, a difference signal of the output signal of the gain stage 101 and the feedback signal FB is outputted from the addition unit 103. In the state where the analog input signal AIN is inputted to the input line IL, a difference signal of the analog input signal AIN and the feedback signal FB is outputted from the addition unit 103.

Here, the signal line from the input line IL to the addition unit 103 is a signal line which propagates the analog input signal AIN concerned, when the analog input signal AIN is inputted into the L channel Lch or the R channel Rch. Therefore, in the addition unit 103, when the analog input signal AIN is inputted into the L channel Lch or the R channel Rch, a difference of the signal of the signal line which propagates the analog input signal AIN concerned and the feedback signal FB will be obtained.

The integrating circuit 131 comprises three stages of integrators 104, 106, and 107, addition units 105 and 112, and gain stages 108-111, 121, and 123. The integrating circuit 131 integrates and outputs the difference signal obtained by the addition unit 103.

More specifically, the integrator 104 integrates and outputs the difference signal obtained by the addition unit 103. The gain stage 121 amplifies an output signal of the integrator 104 to increase the signal level b2 times (b2 is a positive value), and outputs the amplified signal.

The dither circuit 21 generates a dither signal D, and superimposes it on an output signal of the gain stage 121. The addition unit 105 adds and outputs an output signal of the gain stage 121, an output signal of the gain stage 108, and the dither signal D. The integrator 106 integrates and outputs an output signal of the addition unit 105. The integrator 107 integrates and outputs an output signal of the integrator 106. The gain stage 108 amplifies an output signal of the integrator 107 to increase the signal level $-g1$ times (g1 is a positive value), and outputs the amplified signal. The gain stage 123 amplifies an output signal of the integrator 107 to increase the signal level b4 times (b4 is a positive value), and outputs the amplified signal. The gain stage 109 amplifies an output signal of the integrator 106 to increase the signal level a3 times (a3 is a positive value), and outputs the amplified signal. The gain stage 110 amplifies an output signal of the integrator 104 to increase the signal level a2 times (a2 is a positive value), and outputs the amplified signal. The gain stage 111 amplifies the feedback signal FB outputted from the D/A converter 116 to increase the signal level a1 times (a1 is a positive value), and outputs the amplified signal. The addition unit 112 adds an output signal of the gain stage 123 and the output signals of the gain stages 109-111, and outputs the added signal.

The quantizer 113 is a one-bit quantizer, for example, quantizes an output signal of the addition unit 112 by one bit, and outputs the quantized signal obtained, as an output signal MO. The D/A converter 116 converts into an analog signal the output signal MO which is a one-bit digital signal, and outputs the converted analog signal as the feedback signal FB.

In the delta-sigma modulator 11 configured as described above, since the analog input signal AIN is oversampled, a signal level of a quantization error included in the output signal MO in a desired frequency band is reduced greatly. Furthermore, since the delta-sigma modulator 11 has a feedback loop which returns the output signal MO to the input side as illustrated by two outline arrows of FIG. 17, the quantization error included in the output signal MO tends to be distributed, dominating at high frequencies. Therefore, the quantization error can be greatly reduced by filtering the output signal MO with a low pass filter in the digital circuit 2 of the subsequent stage.

Figure 18:
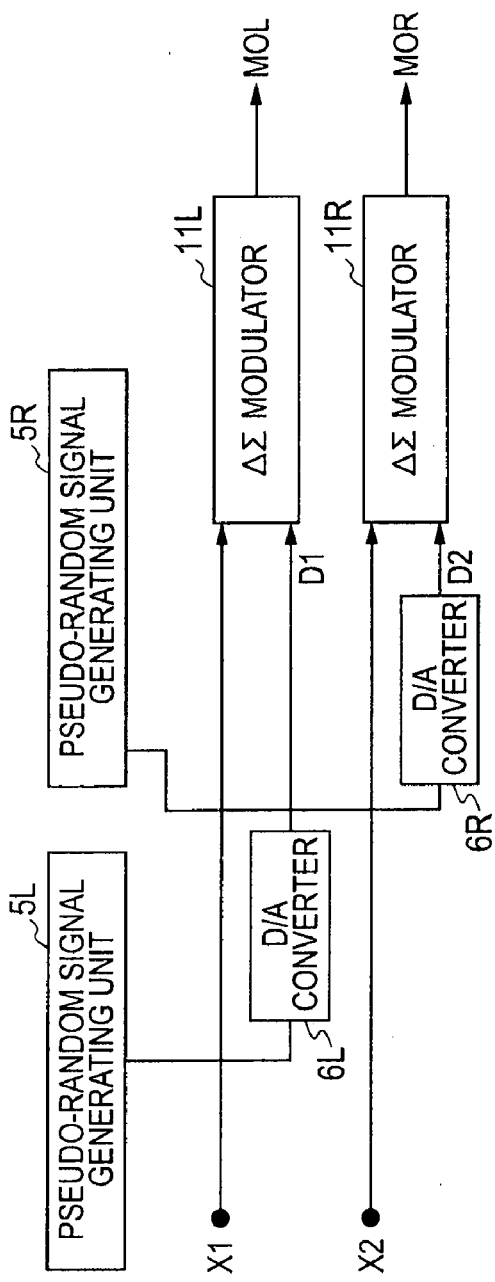
FIG. 18 is a drawing illustrating an example of a configuration of a dither circuit.

FIG. 18 illustrates an example of a configuration of a dither circuit. As illustrated in FIG. 18, the dither circuit 21L comprises a pseudo-random signal generating unit 5L and a D/A converter 6L. The dither circuit 21R comprises a pseudo-random signal generating unit 5R and a D/A converter 6R.

In Embodiment 1, the configuration of the D/A converters 6L and 6R is the same with each other. Henceforth, the D/A converters 6L and 6R are correctively called a "D/A converter 6."

The pseudo-random signal generating unit 5L generates a pseudo random signal which is a digital signal, and outputs it to the D/A converter 6L. The pseudo-random signal generating unit 5R generates a pseudo random signal which is a digital signal, and outputs it to the D/A converter 6R. These pseudo random signals are different signals, namely, they are digital signals having different values with each other at plural phases of timing.

The D/A converter 6L converts into an analog signal the pseudo random signal received from the pseudo-random signal generating unit 5L, and outputs the converted signal to the delta-sigma modulator 11L as a dither signal D1. The D/A converter 6R converts into an analog signal the pseudo random signal received from the pseudo-random signal generating unit 5R, and outputs the converted signal to the delta-sigma modulator 11R as a dither signal D2.

The pseudo-random signal generating units 5L and 5R are M-sequence pulse generators, for example. When different pseudo random signals are to be generated by plural M-sequence pulse generators, what is necessary is just to change an initial value of a shift register in the M-sequence pulse generator, or to change the number of stages of the shift registers for every channel, for example. The pseudo-random signal generating units 5L and 5R may generate the pseudo random signal not only by an M-sequence pulse generator but by any other means.

Figure 19:
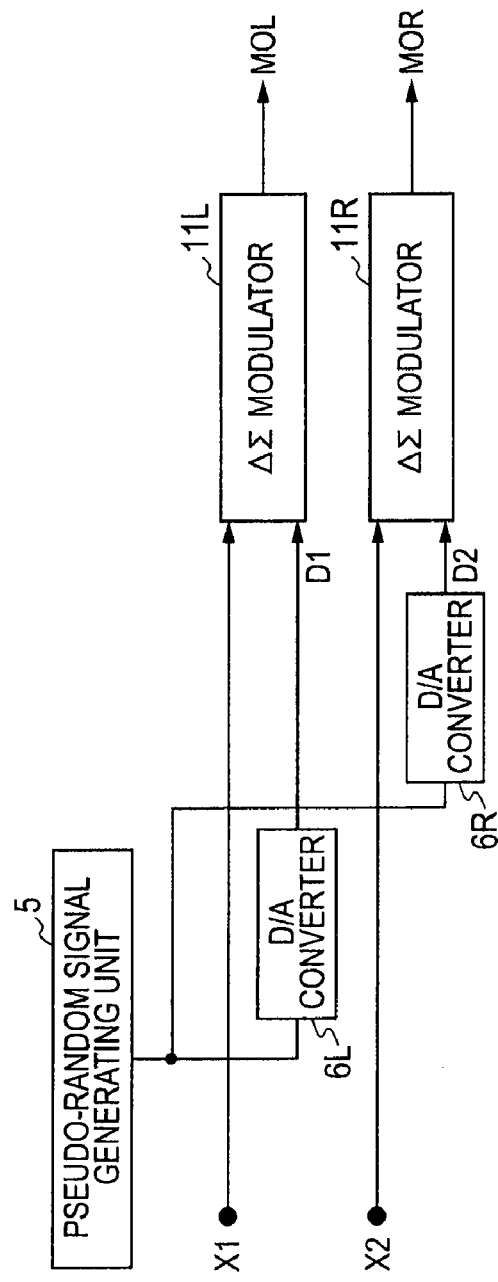
FIG. 19 is a drawing illustrating another example of the configuration of the dither circuit.

FIG. 19 illustrates another example of the configuration of the dither circuit. As illustrated in FIG. 19, the dither circuits 21L and 21R share a pseudo-random signal generating unit 5. The dither circuit 21L comprises a D/A converter 6L. The dither circuit 21R comprises a D/A converter 6R.

The pseudo-random signal generating unit 5 generates a pseudo random signal which is a digital signal, and outputs it to the D/A converter 6L and the D/A converter 6R.

The D/A converter 6L converts into an analog signal the pseudo random signal received from the pseudo-random signal generating unit 5, and outputs the converted signal to the delta-sigma modulator 11L as a dither signal D1. The D/A converter 6R converts into an analog signal the pseudo random signal received from the pseudo-random signal generating unit 5, and outputs the converted signal to the delta-sigma modulator 11R as a dither signal D2.

The D/A converters 6L and 6R have a different conversion gain mutually. For example, capacitance of a capacitor for charge transfer is set up so as to be different in the D/A converters 6L and 6R. As an alternative, a bit shift of a pseudo random signal may be performed. For example, while a pseudo random signal is supplied to the D/A converter 6L as it is, a pseudo random signal of which the bit shift has been performed is supplied to the D/A converter 6R.

The dither circuits 21L and 21R is not restricted to one having the configuration as illustrated in FIGS. 18 and 19, however, they may have a configuration which outputs, as the dither signal D1 and the dither signal D2, analog signals converted from digital signals having different values with each other at plural phases of timing.

Figure 20:
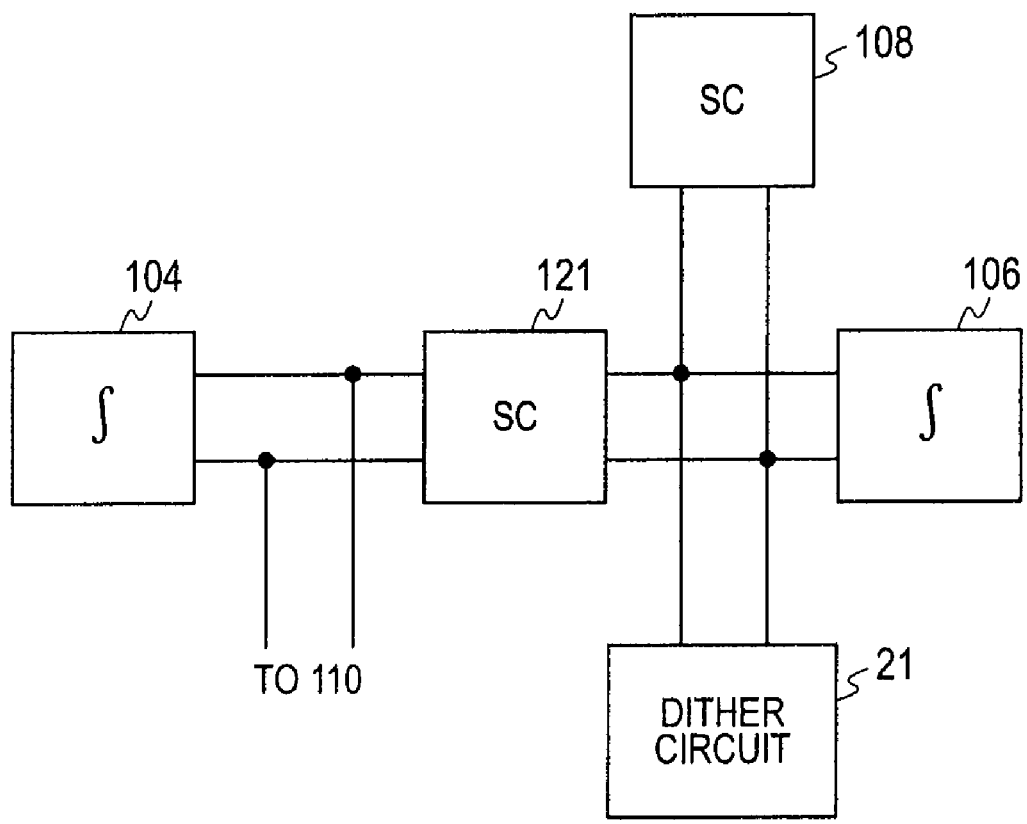
FIG. 20 is a drawing illustrating roughly a configuration of an input section of a dither signal in the delta-sigma modulator according to Embodiment 1 of the present invention.
Figure 21:
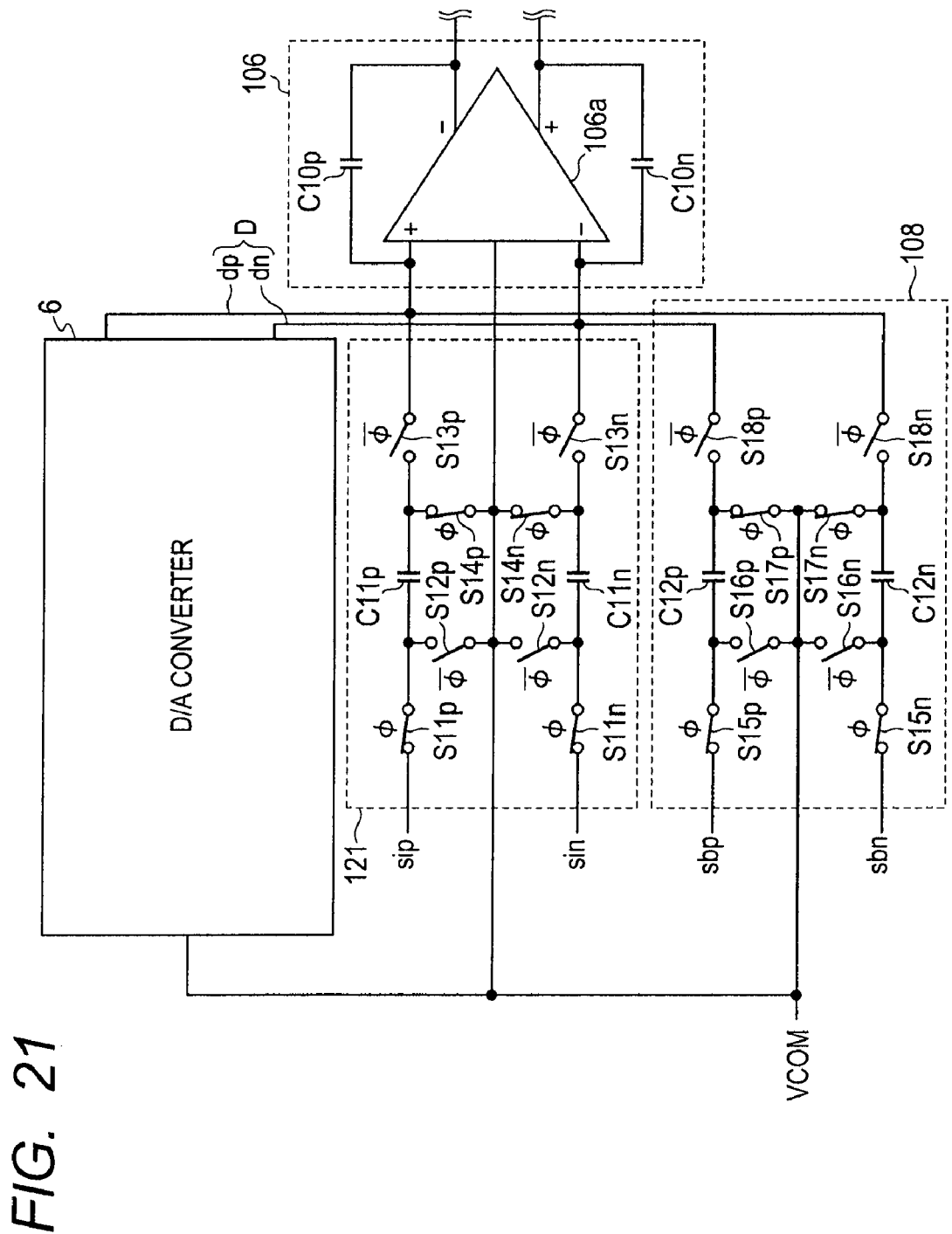
FIG. 21 is a drawing illustrating minutely the configuration of the input section of the dither signal in the delta-sigma modulator according to Embodiment 1 of the present invention.

FIG. 20 illustrates roughly a configuration of an input section of a dither signal in the delta-sigma modulator according to Embodiment 1 of the present invention. FIG. 21 illustrates minutely the configuration of the input section of the dither signal in the delta-sigma modulator according to Embodiment 1 of the present invention.

As illustrated in FIGS. 20 and 21, an input signal to the gain stage 121 is a differential signal comprising a pair of input signals sin and sip which are complementary with each other. A signal level of each of the input signals sip and sin changes, centering on the common voltage VCOM. The input signal sin is a signal obtained by inverting the input signal sip with respect to the common voltage VCOM. The signal level of the input signal to the gain stage 121 is given by a value obtained by subtracting the signal level of the input signal sin from the signal level of the input signal sip.

A dither signal D is a differential signal obtained from a pair of analog signals dn and dp which are complementary with each other. A signal level of the analog signal dp is positive with respect to a reference level (for example, the common voltage VCOM), and a signal level of the analog signal dn is negative with respect to the reference level (for example, the common voltage VCOM). The signal level of the dither signal D is a value corresponding to a value obtained by subtracting the signal level of the analog signal dn from the signal level of the analog signal dp. Input signals sbp and sbn to the gain stage 108 is a differential signal comprising a pair of signals which are complementary with each other. The signal level of the input signal to the gain stage 108 is a value corresponding to a value obtained by subtracting the signal level of the input signal sbn from the signal level of the input signal sbp.

The gain stage 121 comprises a switched-capacitor circuit (SC circuit) which is provided with switching devices S11n-S14n and S11p-S14p, and capacitors C11n and C11p. The integrator 106 is provided with a differential output operational amplifier 106a, and holding capacitors (integral capacity) C10n and C10p.

In the integrator 106, one end of the holding capacitor C10p is coupled to a noninverting input terminal of the differential output operational amplifier 106a. The other end of the holding capacitor C10p is coupled to an inverted output terminal of the differential output operational amplifier 106a. One end of the holding capacitor C10n is coupled to an inverting input terminal of the differential output operational amplifier 106a. The other end of the holding capacitor C10n is coupled to a noninverting output terminal of the differential output operational amplifier 106a. The common voltage VCOM is supplied to the differential output operational amplifier 106a as an operating common voltage.

In the gain stage 121, one end of the switching device S11p is coupled to one of the output nodes of the integrator 104, and the other end of the switching device S11p is coupled to one end of the capacitor C11p and one end of the switching device S12p. The other end of the capacitor C11p is coupled to one end of the switching device S14p and one end of the switching device S13p, and the other end of the switching device S13p is coupled to the noninverting input terminal of the differential output operational amplifier 106a. The common voltage VCOM is supplied to the other end of the switching device S12p and the other end of the switching device S14p.

One end of the switching device S11n is coupled to the other one of the output nodes of the integrator 104, and the other end of the switching device S11n is coupled to one end of the capacitor C11n and one end of the switching device S12n. The other end of the capacitor C11n is coupled to one end of the switching device S14n and one end of the switching device S13n, and the other end of the switching device S13n is coupled to the inverting input terminal of the differential output operational amplifier 106a. The common voltage VCOM is supplied to the other end of the switching device S12n and the other end of the switching device S14n.

Each of the switching devices S11n, S14n, S11p, and S14p turns to an on state from an off state at a phase φ of each cycle of the clock signal CLK2, and maintains the on state for a prescribed period. On the other hand, each of the switching device S12n, S13n, S12p, and S13p turns to an on state from an off state at a phase φ bar (in the figure, "φ bar" is expressed with a horizontal line drawn over the character φ) of each cycle of the clock signal CLK2, and maintains the on state for a prescribed period. Phase φ and phase φ bar are in a relation with reversed phase, namely, in a relation different by 180 degrees.

In the gain stage 121 configured as described above, each of the switching devices S11p-S14p performs a regular switching operation based on the clock signal CLK2, and the input signal sip inputted to the gain stage 121 is sampled at a frequency of, for example, 64 times the sampling frequency of fs, and a signal level of the sampled input signal sip is adjusted. Also in the gain stage 121, each of the switching devices S11n-S14n performs a regular switching operation based on the clock signal CLK2, and the input signal sin inputted to the gain stage 121 is sampled at a frequency of the same 64 times the sampling frequency fs, and a signal level of the sampled input signal sin is adjusted.

The gain stage 108 comprises a switched-capacitor circuit which is provided with switching devices S15n-S18n and S15p-S18p, and capacitors C12n and C12p.

In the gain stage 108, one end of the switching device S15p is coupled to one of the output nodes of the integrator 107, and the other end of the switching device S15p is coupled to one end of the capacitor C12p and one end of the switching device S16p. The other end of the capacitor C12p is coupled to one end of the switching device S18p and one end of the switching device S17p, and the other end of the switching device S18p is coupled to the noninverting input terminal of the differential output operational amplifier 106a. The common voltage VCOM is supplied to the other end of the switching device S16p and the other end of the switching device S17p.

One end of the switching device S15n is coupled to the other one of the output nodes of the integrator 107, and the other end of the switching device S15n is coupled to one end of the capacitor C12n and one end of the switching device S16n. The other end of the capacitor C12n is coupled to one end of the switching device S18n and one end of the switching device S17n, and the other end of the switching device S18n is coupled to the inverting input terminal of the differential output operational amplifier 106a. The common voltage VCOM is supplied to the other end of the switching device S16n and the other end of the switching device S17n.

Each of the switching devices S15n, S18n, S15p, and S18p turns to an on state from an off state at a phase ϕ of each cycle of the clock signal CLK2, and maintains the on state for a prescribed period. On the other hand, each of the switching device S16n, S17n, S16p, and S17p turns to an on state from an off state at a phase ϕ bar (in the figure, "ϕ bar" is expressed with a horizontal line drawn over the character ϕ) of each cycle of the clock signal CLK2, and maintains the on state for a prescribed period. Phase ϕ and phase ϕ bar are in a relation with reversed phase, namely, in a relation different by 180 degrees.

In the gain stage 108 configured as described above, each of the switching devices S15p-S18p performs a regular switching operation based on the clock signal CLK2, and the input signal sbp inputted to the gain stage 108 is sampled at a frequency of, for example, 64 times the sampling frequency of fs, and a signal level of the sampled input signal sbp is adjusted. Also in the gain stage 108, each of the switching devices S15n-S18n performs a regular switching operation based on the clock signal CLK2, and the input signal sbn inputted to the gain stage 108 is sampled at a frequency of the same 64 times the sampling frequency fs, and a signal level of the sampled input signal sbn is adjusted.

Figure 22:
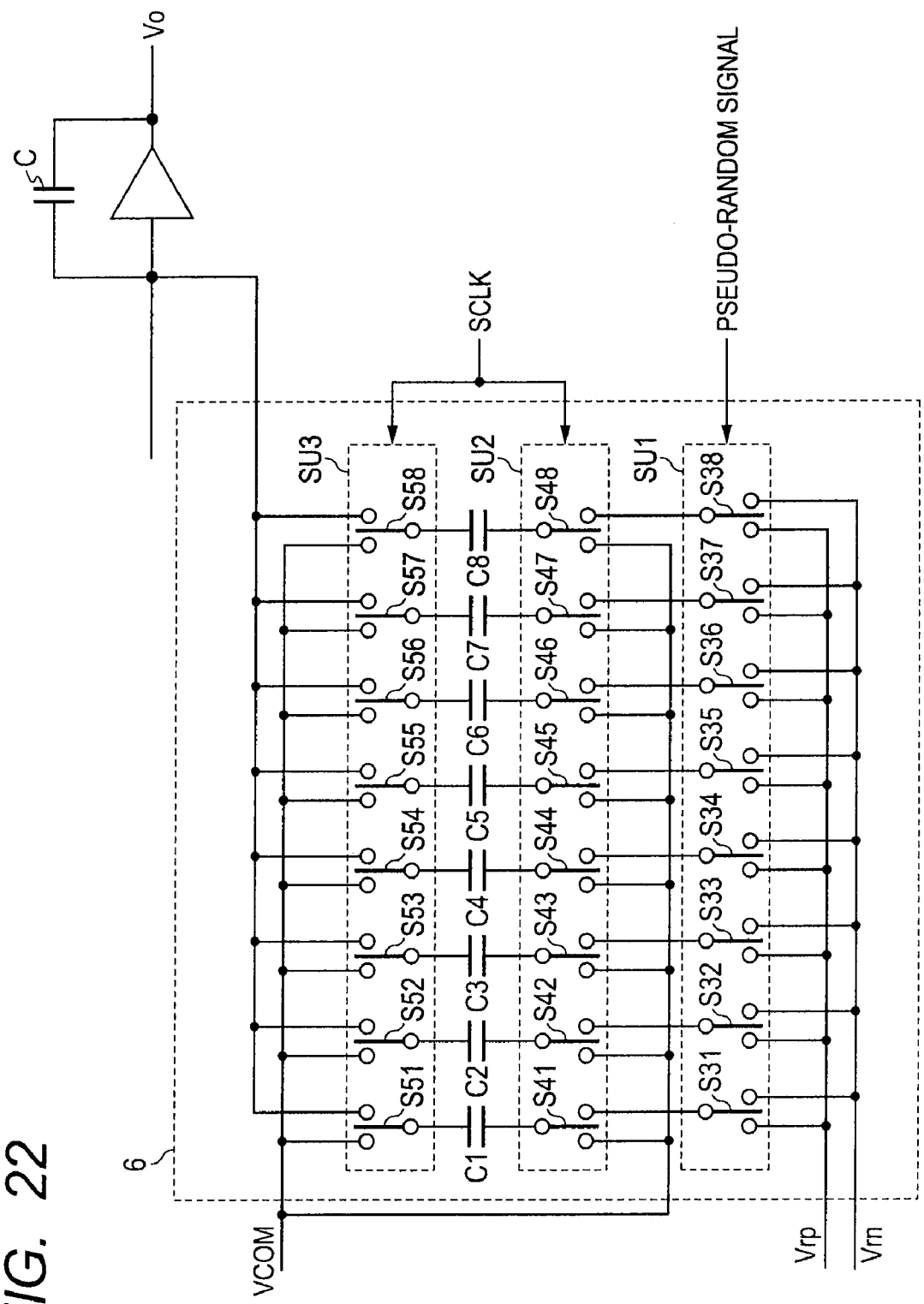
FIG. 22 is a drawing illustrating conceptually a configuration of a D/A converter for a dither signal.

FIG. 22 illustrates conceptually a configuration of a D/A converter for a dither signal. FIG. 22 illustrates an example of the configuration of the D/A converter in the case where the pseudo random signal is a digital value of 8 bits.

As illustrated in FIG. 22, the D/A converter 6 comprises switching units SU1-SU3 and capacitors C1-C8. The switching unit SU1 comprises switches S31-S38. The switching unit SU2 comprises switches S41-S48. The switching unit SU3 comprises switches S51-S58. Each of the switches S31-S38 has a first end, a second end coupled to a node to which the plus-side reference voltage vrp is supplied, and a third end coupled to a node to which the minus-side reference voltage vrn is supplied. Each of the switches S41-S48 has a first end coupled to a second end of each of the capacitors C1-C8, a second end coupled to a node to which the common voltage VCOM is supplied, and a third end coupled to the first end of each of the switches S31-S38. Each of the switches S51-S58 has a first end coupled to a first end of each of the capacitors C1-C8, a second end coupled to the node to which the common voltage VCOM is supplied, and a third end coupled to an input node of an integrator of the next stage.

Based on the pseudo random signal received from the pseudo-random signal generating unit, each of the switches S31-S38 switches to a position where the first end and the second end are coupled, or to a position where the first end and the third end are coupled. Based on a system clock SCLK which is the clock signal CLK2, for example, each of the switches S41-S48 and S51-S58 switches to a position where the first end and the second end are coupled, or to a position where the first end and the third end are coupled.

The D/A converter 6 has two modes. The D/A converter 6 acts as a sample mode when the system clock SCLK is a logic high level, for example, and acts as a hold mode when the system clock SCLK is a logic low level.

Figure 23:
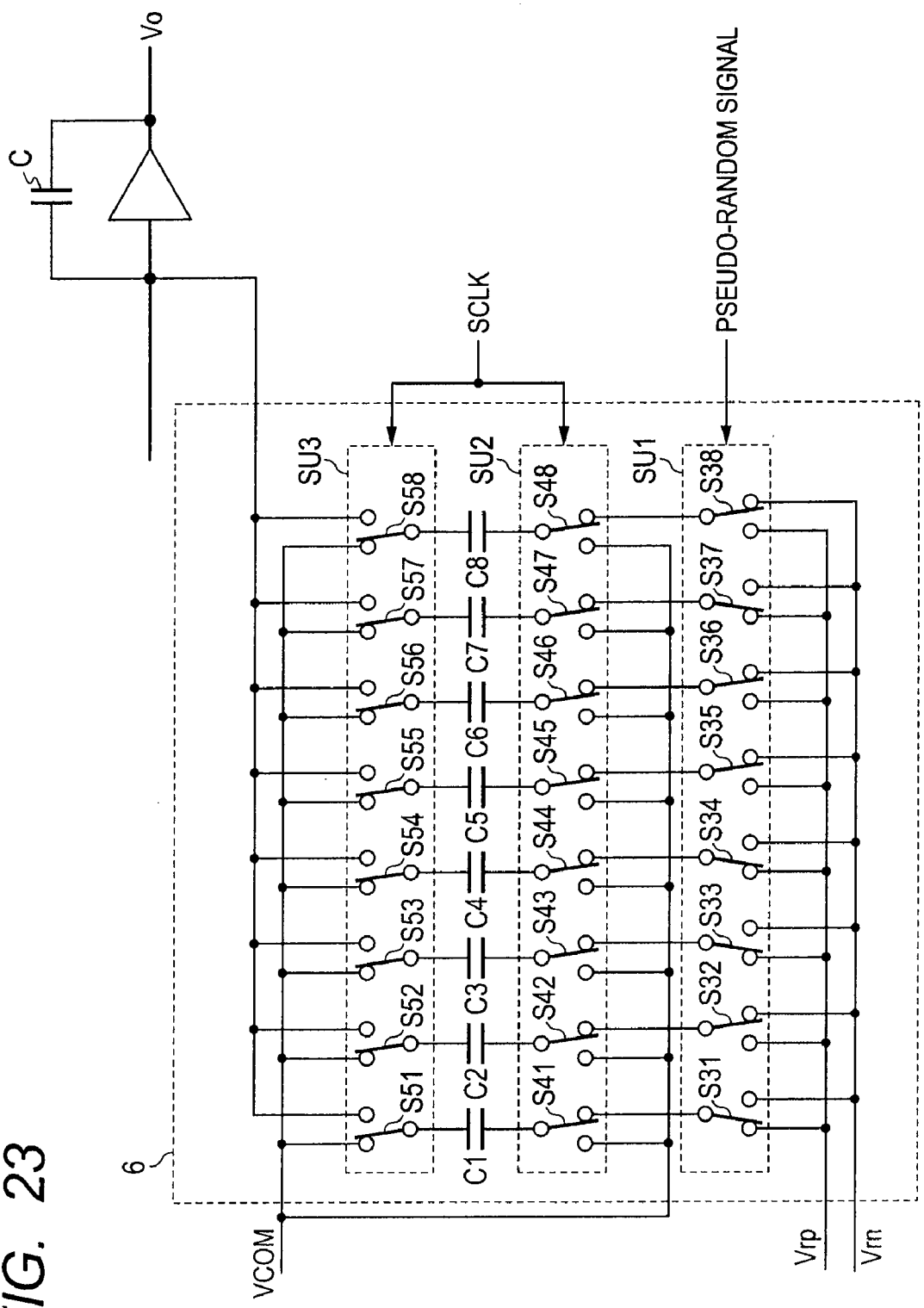
FIG. 23 is an explanatory drawing for operation in a sample mode of the D/A converter for a dither signal.

FIG. 23 is an explanatory drawing for operation in the sample mode of the D/A converter for a dither signal.

As illustrated in FIG. 23, in the sample mode, the first end of each of the capacitors C1-C8 is coupled to the node to which the common voltage VCOM is supplied via each of the switches S51-S58. The second end of each of the capacitors C1-C8 is coupled to the node to which the plus-side reference voltage vrp is supplied, or to the node to which the minus-side reference voltage vrn is supplied, via each of the switches S31-S38 and each of the switches S41-S48.

The switch S31 corresponds to the most significant bit (MSB) of the pseudo random signal, and the switch S38 corresponds to the least significant bit (LSB) of the pseudo random signal. Here, a case where the pseudo random signal is "10110010" is explained. For example, since MSB="1" in the pseudo random signal, the first end of the switch S31 is coupled to the node to which the plus-side reference voltage vrp is supplied. Since LSB="0" in the pseudo random signal, the first end of the switch S38 is coupled to the node to which the minus-side reference voltage vrn is supplied.

That is, when a certain bit in the pseudo random signal is "1", charge of Qn=(Cn×(VCOM−Vrp)) is charged by a capacitor corresponding to the bit, and when it is "0", charge of Qn=(Cn×(VCOM−Vrn)) is charged. Here, n is one integer of 1 thru 8, and Qn is the charge stored in the capacitor Cn.

Figure 24:
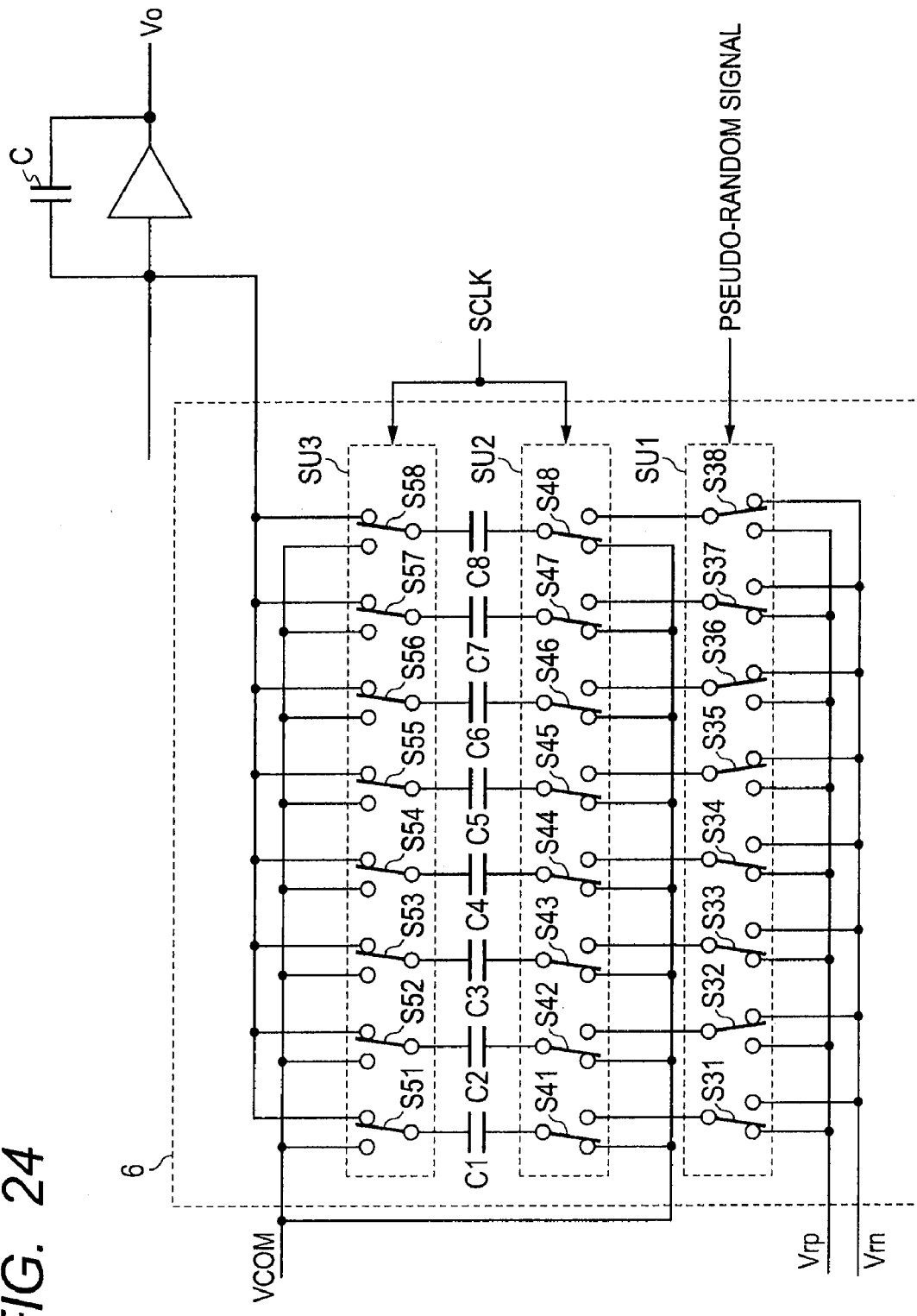
FIG. 24 is an explanatory drawing for operation in a hold mode of the D/A converter for a dither signal.

FIG. 24 is an explanatory drawing for operation in the hold mode of the D/A converter for a dither signal.

As illustrated in FIG. 24, in the hold mode, the first end of each of the capacitors C1-C8 is coupled to the input node of the integrator of the next stage via each of the switches S51-S58, and the second end is coupled to the node to which the common voltage VCOM is supplied via each of the switches S41-S48. If the voltage of the amplifier input node is the common voltage VCOM by virtue of the amplifier's virtual ground of the integrator at this time, charge currently stored in the capacitors C1-C8 will be transferred to an integral capacity C of the integrator. When there is no initial charge in the integral capacity C and there is no input to the integrator except from the D/A converter 6, an output voltage V0 of the integrator is expressed by the following equation, assuming that the integral capacity C has the value of capacitance C.

$$V_0 = VCOM - (Q1+Q2+Q3+Q4+Q5+Q6+Q7+Q8)/C$$

In the dither circuit 21, the value of the pseudo random signal is updated in the hold mode.

Here, the pseudo random signal may be a thermometer code, namely, a code in which a value is expressed by the number of "1", or the pseudo random signal may be a binary code.

It is assumed that VCOM−Vrp=vp and that VCOM−Vrn=vn. The case of the pseudo random signal="10110010" is now considered.

When the pseudo random signal is a thermometer code, it is set that Cn=Cs (n=1 to 8), namely, all values of capacitance of the capacitors C1-C8 are set as Cs. The output voltage Vo of the integrator is expressed by the following equation.

$$Vo = VCOM - (Q1 + Q2 + Q3 + Q4 + Q5 + Q6 + Q7 + Q8)/C$$
$$= VCOM - \left( \frac{Cs \times vp + Cs \times vn + Cs \times vp + Cs \times vp +}{Cs \times vn + Cs \times vn + Cs \times vp + Cs \times vn} \right)/C$$

Therefore, the D/A converter 6 acts as a D/A converter with nine-step gradation, and a total of eight capacitors of the value of capacitance Cs is needed.

On the other hand, when the pseudo random signal is a binary code, the value of capacitance of the capacitors C1-C8 is set as Cn=$(2^{(n-1)})$×Cs (n=1 to 8). The output voltage V0 of the integrator is expressed by the following equation.

$$Vo = VCOM - (Q1 + Q2 + Q3 + Q4 + Q5 + Q6 + Q7 + Q8)/C$$
$$= VCOM - (Cs \times (2^0) \times vp + Cs \times (2^1) \times vn + Cs \times (2^2) \times vp + Cs \times (2^3) \times vp + Cs \times (2^4) \times vn + Cs \times (2^5) \times vn + Cs \times (2^6) \times vp + Cs \times (2^7) \times vn)/C$$

Therefore, the D/A converter 6 acts as a D/A converter with $2^8$-step gradation, and the total ($2^8$−1) pieces of capacitors of the value of capacitance Cs are needed.

As illustrated in FIG. 18, when different pseudo random signals are obtained by providing plural pseudo-random signal generating units, the pseudo random signal may be a thermometer code or a binary code, and the value of capacitance Cs may be the same in each D/A converter.

As illustrated in FIG. 19, when a common pseudo-random signal generating unit is provided, the pseudo random signal may be a thermometer code or a binary code, however, it is necessary to change the level of the pseudo random signal in each channel, by changing the value of capacitance Cs in each D/A converter. When a pseudo random signal of a different level is obtained by performing a bit shift and a bit extension of the pseudo random signal, the pseudo random signal may be either a thermometer code or a binary code. However, since the number of "1" of the pseudo random signal inputted into each D/A converter is the same, it is necessary to change the value of capacitance Cs in each D/A converter, in the case of the thermometer code. On the other hand, in the case of the binary code, the value of capacitance Cs may be the same in each D/A converter.

Figure 25:
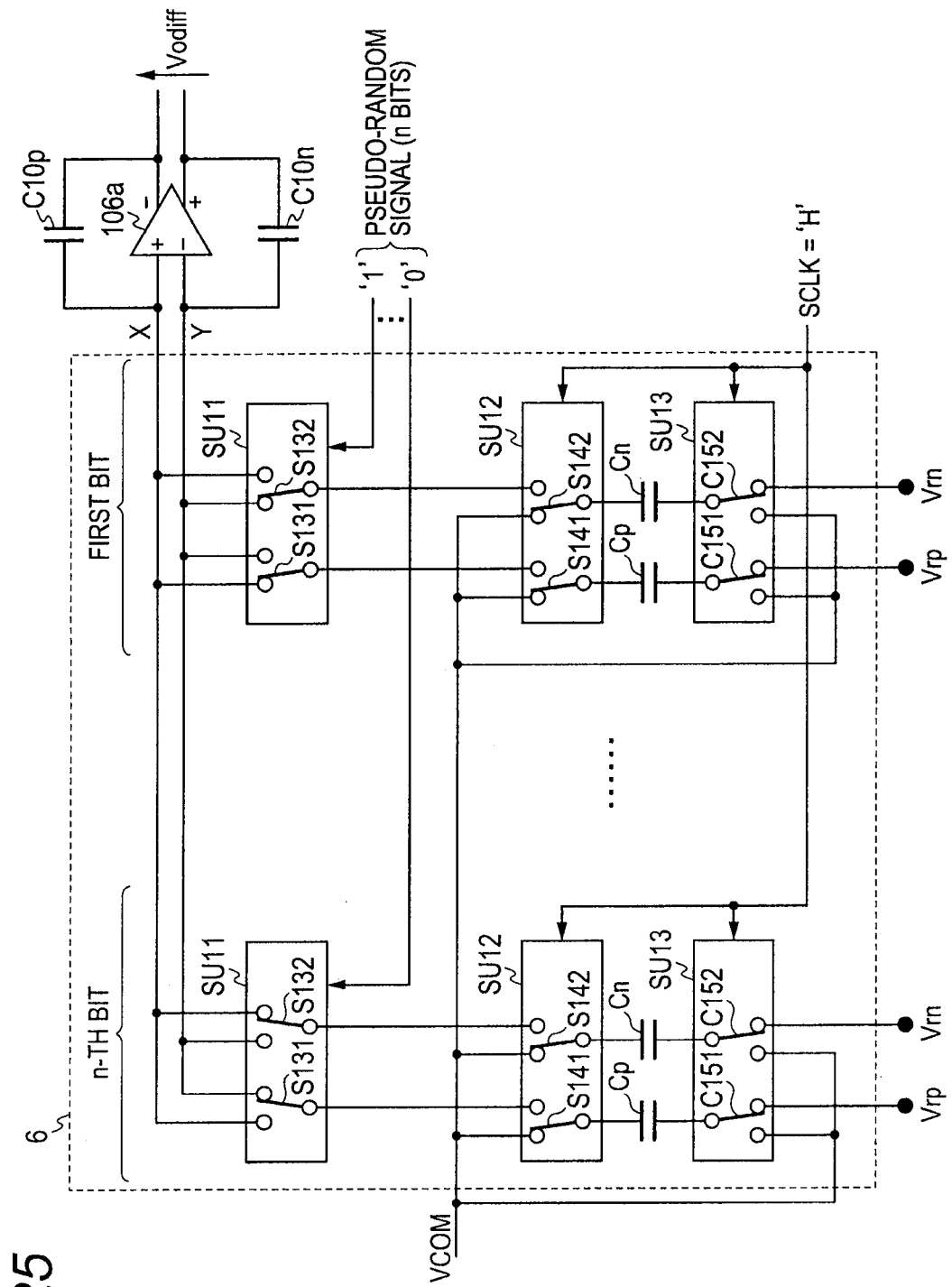
FIG. 25 is a drawing illustrating a configuration of the D/A converter for a dither signal.

FIG. 25 illustrates a configuration of the D/A converter for a dither signal. FIG. 25 illustrates an example of the configuration of which the D/A converter illustrated in FIG. 22 is applied to the differential type integrator 106 illustrated in FIG. 21. FIG. 25 illustrates a D/A converter which is controlled by an n-bit pseudo random signal, more specifically, a typical state where the first bit is "1" and the n-th bit is "0" in the pseudo random signal.

As illustrated in FIG. 25, n-pieces of circuits for the n bits in the D/A converter 6 have the same circuit configuration. Each of n-bit circuits in the D/A converter 6 comprises switching units SU11-SU13, and capacitors Cp and Cn. The switching unit SU11 comprises switches S131 and S132. The switching unit SU12 comprises switches S141 and S142. The switching unit SU13 comprises switches S151 and S152.

Each of the switches S131 and S132 has a first end, a second end coupled to an input node X, namely, the noninverting input terminal of the differential output operational amplifier 106a, and a third end coupled to an input node Y, namely, the inverting input terminal of the differential output operational amplifier 106a. Each of the switches S141 and S142 has a first end coupled to a first end of each of the capacitors Cp and Cn, a second end coupled to a node to which the common voltage VCOM is supplied, and a third end coupled to the first end of each of the switches S131 and S132. Each of the switches S151 and S152 has a first end coupled to a second end of each of the capacitors Cp and Cn, a second end coupled to the node to which the common voltage VCOM is supplied, and a third end coupled to a node to which the plus-side reference voltage vrp or the minus-side reference voltage vrn is supplied.

Based on the pseudo random signal received from the pseudo-random signal generating unit, each of the switches S131 and S132 switches to a position where the first end and the second end are coupled, or to a position where the first end and the third end are coupled. Based on the system clock SCLK, each of the switches S141, S142, S151, and S152 switches to a position where the first end and the second end are coupled, or to a position where the first end and the third end are coupled.

In the sample mode, namely, when the system clock SCLK is a logic high level, the first end of each of the capacitors Cp and Cn is coupled to the node to which the common voltage VCOM is supplied via each of the switches S141 and S142. The second end of each of the capacitors Cp and Cn is coupled to the node to which the plus-side reference voltage vrp is supplied, or to the node to which the minus-side reference voltage vrn is supplied, via each of the switches S151 and S152. At this time, the charge filled up in the capacitors Cp and Cn is Cp×(VCOM−Vrp) and Cn×(VCOM−Vrn), respectively.

In the hold mode, namely, when the system clock SCLK is a logic low level, the first end of each of the capacitors Cp and Cn is coupled to the input node of the integrator 106 of the next stage, via each of the switches S141 and S142 and each of the switches S131 and S132, and the second end of each of the capacitors Cp and Cn is coupled to the node to which the common voltage VCOM is supplied, via each of the switches S151 and S152. Here, the nodes X and Y to which the first end of each of the capacitors Cp and Cn is coupled are chosen by the switches S131 and S132 controlled by the pseudo random signal. When the voltage of the input nodes X and Y is the common voltage VCOM by virtue of the virtual ground of the differential output operational amplifier 106a in the integrator 106 at this time, the charge currently stored in the capacitors Cp and Cn is transferred to the integral capacitor of the integrator 106. It is assumed that the values of capacitance of the integral capacitors C10p and C10n are C, respectively. When there is no initial charge in the integral capacitors C10p and C10n and there is no input to the integrator except from the D/A converter 6, the output voltage Vodiff of the integrator 106 is expressed by the following equation.

$$Vodiff = Cn \times Vrn/C - Cp \times Vrp/C$$

The above is a case where the pseudo random signal is "1." When the pseudo random signal is "0", the output voltage Vodiff of the integrator 106 is expressed by the following equation.

$$Vodiff = Cp \times Vrp/C - Cn \times Vrn/C$$

In this way, the D/A converter 6 operates as an n-bit D/A converter.

When the pseudo random signal is a thermometer code, the value of capacitance of the capacitor Cn is set up equally in the first bit circuit thru the n-th bit circuit. This is the same also for the capacitor Cp.

When the pseudo random signal is a binary code, on the other hand, the value of capacitance of the capacitor Cn may be changed in the first bit circuit thru the n-th bit circuit. This is the same also for the capacitor Cp. In a circuit of the same-order bit, the value of capacitance of the capacitor Cn and the value of capacitance of the capacitor Cp are set up equally.

In the delta-sigma A/D converter 201, as explained with reference to FIG. 21 for example, the integrator provided in the subsequent stage of the addition unit plays a role of the addition unit concerned.

For example, the addition unit 105 in the preceding stage of the integrator 106 illustrated in FIG. 17 performs the addition of three signals: the output signal of the dither circuit 21, the output signal of the gain stage 121, and the output signal of the gain stage 108. In the delta-sigma A/D converter 201, the addition is performed, utilizing the fact that the output system of the switched-capacitor circuit employed in each of the gain stage 108, the gain stage 121, and the D/A converter 6 as illustrated in FIG. 21 is the charge transfer system as described above. That is, when the potential of the input nodes X and Y of the integrator 106 is given by the common voltage VCOM by virtue of the virtual ground, the charges to be transferred by the gain stage 108, the gain stage 121, and the D/A converter 6 are transferred to the integral capacity of the integrator 106, respectively, and are added together.

Gain of a gain stage and a D/A converter and the like which comprise an SC circuit is determined by a ratio of the sampling capacity of each SC circuit to the integral capacity of the integrator.

Figure 26:
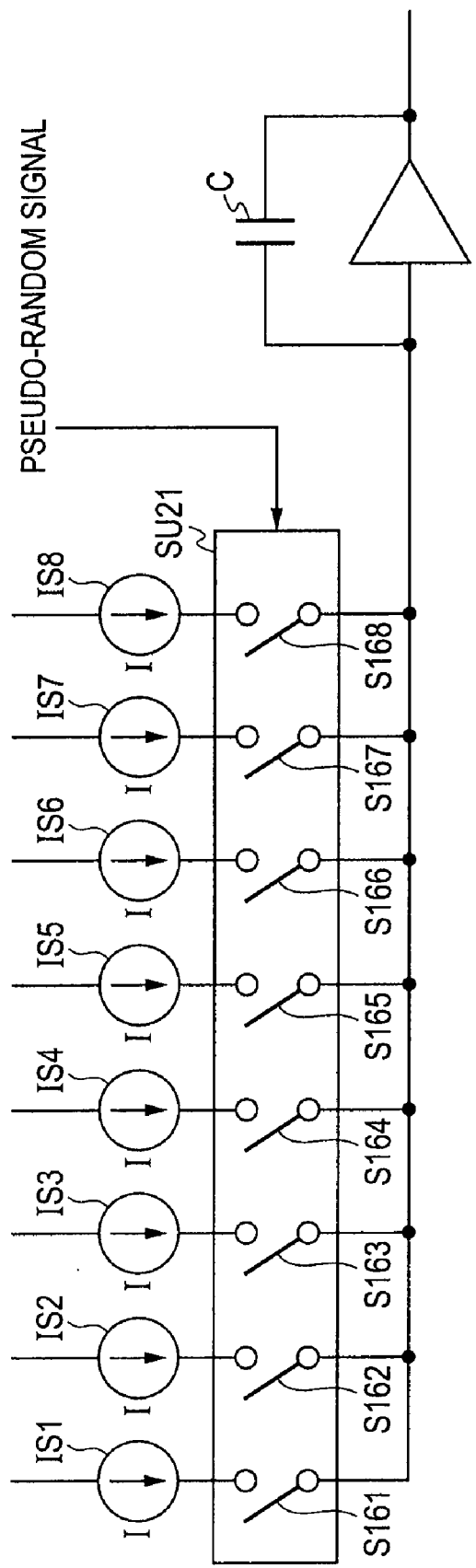
FIG. 26 is a drawing illustrating conceptually a configuration of a modified example of the D/A converter for a dither signal.

FIG. 26 illustrates conceptually a configuration of a modified example of the D/A converter for a dither signal. As illustrated in FIG. 26, the D/A converter comprises current sources IS1-IS8 and a switching unit SU21. The switching unit SU21 comprises switches S161-S168.

The switches S161-S168 change whether or not to output to an integrator the current received from the current sources IS1-IS8, based on a pseudo random signal generated by an M-sequence pulse generator, etc. For example, when a certain bit of the pseudo random signal is "1", the corresponding switch of the switching unit SU21 turns on.

When it is assumed that the current which each current source sends is I, the time during which each switch turns on is ton, and the number of "1" of an 8-bit pseudo random signal is N, then, the charge which flows into the integral capacity C is expressed by the following equation.

$$Q = I \times \text{ton} \times N$$

According to Embodiment 1, the pseudo random signal which is a kind of a random dither is supplied to the delta-sigma modulator 11. Therefore, the random dither is superimposed also on an idle tone included in an input signal of the quantizer 113. When the random dither is superimposed on the idle tone as illustrated in the dashed line in FIGS. 4 and 5, the periodicity of the idle tone is destroyed and the level of the periodic noise signal is reduced. Accordingly, an adverse influence of the idle tone can be suppressed.

Here, a delta-sigma modulator of two channels like the delta-sigma A/D converter 200 is considered. Owing to a DC dither applied to the delta-sigma modulator of each channel, an idle tone generated in each delta-sigma modulator moves to a high frequency region, that is, it becomes possible to remove the idle tone from the desired band such as the audible frequency range, etc.

However, in each channel, when the frequency of an idle tone which has moved to the high frequency region is near with each other, each idle tone interferes mutually, and a "tone due to mutual interference" is generated in a low frequency region. The frequency of the "tone due to mutual interference" corresponds to a component of a difference of the frequency of the idle tone which has been generated in each delta-sigma modulator. Here, even if each delta-sigma modulator is designed in a completely similar manner, a difference of the frequency of the idle tone of each delta-sigma modulator arises in practice due to variation in elements, etc.

Therefore, in the delta-sigma A/D converter 200, a DC dither to be applied to one of the delta-sigma modulators is enlarged. Thereby, the difference of the frequency of the idle tone generated in each delta-sigma modulator becomes large. Therefore, the frequency of the "tone due to mutual interference" also becomes high, and it becomes possible to remove the tone from the desired band.

Also in the delta-sigma A/D converter 201, when the completely same dither signal is supplied to each delta-sigma modulator, there arises a tone similar to the mutual interference of the idle tones which have moved to a high frequency region, as described above. This tone is generated even through the use of a random dither, the use of which has rendered the idle tone no longer observed also in a high frequency region in the audible frequency range. This is because a signal generated by interference has a periodicity, even if the output of each delta-sigma modulator does not have a periodicity.

As in the delta-sigma A/D converter 200 and the delta-sigma A/D converter 201, the periodicity of a signal generated by interference can be destroyed by supplying a dither which is different in each delta-sigma modulator. Therefore, it becomes possible to remove the tone due to interference.

However, in the delta-sigma A/D converter 200, a DC voltage is added in the addition unit 103 acting as the input section of an analog input signal. Therefore, the input voltage range becomes narrow as described above. Accordingly, a problem may arise in attaining low voltage operation, a small area, and further high efficiency.

On the other hand, in the delta-sigma A/D converter 201, a dither signal is added at the output stage of the integrator in the delta-sigma modulator 11.

By adopting such a configuration, it is possible to remove an idle tone, and in addition, it is possible to prevent the input voltage range from narrowing because no dither signal is added to the input section. It is also possible to control a tone due to channel-to-channel interference, by using, as a dither signal, a pseudo random signal which does not have correlation between channels.

In the delta-sigma A/D converter according to Embodiment 1 of the present invention, the dither circuit 21 is configured to generate an analog conversion signal of the pseudo random signal as a dither signal. However, the configuration of the dither circuit is not limited to the above. As is the case with the delta-sigma A/D converter 200, the dither circuits 21L and 21R may be configured to generate DC voltages with the same polarity and mutually different voltage levels, as the dither signal D1 and the dither signal D2, respectively. Furthermore, the dither signal may be a square wave or a saw-tooth wave.

Figure 27:
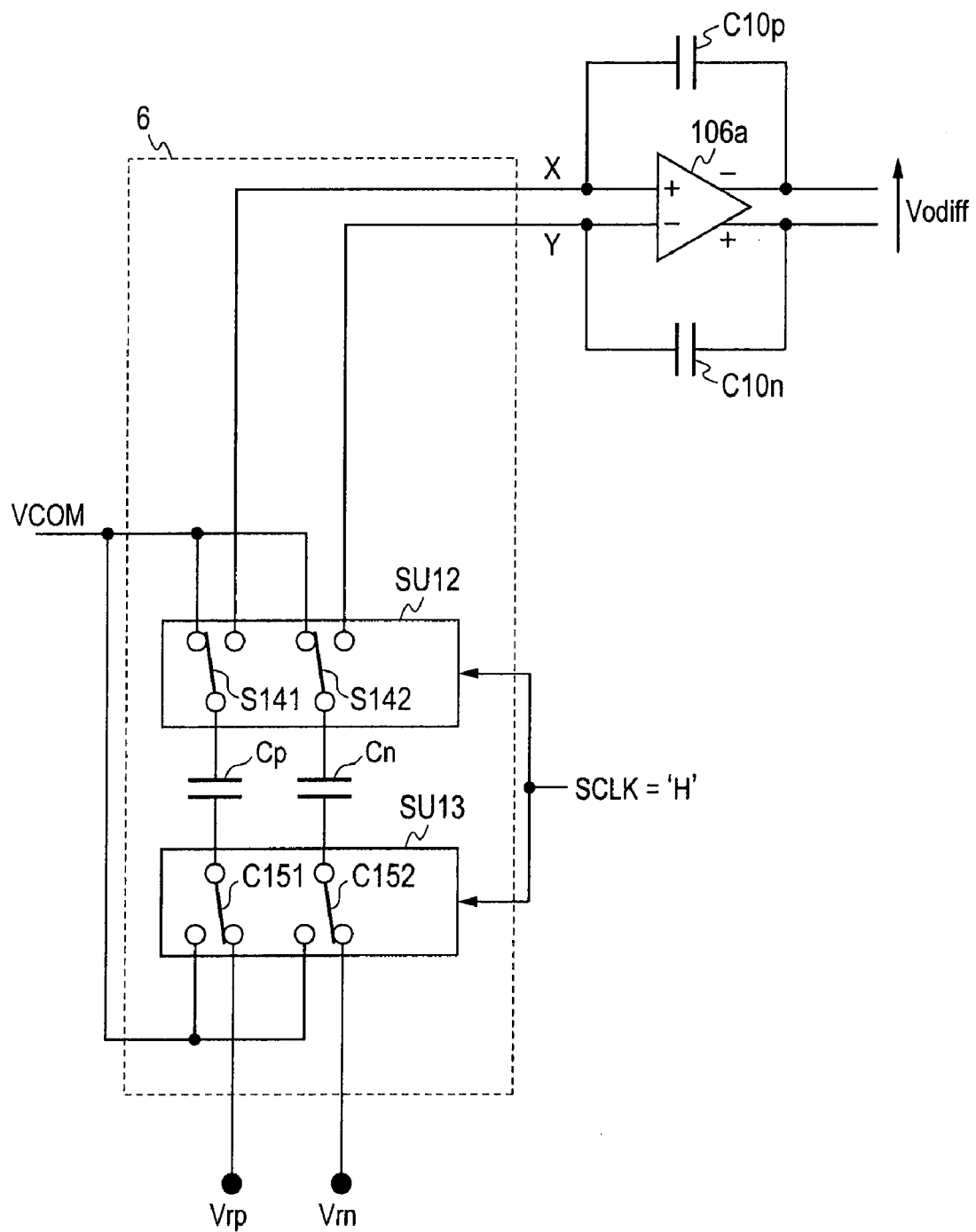
FIG. 27 is a drawing illustrating a configuration of a D/A converter which outputs a DC addition voltage as a dither signal.

FIG. 27 illustrates a configuration of a D/A converter which outputs a DC addition voltage as a dither signal.

As illustrated in FIG. 27, the present D/A converter 6 is configured not to comprise the switching unit SU11, compared with the D/A converter 6 illustrated in FIG. 25.

The D/A converter which outputs a DC addition voltage is equivalent to a case where the pseudo random signal is a fixed value in the D/A converter 6 illustrated in FIG. 25, namely, equivalent to a case where a switch controlled by the pseudo random signal does not exist. In the case, charge transferred to the integral capacitors C10$p$ and C10$n$ of the integrator 106 becomes always constant, and the output voltage Vodiff of the integrator 106 becomes a DC voltage.

In this way, a pseudo-random signal generating unit or the like becomes unnecessary by adopting the DC addition voltage as the dither signal. Therefore, compared with a case where a random dither is supplied, it is possible to simplify the dither circuit and to promote easiness of the design thereof.

By adopting the configuration in which a DC addition voltage is superimposed on the output signal of the first integrator 104 among the three stages of integrators in the delta-sigma modulator 11 as illustrated in FIG. 17, it is possible to perform more easily level adjustment in the delta-sigma modulator 11.

On the other hand, when supplying a random dither, it is possible to widen a signal level range for which the delta-sigma modulator 11 can operate, compared with a configuration in which a DC dither is supplied.

Although the delta-sigma A/D converter according to Embodiment 1 of the present invention has the configuration which comprises two channels, the L channel Lch and the R channel Rch, the configuration may comprise three or more channels.

The delta-sigma A/D converter according to Embodiment 1 of the present invention has the configuration in which the dither circuits 21L and 21R supply the same kind of dither signal to the delta-sigma modulators 11L and 11R, respectively. However, the configuration is not limited to the above. An alternative configuration may be such that the dither circuits 21L and 21R supply a different kind of dither signal to the delta-sigma modulators 11L and 11R, respectively; for example, a random dither is supplied to the L channel Lch and a dither of a saw-tooth wave is supplied to the R channel Rch. By using a different kind of dither signal, it is possible to suppress a tone due to channel-to-channel interference.

The delta-sigma A/D converter according to Embodiment 1 of the present invention has the configuration in which the dither signal is superimposed at one place in one delta-sigma modulator 11. However, the configuration is not limited to the above. An alternative configuration may be such that the dither signal is superimposed at two or more places.

Figure 28:
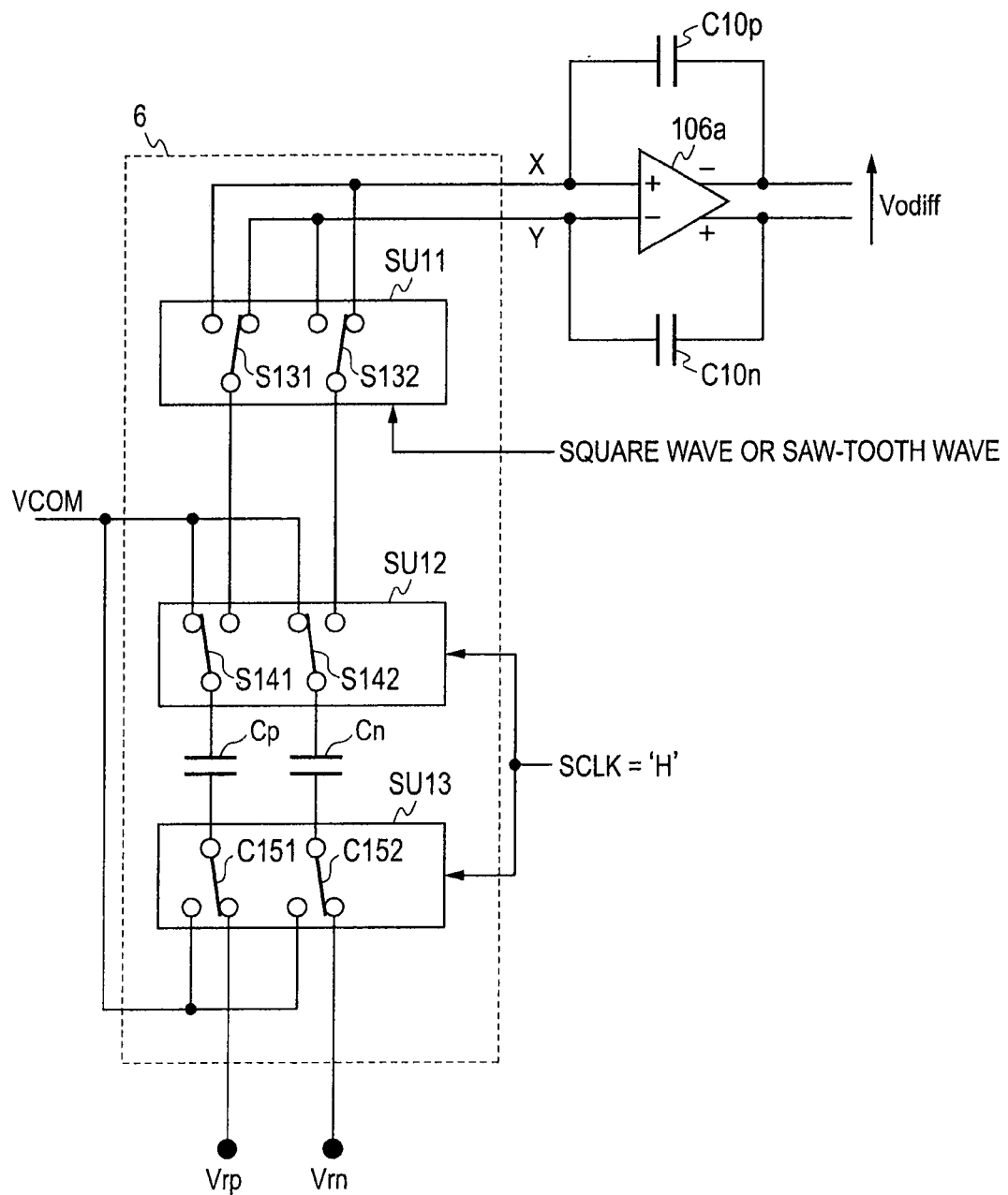
FIG. 28 is a drawing illustrating a configuration of a D/A converter which outputs a square wave or a saw-tooth wave as a dither signal.

FIG. 28 illustrates a configuration of a D/A converter which outputs a square wave or a saw-tooth wave as a dither signal.

As illustrated in FIG. 28, the present D/A converter 6 is configured so as to include a circuit for one bit of the D/A converter 6 illustrated in FIG. 25.

Figure 29:
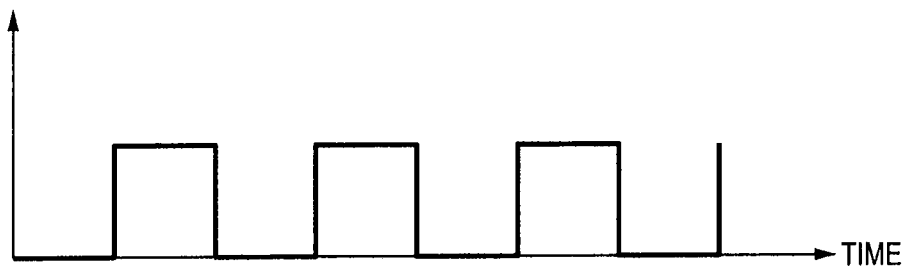
FIG. 29 is a drawing illustrating a square wave supplied to the D/A converter 6.
Figure 30:
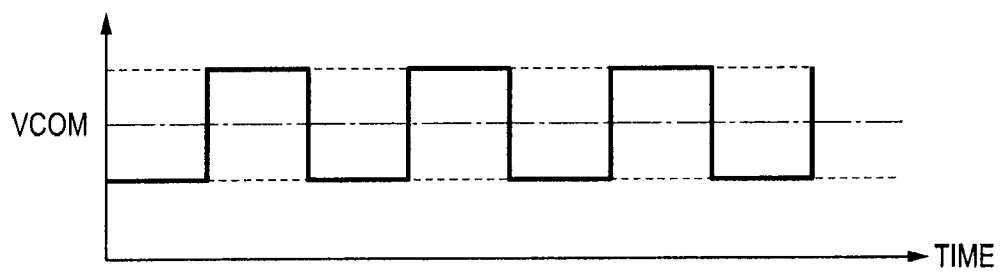
FIG. 30 is a drawing illustrating a signal which is supplied to a differential output operational amplifier 106a of the D/A converter 6.

FIG. 29 illustrates a square wave supplied to the D/A converter 6. FIG. 30 illustrates a signal which is supplied to a differential output operational amplifier 106$a$ of the D/A converter 6.

When the square wave as illustrated in FIG. 29 is supplied to a switching unit SU11 in the D/A converter 6, a signal of a wave indicated by a solid line in FIG. 30 is supplied to one input terminal of the differential output operational amplifier 106$a$ in the D/A converter 6, and a signal of a wave indicated by a dashed line in FIG. 30, that is a signal shifting the phase of the solid-line wave by 180 degrees, is supplied to the other input terminal.

Figure 31:
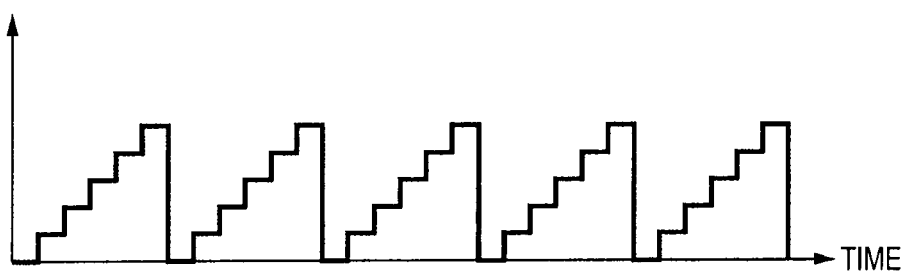
FIG. 31 is a drawing illustrating a saw-tooth wave supplied to the D/A converter 6.
Figure 32:
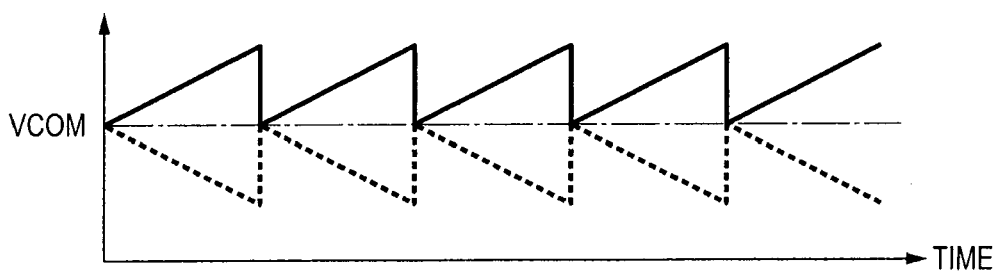
FIG. 32 is a drawing illustrating a signal which is received by the differential output operational amplifier 106a of the D/A converter 6.

FIG. 31 illustrates a saw-tooth wave supplied to the D/A converter 6. FIG. 32 illustrates a signal which is received by the differential output operational amplifier 106$a$ of the D/A converter 6.

When the saw-tooth wave as illustrated in FIG. 31 is supplied to the switching unit SU11 in the D/A converter 6, a signal of a wave indicated by a solid line in FIG. 32 is supplied to one input terminal of the differential output operational amplifier 106$a$ in the D/A converter 6, and a signal of a wave indicated by a dashed line in FIG. 32 is supplied to the other input terminal.

A cycle or an amplitude of a signal supplied to the differential output operational amplifier 106$a$ is set up differently between each channel.

Next, another embodiment of the present invention is explained with reference to the accompanying drawings. In drawings, the same reference symbol will be given to the same portion or the corresponding portion, and the explanation thereof will not be repeated.

Embodiment 2

Compared with the delta-sigma A/D converter according to Embodiment 1, the present embodiment relates to a delta-sigma A/D converter in which a position to be added with a dither signal is changed. Contents except what is explained below are the same as those of the delta-sigma A/D converter according to Embodiment 1.

Compared with the delta-sigma A/D converter 201, a delta-sigma A/D converter 202 according to Embodiment 2 of the present invention comprises delta-sigma modulators 12L and 12R, instead of the delta-sigma modulators 11L and 11R.

Figure 33:
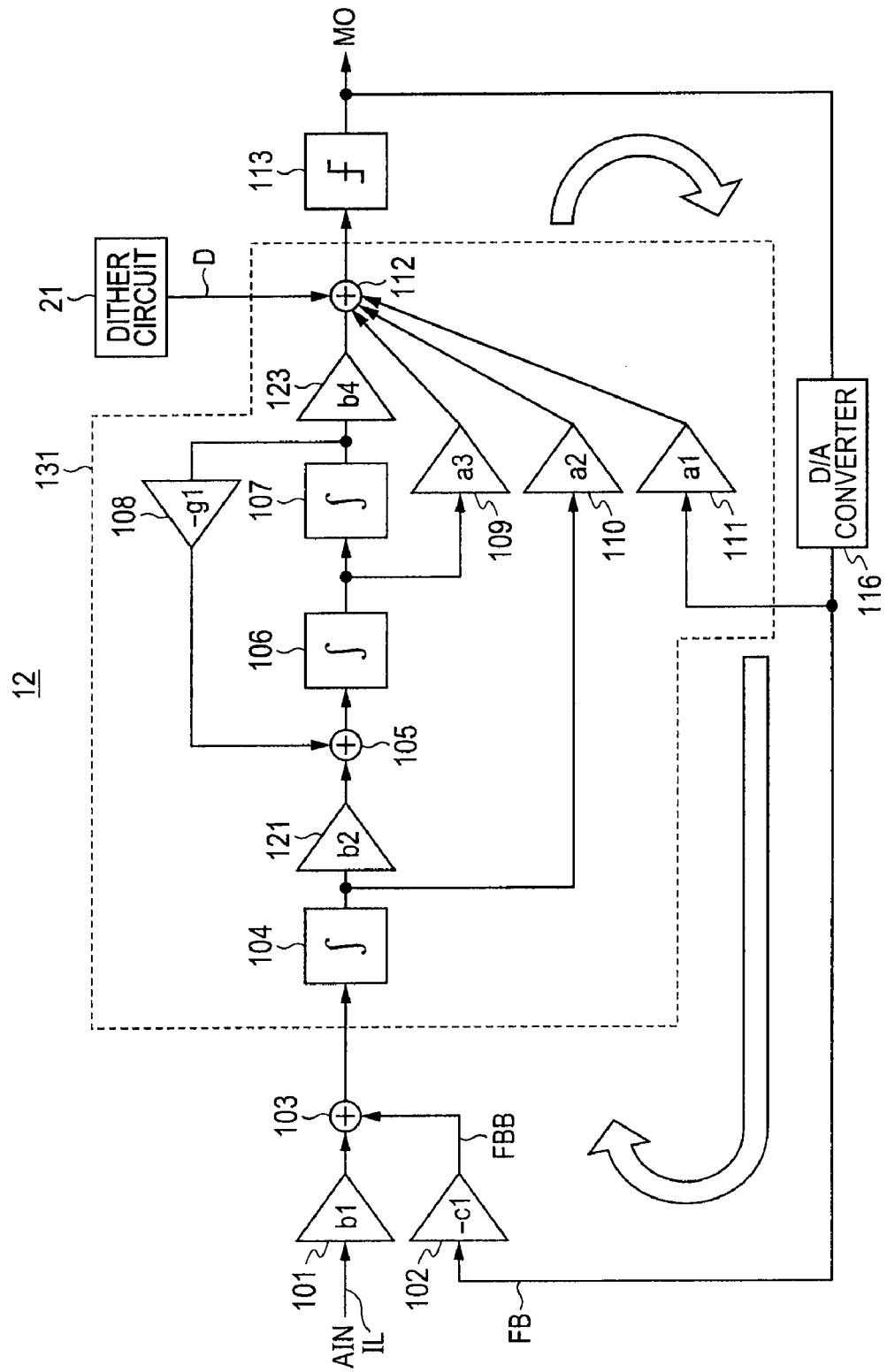
FIG. 33 is a block diagram illustrating an example of a configuration of delta-sigma modulators 12L and 12R.
Figure 34:
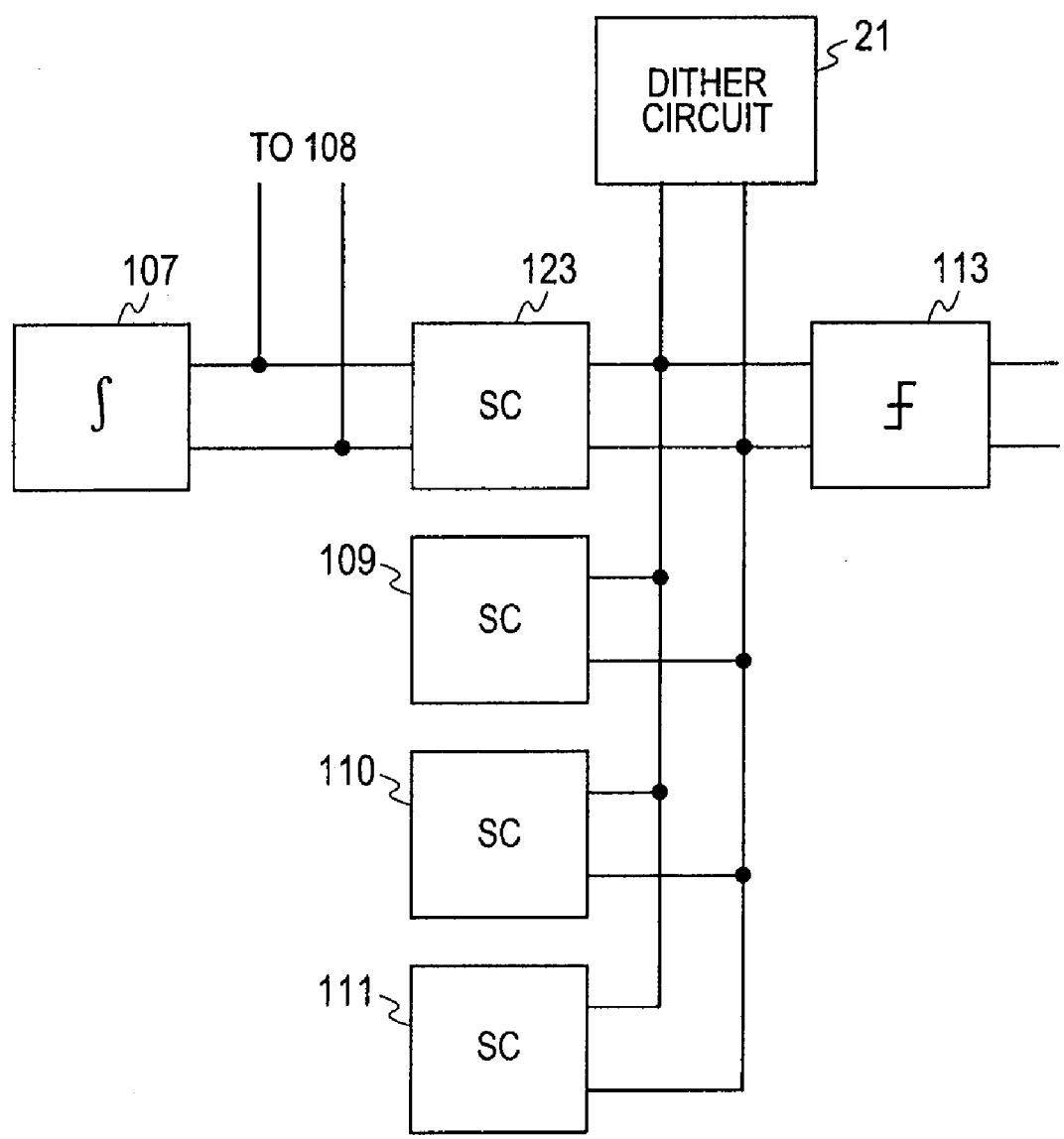
FIG. 34 is a drawing illustrating roughly a configuration of an input section of a dither signal in a delta-sigma modulator according to Embodiment 2 of the present invention.

FIG. 33 is a block diagram illustrating an example of a configuration of the delta-sigma modulators 12L and 12R. FIG. 34 illustrates roughly a configuration of an input section of a dither signal in the delta-sigma modulator according to Embodiment 2 of the present invention. In Embodiment 2, the configuration of the delta-sigma modulators 12L and 12R is the same with each other. Henceforth, the delta-sigma modulators 12L and 12R are collectively called a "delta-sigma modulator 12."

As illustrated in FIGS. 33 and 34, in the delta-sigma A/D converter 202, the dither signal is added in the preceding stage of the quantizer in the delta-sigma modulator 12. That is, in the delta-sigma modulator 12 of each of the L channel Lch and the R channel Rch, the dither circuit 21 generates the dither signal D, and superimposes it on an output signal of the gain stage 123. The addition unit 112 adds and outputs an output signal of the gain stage 123, output signals of the gain stages 109-111, and the dither signal D.

Figure 35:
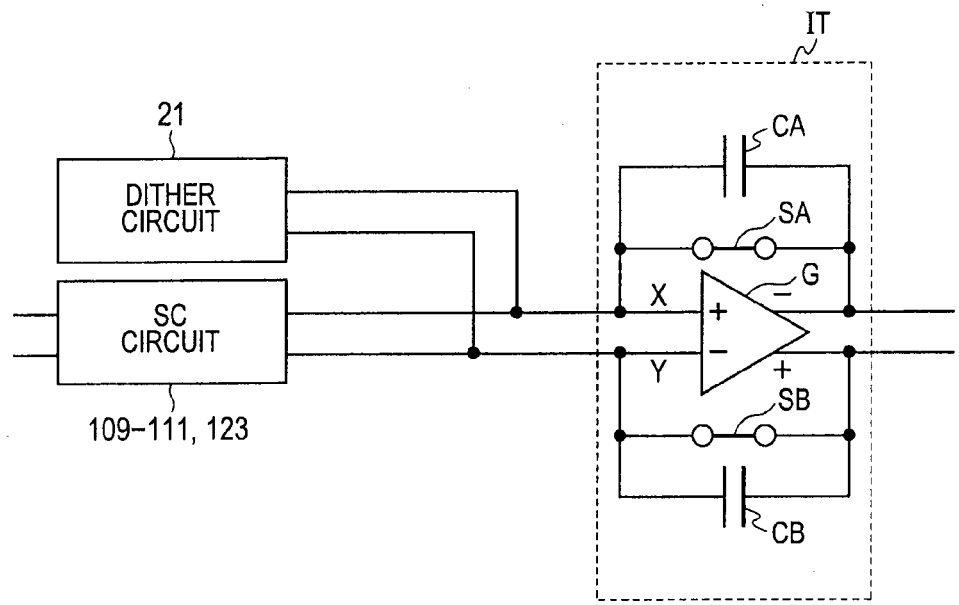
FIG. 35 is a drawing illustrating a configuration and operation in a sample mode of an addition unit in a preceding stage of a quantizer in the delta-sigma A/D converter according to Embodiment 2 of the present invention.
Figure 36:
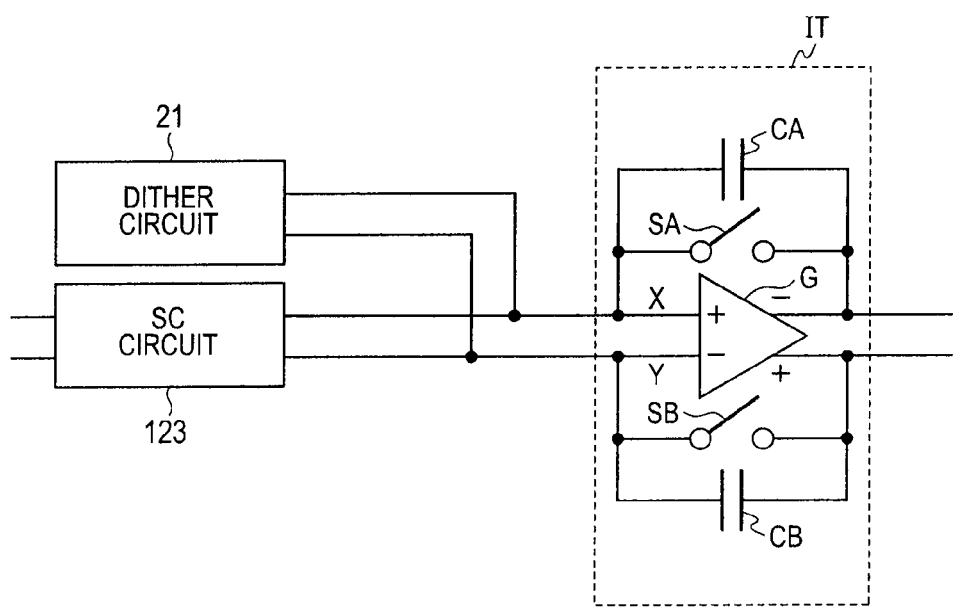
FIG. 36 is a drawing illustrating a configuration and operation in a hold mode of the addition unit in the preceding stage of the quantizer in the delta-sigma A/D converter according to Embodiment 2 of the present invention.

FIG. 35 illustrates a configuration and operation in a sample mode of the addition unit in the preceding stage of the quantizer in the delta-sigma A/D converter 202 according to Embodiment 2 of the present invention. FIG. 36 illustrates a configuration and operation in a hold mode of the addition unit in the preceding stage of the quantizer in the delta-sigma A/D converter 202 according to Embodiment 2 of the present invention.

As illustrated in FIGS. 35 and 36, the quantizer 113 comprises an integrator IT. The integrator IT comprises a differential output operational amplifier G, switches SA and SB, and capacitors CA and CB. The differential output operational amplifier G is provided with a noninverting input terminal coupled to a first end of the capacitor CA and a first end of the switch SA, an inverting input terminal coupled to a first end of the capacitor CB and a first end of the switch SB, an inverted output terminal coupled to a second end of the capacitor CA and a second end of the switch SA, and a noninverting output terminal coupled to a second end of the capacitor CB and a second end of the switch SB.

The addition unit 112 in the preceding stage of the quantizer 113 can be realized by providing the switches SA and SB which reset charge stored in the integral capacity (namely, the capacitors CA and CB) of the integrator IT in the quantizer 113.

As illustrated in FIG. 35, by turning on the switches SA and SB during a period when the SC circuit of the dither circuit 21 and the SC circuits of the gain stages 109-111, and 123 are in a sample mode, the charge of the integral capacitors CA and CB is reset.

Then, as illustrated in FIG. 36, by turning off the switches SA and SB just before the SC circuit of the dither circuit 21 and the SC circuit of the gain stage 123 shift into a hold mode, charges to be transferred from the dither circuit 21 and the gain stages 109-111, and 123 are transferred to the integral capacitors CA and CB of the integrator IT, respectively, and are added together.

Gain of a gain stage and a D/A converter and the like which comprise an SC circuit is determined by a ratio of the sampling capacity of each SC circuit to the integral capacity.

Since other configurations and operations are the same as those of the delta-sigma A/D converter 201 according to Embodiment 1, the detailed explanation thereof will not be repeated here.

Accordingly, in the delta-sigma A/D converter 202 according to Embodiment 2 of the present invention, as is the case with the delta-sigma A/D converter 201 according to Embodiment 1 of the present invention, it is possible to remove an idle tone, and in addition, it is possible to prevent the input voltage range from narrowing because no dither signal is added to the input section. It is also possible to control a tone due to channel-to-channel interference, by using, as a dither signal, a pseudo random signal which does not have correlation between channels.

When the dither signal is an analog conversion signal of the pseudo random signal, by adopting a configuration in which the analog conversion signal of the pseudo random signal is superimposed on an output signal of the last integrator 107 among three stages of integrators in the delta-sigma modulator 12, that is, by adopting a configuration in which the analog conversion signal of the pseudo random signal is superimposed in the preceding stage of the quantizer 113, it becomes possible to perform more easily the level adjustment in the delta-sigma modulator 12.

Next, another embodiment of the present invention is explained with reference to the accompanying drawings. In drawings, the same reference symbol will be given to the same portion or the corresponding portion, and the explanation thereof will not be repeated.

Embodiment 3

Compared with the delta-sigma A/D converter according to Embodiment 1, the present embodiment relates to a delta-sigma A/D converter in which a position to be added with a dither signal is changed. Contents except what is explained below are the same as those of the delta-sigma A/D converter according to Embodiment 1.

Compared with the delta-sigma A/D converter 201, a delta-sigma A/D converter 203 according to Embodiment 3 of the present invention comprises delta-sigma modulators 13L and 13R, instead of the delta-sigma modulators 11L and 11R.

Figure 37:
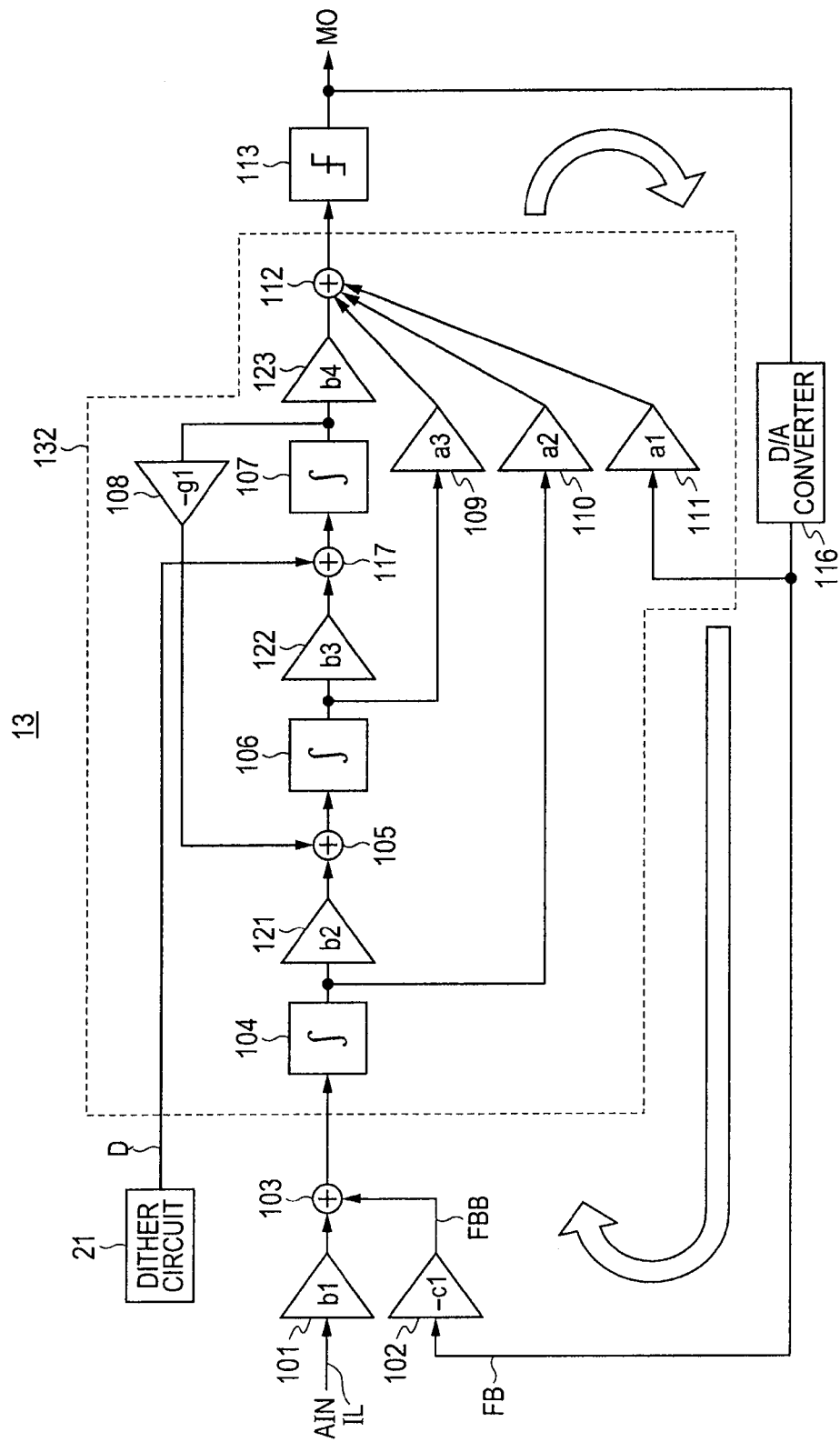
FIG. 37 is a block diagram illustrating an example of a configuration of delta-sigma modulators 13L and 13R.
Figure 38:
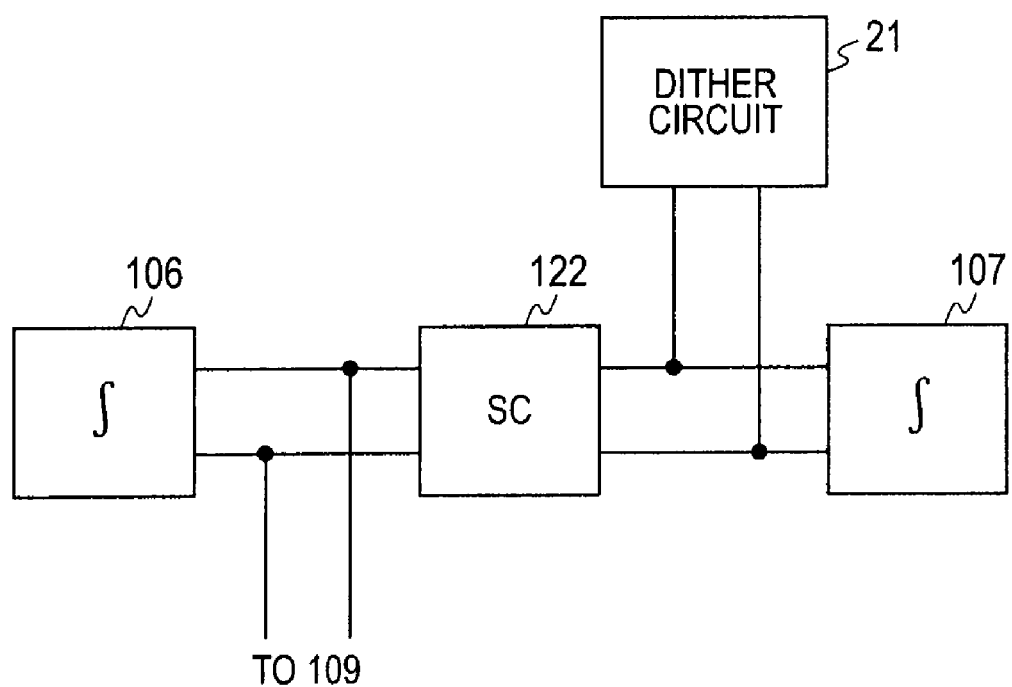
FIG. 38 is a drawing illustrating roughly a configuration of an input section of a dither signal in a delta-sigma modulator according to Embodiment 3 of the present invention.

FIG. 37 is a block diagram illustrating an example of a configuration of delta-sigma modulators 13L and 13R. FIG. 38 illustrates roughly a configuration of an input section of a dither signal in a delta-sigma modulator according to Embodiment 3 of the present invention. In Embodiment 3, the configuration of the delta-sigma modulators 13L and 13R is the same with each other. Henceforth, the delta-sigma modulators 13L and 13R are collectively called a "delta-sigma modulator 13."

As illustrated in FIG. 37, the delta-sigma modulator 13 comprises further a gain stage 122 and an addition unit 117, compared with the delta-sigma modulator 11. In the delta-sigma modulator 13 of each of the L channel Lch and the R channel Rch, the gain stage 122 amplifies an output signal of the integrator 106 to increase the signal level b3 times (b3 is a positive value), and outputs the amplified signal. The dither circuit 21 generates a dither signal D, and superimposes it on an output signal of the gain stage 122. The addition unit 117 adds an output signal of the gain stage 122 and the dither signal D, and outputs the added signal to the integrator 107.

Since other configurations and operations are the same as those of the delta-sigma A/D converter 201 according to Embodiment 1, the detailed explanation thereof will not be repeated here.

Accordingly, in the delta-sigma A/D converter 203 according to Embodiment 3 of the present invention, as is the case with the delta-sigma A/D converter 201 according to Embodiment 1 of the present invention, it is possible to remove an idle tone, and in addition, it is possible to prevent the input voltage range from narrowing because no dither signal is added to the input section. It is also possible to control a tone due to channel-to-channel interference, by using, as a dither signal, a pseudo random signal which does not have correlation between channels.

Next, another embodiment of the present invention is explained with reference to the accompanying drawings. In drawings, the same reference symbol will be given to the same portion or the corresponding portion, and the explanation thereof will not be repeated.

Embodiment 4

Compared with the delta-sigma A/D converter according to Embodiment 1, the present embodiment relates to a delta-sigma A/D converter in which an order of integration of a delta-sigma modulator is changed. Contents except what is explained below are the same as those of the delta-sigma A/D converter according to Embodiment 1.

Compared with the delta-sigma A/D converter 201, a delta-sigma A/D converter 204 according to Embodiment 4 of the present invention comprises delta-sigma modulators 14L and 14R instead of the delta-sigma modulators 11L and 11R.

Figure 39:
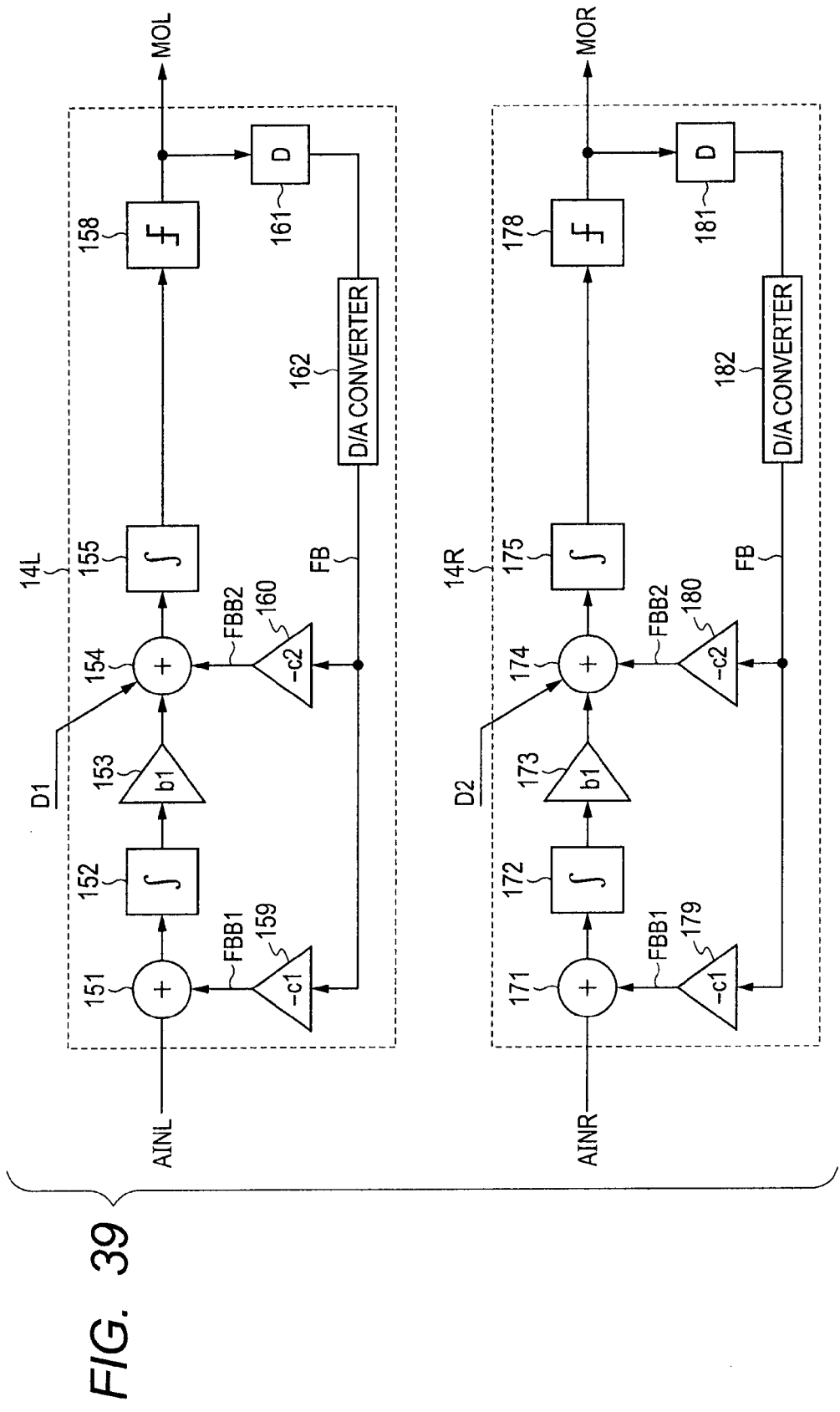
FIG. 39 is a block diagram illustrating an example of a configuration of delta-sigma modulators 14L and 14R.

FIG. 39 is a block diagram illustrating an example of a configuration of the delta-sigma modulators 14L and 14R. As illustrated in FIG. 39, the delta-sigma modulator 14L is a second-order modulator, for example, and comprises addition units 151 and 154, two stages of integrators 152 and 155, gain stages 153, 159, and 160, a quantizer 158, a delay circuit 161, and a D/A converter 162.

The gain stage 159 amplifies a feedback signal FB received from the D/A converter 162 to increase the signal level −c1 times (c1 is a positive value), and outputs the amplified signal as an inverted feedback signal FBB1.

The addition unit 151 adds and outputs an analog input signal AINL and the inverted feedback signal FBB1 outputted from the gain stage 159. That is, a difference signal of the analog input signal AINL and the feedback signal FB is outputted from the addition unit 151.

The integrator 152 integrates and outputs the difference signal obtained by the addition unit 151. The gain stage 153 amplifies an output signal of the integrator 152 to increase the signal level b1 times (b1 is a positive value), and outputs the amplified signal.

The gain stage 160 amplifies the feedback signal FB received from the D/A converter 162 to increase the signal level −c2 times (c2 is a positive value), and outputs the amplified signal as an inverted feedback signal FBB2.

The dither circuit 21L generates a dither signal D1 and superimposes it on an output signal of the gain stage 153. The addition unit 154 adds and outputs the dither signal D1, the output signal of the gain stage 153, and the inverted feedback signal FBB2 outputted from the gain stage 160. That is, a signal indicative of a result of having added the dither signal D1 to the output signal of the gain stage 153, and having subtracted the feedback signal FB is outputted from the addition unit 154.

The integrator 155 integrates and outputs a difference signal obtained by the addition unit 154. The quantizer 158 is a one-bit quantizer, for example, and quantizes an output signal of the integrator 155 by one bit, and outputs the quantized signal obtained as an output signal MOL. The D/A converter 162 converts into an analog signal the output signal MOL which is a one-bit digital signal received via the delay circuit 161, and outputs the converted analog signal as the feedback signal FB.

The delta-sigma modulator 14R is a second-order modulator, for example, and comprises addition units 171 and 174, two stages of integrators 172 and 175, gain stages 173, 179, and 180, a quantizer 178, a delay circuit 181, and a D/A converter 182.

The gain stage 179 amplifies a feedback signal FB received from the D/A converter 182 to increase the signal level −c1 times (c1 is a positive value), and outputs the amplified signal as an inverted feedback signal FBB1.

The addition unit 171 adds and outputs an analog input signal AINR and the inverted feedback signal FBB1 outputted from the gain stage 179. That is, a difference signal of the analog input signal AINR and the feedback signal FB is outputted from the addition unit 171.

The integrator 172 integrates and outputs the difference signal obtained by the addition unit 171. The gain stage 173 amplifies an output signal of the integrator 172 to increase the signal level b1 times (b1 is a positive value), and outputs the amplified signal.

The gain stage 180 amplifies the feedback signal FB received from the D/A converter 182 to increase the signal level −c2 times (c2 is a positive value), and outputs the amplified signal as an inverted feedback signal FBB2.

The dither circuit 21R generates a dither signal D2 and superimposes it on an output signal of the gain stage 173. The addition unit 174 adds and outputs the dither signal D2, the output signal of the gain stage 173, and the inverted feedback signal FBB2 outputted from the gain stage 180. That is, a signal indicative of a result of having added the dither signal D2 to the output signal of the gain stage 173, and having subtracted the feedback signal FB is outputted from the addition unit 174.

The integrator 175 integrates and outputs a difference signal obtained by the addition unit 174. The quantizer 178 is a one-bit quantizer, for example, and quantizes an output signal of the integrator 175 by one bit, and outputs the quantized signal obtained as an output signal MOR. The D/A converter 182 converts into an analog signal the output signal MOR which is a one-bit digital signal received via the delay circuit 181, and outputs the converted analog signal as the feedback signal FB.

Since other configurations and operations are the same as those of the delta-sigma A/D converter 201 according to Embodiment 1, the detailed explanation thereof will not be repeated here.

In this way, even in the configuration using the second-order delta-sigma modulator, as is the case with the delta-sigma A/D converter 201 according to Embodiment 1 of the present invention, it is possible to remove an idle tone, and in addition, it is possible to prevent the input voltage range from narrowing because no dither signal is added to the input section. It is also possible to control a tone due to channel-to-channel interference, by using, as a dither signal, a pseudo random signal which does not have correlation between channels.

As described in Embodiment 1 of the present invention, the dither signals D1 and D2 may be any of a DC dither, a random dither, a square wave, and a saw-tooth wave. However, in the case of adopting a DC dither in Embodiment 4 of the present invention, by adopting the configuration in which a DC addition voltage is superimposed on the output signal of the integrator in the preceding stage of the two stages of integrators in the delta-sigma modulator 14L and 14R, it is possible to perform more easily level adjustment in the delta-sigma modulators 14L and 14R.

Next, another embodiment of the present invention is explained with reference to the accompanying drawings. In drawings, the same reference symbol will be given to the same portion or the corresponding portion, and the explanation thereof will not be repeated.

Embodiment 5

Compared with the delta-sigma A/D converter according to Embodiment 4, the present embodiment relates to a delta-sigma A/D converter in which a position to be added with a dither signal is changed. Contents except what is explained below are the same as those of the delta-sigma A/D converter according to Embodiment 4.

Compared with the delta-sigma A/D converter 204, a delta-sigma A/D converter 205 according to Embodiment 5 of the present invention comprises delta-sigma modulators 15L and 15R instead of the delta-sigma modulators 14L and 14R.

Figure 40:
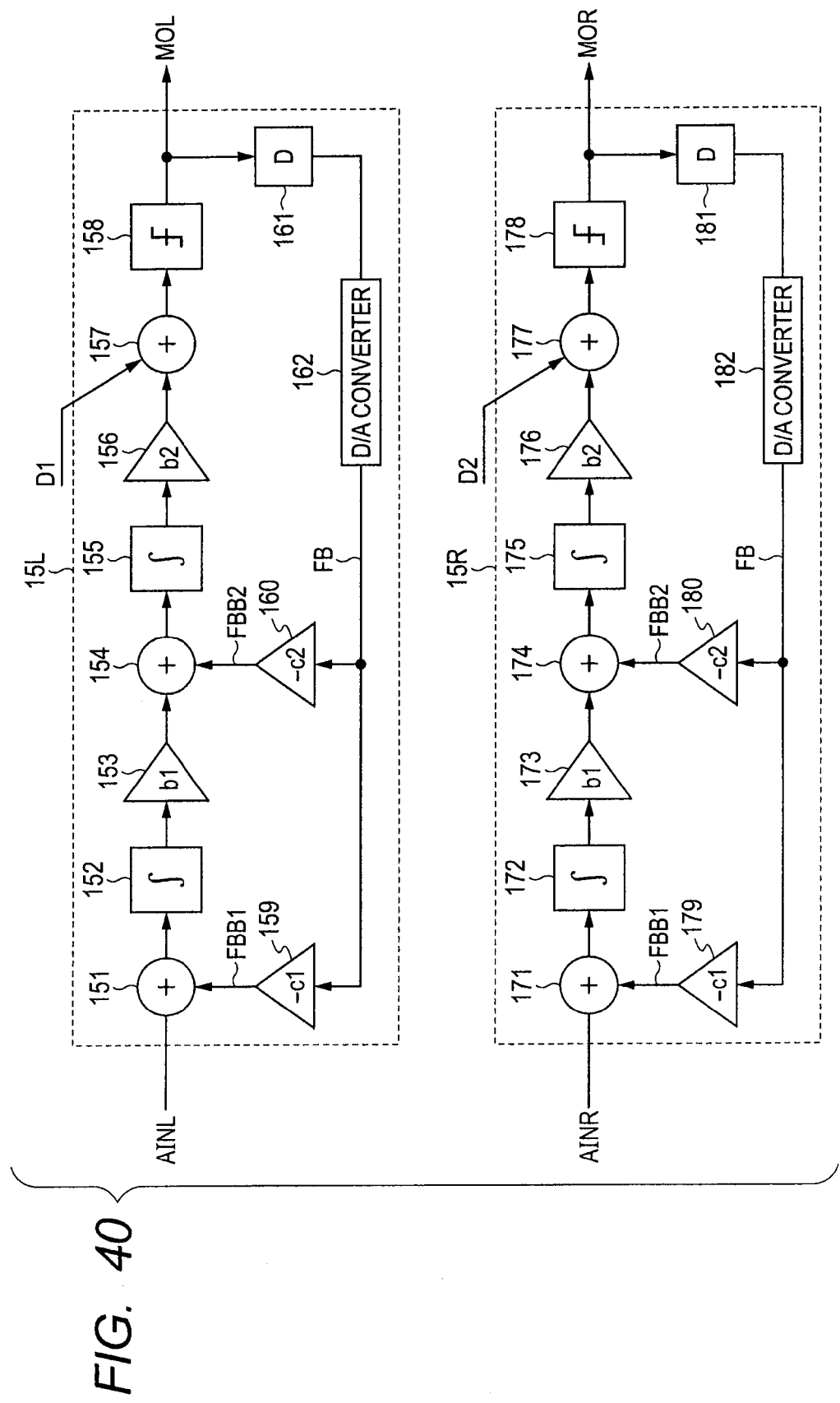
FIG. 40 is a block diagram illustrating an example of a configuration of delta-sigma modulators 15L and 15R.

FIG. 40 is a block diagram illustrating an example of a configuration of delta-sigma modulators 15L and 15R. As illustrated in FIG. 40, the delta-sigma modulator 15L comprises further a gain stage 156 and an addition unit 157, compared with the delta-sigma modulator 14L.

The addition unit 154 adds and outputs the output signal of the gain stage 153 and the inverted feedback signal FBB2 outputted from the gain stage 160. That is, a signal indicative of a result of having subtracted the feedback signal FB from the output signal of the gain stage 153 is outputted from the addition unit 154.

The gain stage 156 amplifies an output signal of the integrator 155 to increase the signal level b2 times (b2 is a positive value), and outputs the amplified signal.

The dither circuit 21L generates a dither signal D1 and superimposes it on an output signal of the gain stage 156. The addition unit 157 adds and outputs the dither signal D1 and an output signal of the gain stage 156.

The quantizer 158 is a one-bit quantizer, for example, and quantizes an output signal of the addition unit 157 by one bit, and outputs the quantized signal obtained as an output signal MOL.

The delta-sigma modulator 15R comprises further a gain stage 176 and an addition unit 177, compared with the delta-sigma modulator 14R.

The addition unit 174 adds and outputs the output signal of the gain stage 173 and the inverted feedback signal FBB2 outputted from the gain stage 180. That is, a signal indicative of a result of having subtracted the feedback signal FB from the output signal of the gain stage 173 is outputted from the addition unit 174.

The gain stage 176 amplifies an output signal of the integrator 175 to increase the signal level b2 times (b2 is a positive value), and outputs the amplified signal.

The dither circuit 21R generates a dither signal D2 and superimposes it on an output signal of the gain stage 176. The addition unit 177 adds and outputs the dither signal D2 and an output signal of the gain stage 176.

The quantizer 178 is a one-bit quantizer, for example, and quantizes an output signal of the addition unit 177 by one bit, and outputs the quantized signal obtained as an output signal MOR.

Since other configurations and operations are the same as those of the delta-sigma A/D converter 204 according to Embodiment 4, the detailed explanation thereof will not be repeated here.

Accordingly, in the delta-sigma A/D converter 205 according to Embodiment 5 of the present invention, as is the case with the delta-sigma A/D converter 204 according to Embodiment 4 of the present invention, it is possible to remove an idle tone, and in addition, it is possible to prevent the input voltage range from narrowing because no dither signal is added to the input section. It is also possible to control a tone due to channel-to-channel interference, by using, as a dither signal, a pseudo random signal which does not have correlation between channels.

As described also in Embodiment 1 of the present invention, the dither signals D1 and D2 may be any of a DC dither, a random dither, a square wave, and a saw-tooth wave. However, in the case of adopting a random dither in Embodiment 5 of the present invention, by adopting the configuration in which a random dither is superimposed on the output signal of the latter integrator of the two stages of integrators in the delta-sigma modulators 15L and 15R, it is possible to perform more easily level adjustment in the delta-sigma modulators 15L and 15R.

Next, another embodiment of the present invention is explained with reference to the accompanying drawings. In drawings, the same reference symbol will be given to the same portion or the corresponding portion, and the explanation thereof will not be repeated.

Embodiment 6

Compared with the delta-sigma A/D converter according to Embodiment 4, the present embodiment relates to a delta-sigma A/D converter in which a position to be added with a dither signal is changed. Contents except what is explained below are the same as those of the delta-sigma A/D converter according to Embodiment 4.

Compared with the delta-sigma A/D converter 204, a delta-sigma A/D converter 206 according to Embodiment 6 of the present invention comprises delta-sigma modulators 16L and 16R instead of the delta-sigma modulators 14L and 14R.

Figure 41:
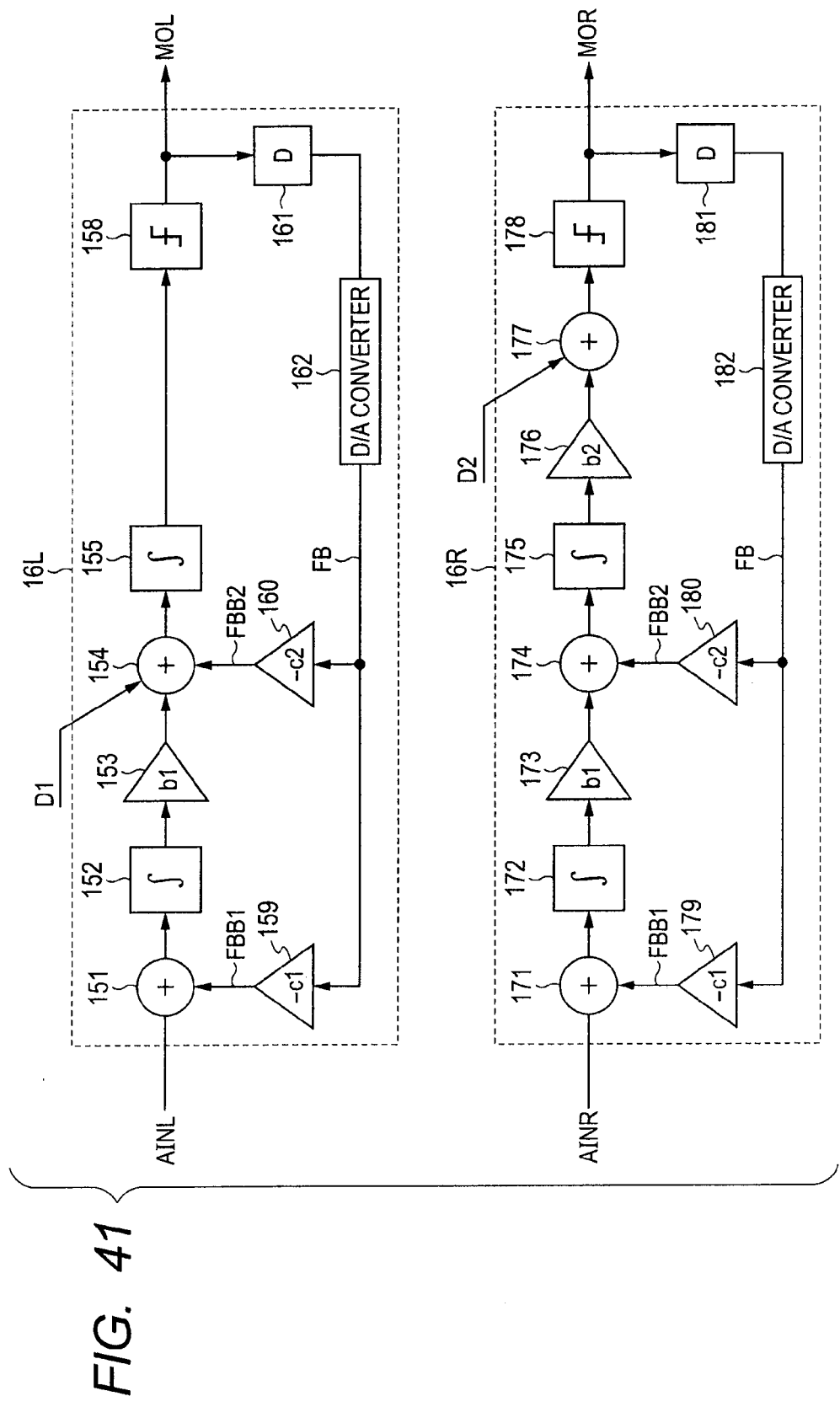
FIG. 41 is a block diagram illustrating an example of a configuration of delta-sigma modulators 16L and 16R.

FIG. 41 is a block diagram illustrating an example of a configuration of delta-sigma modulators 16L and 16R. As illustrated in FIG. 41, the configuration of delta-sigma modulator 16L is the same as that of the delta-sigma modulator 14L. However, the delta-sigma modulator 16R comprises further a gain stage 176 and an addition unit 177, compared with the delta-sigma modulator 14R.

The addition unit 174 adds and outputs the output signal of the gain stage 173 and the inverted feedback signal FBB2 outputted from the gain stage 180. That is, a signal indicative of a result of having subtracted the feedback signal FB from the output signal of the gain stage 173 is outputted from the addition unit 174.

The gain stage 176 amplifies an output signal of the integrator 175 to increase the signal level b2 times (b2 is a positive value), and outputs the amplified signal.

The dither circuit 21R generates a dither signal D2 and superimposes it on an output signal of the gain stage 176. The addition unit 177 adds and outputs the dither signal D2 and an output signal of the gain stage 176.

The quantizer 178 is a one-bit quantizer, for example, and quantizes an output signal of the addition unit 177 by one bit, and outputs the quantized signal obtained as an output signal MOR.

Since other configurations and operations are the same as those of the delta-sigma A/D converter 204 according to Embodiment 4, the detailed explanation thereof will not be repeated here.

As in the delta-sigma A/D converter 206 according to Embodiment 6 of the present invention, even when the position at which the dither signal is superimposed is different in each channel, as is the case with the delta-sigma A/D converter 204 according to Embodiment 4 of the present invention, it is possible to remove an idle tone, and in addition, it is possible to prevent the input voltage range from narrowing because no dither signal is added to the input section. It is also possible to control a tone due to channel-to-channel interference, by using, as a dither signal, a pseudo random signal which does not have correlation between channels.

Next, another embodiment of the present invention is explained with reference to the accompanying drawings. In drawings, the same reference symbol will be given to the same portion or the corresponding portion, and the explanation thereof will not be repeated.

Embodiment 7

Compared with the delta-sigma A/D converter according to Embodiment 4, the present embodiment relates to a delta-sigma A/D converter which is configured such that a DC dither signal is added to an input section. Contents except what is explained below are the same as those of the delta-sigma A/D converter according to Embodiment 4.

Compared with the delta-sigma A/D converter 204, the delta-sigma A/D converter 207 according to Embodiment 7 of the present invention does not comprise a dither circuit 21R, but further comprises a dither circuit 22, and also comprises delta-sigma modulators 17L and 17R instead of the delta-sigma modulators 14L and 14R.

In the delta-sigma A/D converter 207, the dither signal D1 is not a DC addition voltage but a random dither signal, such as an analog conversion signal of a pseudo random signal.

Figure 42:
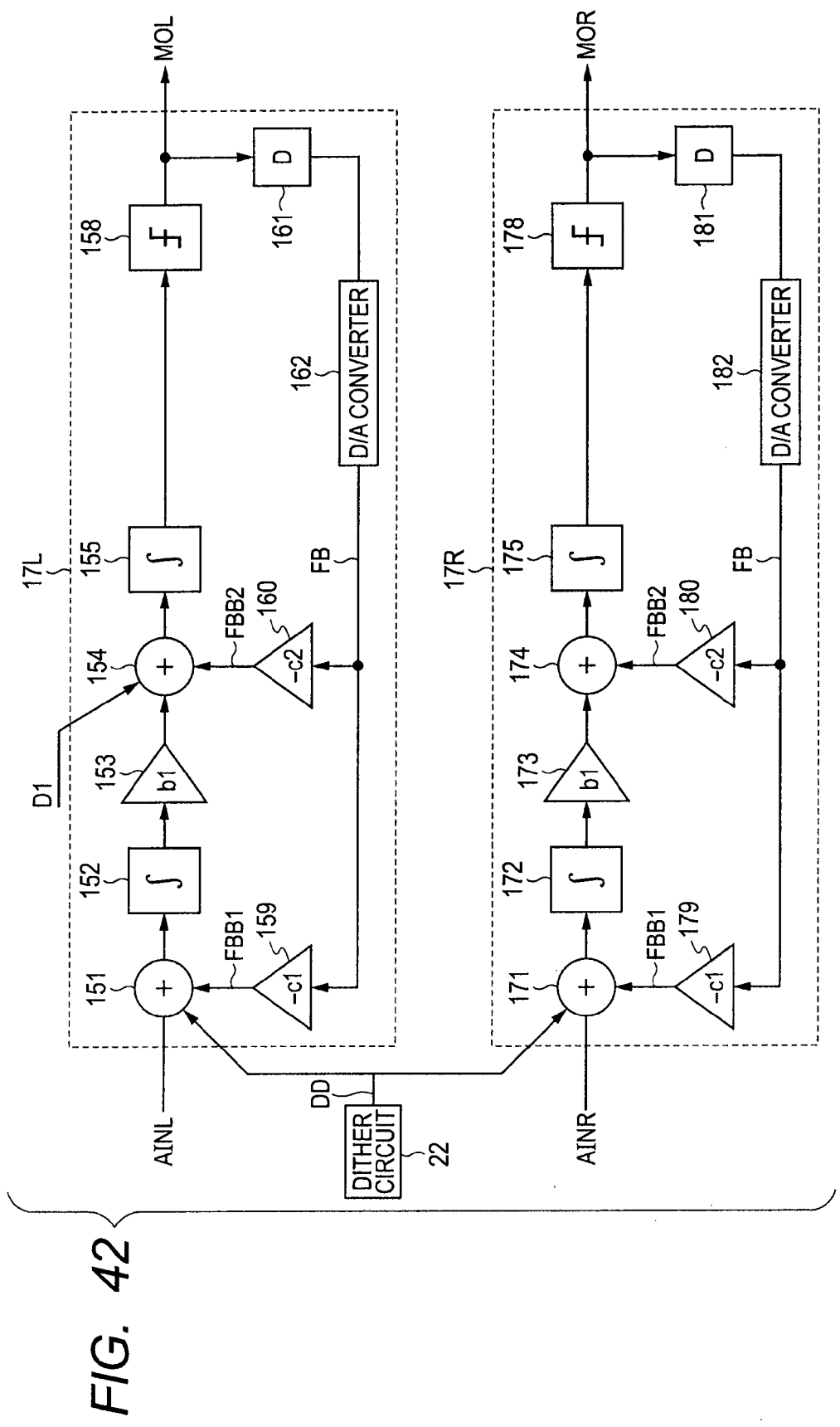
FIG. 42 is a block diagram illustrating an example of a configuration of delta-sigma modulators 17L and 17R.

FIG. 42 is a block diagram illustrating an example of a configuration of delta-sigma modulators 17L and 17R. As illustrated in FIG. 42, the dither circuit 22 generates a dither signal DD which is a DC addition voltage, and superimposes it on analog input signals AINL and AINR.

In the delta-sigma modulator 17L, the addition unit 151 adds and outputs the analog input signal AINL, an inverted feedback signal FBB1 outputted from the gain stage 159, and the dither signal DD. That is, a signal indicative of a result of having added the dither signal DD to the analog input signal AINL, and having subtracted the feedback signal FB is outputted from the addition unit 151.

In the delta-sigma modulator 17R, the addition unit 171 adds and outputs the analog input signal AINR, an inverted feedback signal FBB1 outputted from the gain stage 179, and the dither signal DD. That is, a signal indicative of a result of having added the dither signal DD to the analog input signal AINR, and having subtracted the feedback signal FB is outputted from the addition unit 171.

The addition unit 174 adds and outputs the output signal of the gain stage 173 and the inverted feedback signal FBB2 outputted from the gain stage 180. That is, a signal indicative of a result of having subtracted the feedback signal FB from the output signal of the gain stage 173 is outputted from the addition unit 174.

In the delta-sigma A/D converter 207, an idle tone in each channel moves to a high frequency region by the DC dither signal DD supplied to the input section of the analog signal. In the configuration in which the DC dither signal is only supplied, the frequency of the idle tone of each channel is near, thereby the frequency of a tone generated by mutual interference becomes comparatively low. Accordingly, a tone will be generated in the low frequency side of the desired band of the audible frequency range, etc.

However, in the delta-sigma A/D converter 207, a random dither signal is supplied only to one channel. Accordingly, it becomes possible to remove a tone generated by mutual interference from the desired band.

In the delta-sigma A/D converter 207, an idle tone can be removed by supplying the DC dither signal DD to the input section of the analog signal in each channel. Therefore, it is not necessary to supply the random dither signal to both channels, thereby allowing a configuration in which the dither circuit 21R is not provided, for example.

Furthermore, in the delta-sigma A/D converter 207, as is the case with the delta-sigma A/D converter 204 and the like, a random dither signal is supplied in the output stage of the integrator (it may be the preceding stage of the quantizer) in the delta-sigma modulator. Since the common DC dither signal DD is supplied to each channel, the level of the DC addition voltage is the same in each channel. Accordingly, it is possible to prevent the input voltage range of the delta-sigma A/D converter from becoming narrow.

Since other configurations and operations are the same as those of the delta-sigma A/D converter 204 according to Embodiment 4, the detailed explanation thereof will not be repeated here.

Next, another embodiment of the present invention is explained with reference to the accompanying drawings. In drawings, the same reference symbol will be given to the same portion or the corresponding portion, and the explanation thereof will not be repeated.

Embodiment 8

Compared with the delta-sigma A/D converter according to Embodiment 4, the present embodiment relates to a delta-sigma A/D converter which is configured such that a DC dither signal is added to an input section. Contents except what is explained below are the same as those of the delta-sigma A/D converter according to Embodiment 4.

Compared with the delta-sigma A/D converter 204, the delta-sigma A/D converter 208 according to Embodiment 8 of the present invention does not comprise the dither circuit 21L, but further comprises a dither circuit 22, and also comprises delta-sigma modulators 18L and 18R instead of the delta-sigma modulators 14L and 14R.

In the delta-sigma A/D converter 208, the dither signal D2 is not a DC addition voltage but a random dither signal, such as an analog conversion signal of a pseudo random signal.

Figure 43:
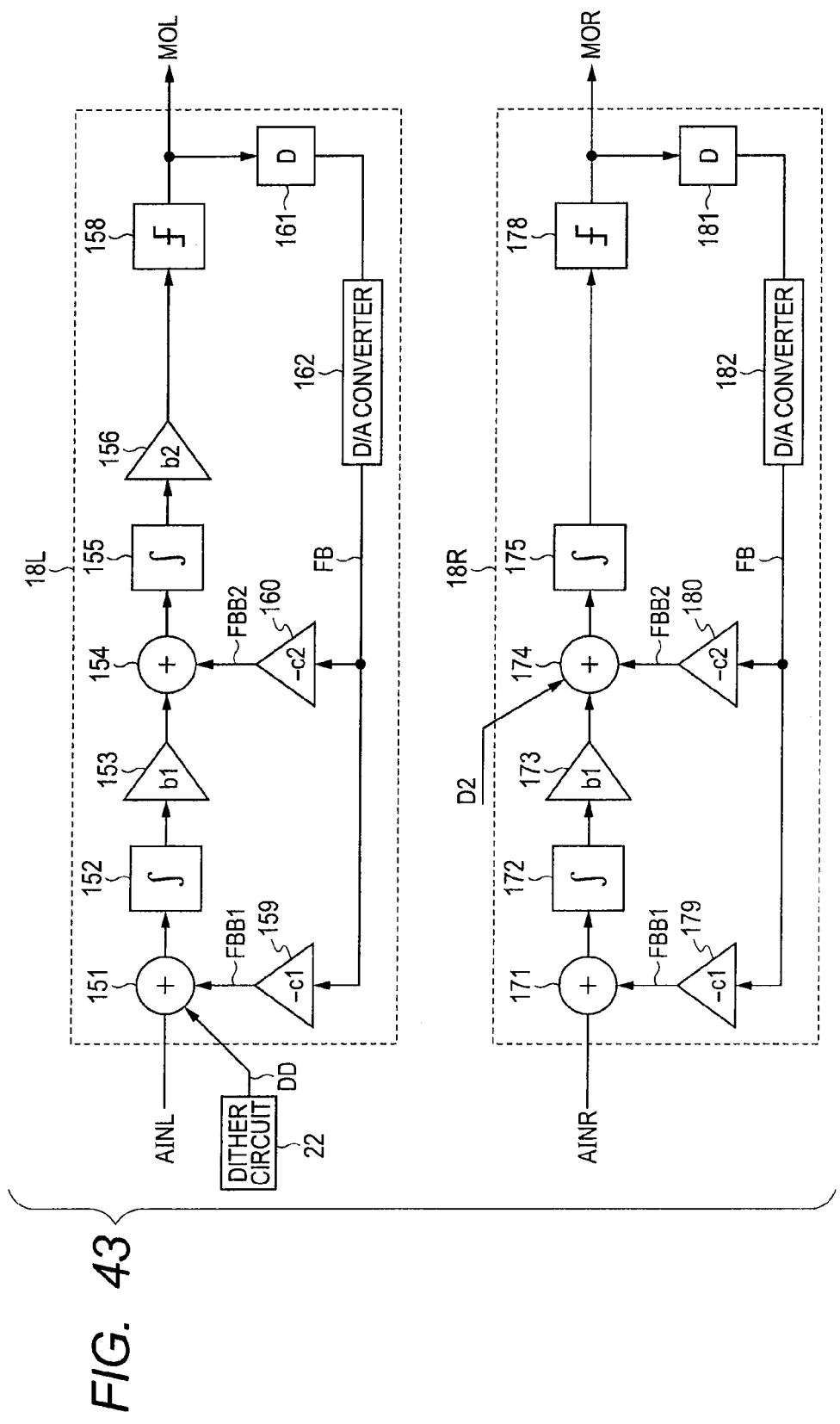
FIG. 43 is a block diagram illustrating an example of a configuration of delta-sigma modulators 18L and 18R.

FIG. 43 is a block diagram illustrating an example of a configuration of the delta-sigma modulators 18L and 18R. As illustrated in FIG. 43, the dither circuit 22 generates a dither signal DD which is a DC addition voltage, and superimposes it on an analog input signal AINL.

In the delta-sigma modulator 18L, the addition unit 151 adds and outputs the analog input signal AINL, the inverted feedback signal FBB1 outputted from the gain stage 159, and the dither signal DD. That is, a signal indicative of a result of having added the dither signal DD to the analog input signal AINL, and having subtracted the feedback signal FB is outputted from the addition unit 151.

The addition unit 154 adds and outputs the output signal of the gain stage 153 and the inverted feedback signal FBB2 outputted from the gain stage 160. That is, a signal indicative of a result of having subtracted the feedback signal FB from the output signal of the gain stage 153 is outputted from the addition unit 154.

The configuration of the delta-sigma modulator 18R is the same as that of the delta-sigma modulator 14R. An alternative configuration may be such that the random dither signal D2 is supplied in the preceding stage of the quantizer in the delta-sigma modulator 18R.

In the delta-sigma A/D converter 208, an idle tone in the L channel Lch moves to a high frequency region by the DC dither signal DD supplied to the input section of the analog signal AINL. An idle tone in the R channel Rch moves to a high frequency region by the random dither signal supplied in the output stage of the integrator or in the preceding stage of the quantizer in the delta-sigma modulator 18R.

By virtue of the fact that the dither signal supplied to the L channel Lch and the dither signal supplied to the R channel Rch are different, it becomes possible to remove a tone generated by mutual interference from the desired band.

Since the idle tone can be removed by supplying the DC dither signal DD to the input section of the analog signal AINL in the L channel Lch, it is not necessary to supply the random dither signal to the L channel Lch, thereby allowing a configuration in which the dither circuit 21L is not provided, for example.

Furthermore, in the delta-sigma A/D converter 208, as is the case with the delta-sigma A/D converter 204 and the like, the random dither signal is supplied in the output stage of the integrator or in the preceding stage of the quantizer in the delta-sigma modulator. Also, the DC addition voltage is supplied only to the L channel Lch. Accordingly, it is possible to prevent the input voltage range of the delta-sigma A/D converter from becoming narrow.

Since other configurations and operations are the same as those of the delta-sigma A/D converter 204 according to Embodiment 4, the detailed explanation thereof will not be repeated here.

Next, another embodiment of the present invention is explained with reference to the accompanying drawings. In drawings, the same reference symbol will be given to the same portion or the corresponding portion, and the explanation thereof will not be repeated.

Embodiment 9

Compared with the delta-sigma A/D converter according to Embodiment 1, the present embodiment relates to a delta-sigma A/D converter in which an order of integration of a delta-sigma modulator is changed. Contents except what is explained below are the same as those of the delta-sigma A/D converter according to Embodiment 1.

Compared with the delta-sigma A/D converter 201, a delta-sigma A/D converter 209 according to Embodiment 9 of the present invention comprises delta-sigma modulators 19L and 19R, instead of the delta-sigma modulators 11L and 11R.

Figure 44:
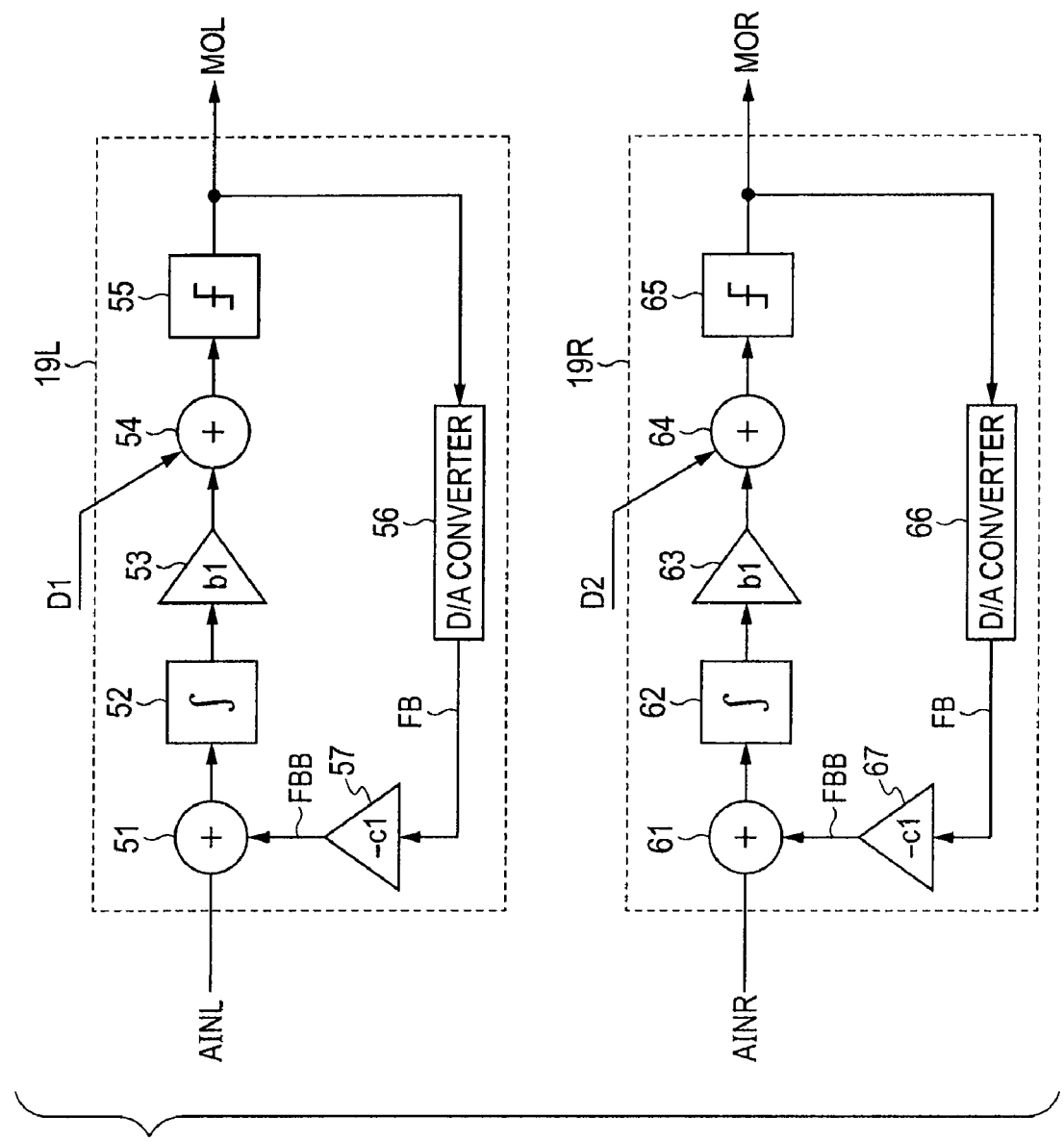
FIG. 44 is a block diagram illustrating an example of a configuration of delta-sigma modulators 19L and 19R.

FIG. 44 is a block diagram illustrating an example of a configuration of delta-sigma modulators 19L and 19R. As illustrated in FIG. 44, the delta-sigma modulator 19L is a first-order modulator, for example, and comprises addition units 51 and 54, an integrator 52, gain stages 53 and 57, a quantizer 55, and a D/A converter 56.

The gain stage 57 amplifies a feedback signal FB received from the D/A converter 56 to increase the signal level −c1 times (c1 is a positive value), and outputs the amplified signal as an inverted feedback signal FBB.

The addition unit 51 adds and outputs an analog input signal AINL and the inverted feedback signal FBB outputted from the gain stage 57. That is, a difference signal of the analog input signal AINL and the feedback signal FB is outputted from the addition unit 51.

The integrator 52 integrates and outputs a difference signal obtained by the addition unit 51. The gain stage 53 amplifies an output signal of the integrator 52 to increase the signal level b1 times (b1 is a positive value), and outputs the amplified signal.

The dither circuit 21L generates a dither signal D1 and superimposes it on an output signal of the gain stage 53. The addition unit 54 adds and outputs the dither signal D1 and an output signal of the gain stage 53. That is, a signal indicative of a result of having added the dither signal D1 to the output signal of the gain stage 53 is outputted from the addition unit 54.

The quantizer 55 is a one-bit quantizer, for example, and quantizes an output signal of the addition unit 54 by one bit, and outputs the quantized signal obtained as an output signal MOL. The D/A converter 56 converts into an analog signal the output signal MOL which is a one-bit digital signal, and outputs the converted analog signal as the feedback signal FB.

The delta-sigma modulator 19R is a first-order modulator, for example, and comprises addition units 61 and 64, an integrator 62, gain stages 63 and 67, a quantizer 65, and a D/A converter 66.

The gain stage 67 amplifies a feedback signal FB received from the D/A converter 66 to increase the signal level −c1 times (c1 is a positive value), and outputs the amplified signal as an inverted feedback signal FBB.

The addition unit 61 adds and outputs an analog input signal AINR and the inverted feedback signal FBB outputted from the gain stage 67. That is, a difference signal of the analog input signal AINR and the feedback signal FB is outputted from the addition unit 61.

The integrator 62 integrates and outputs a difference signal obtained by the addition unit 61. The gain stage 63 amplifies an output signal of the integrator 62 to increase the signal level b1 times (b1 is a positive value), and outputs the amplified signal.

The dither circuit 21R generates a dither signal D2 and superimposes it on an output signal of the gain stage 63. The addition unit 64 adds and outputs the dither signal D2 and an output signal of the gain stage 63. That is, a signal indicative of a result of having added the dither signal D2 to the output signal of the gain stage 63 is outputted from the addition unit 64.

The quantizer 65 is a one-bit quantizer, for example, and quantizes an output signal of the addition unit 64 by one bit, and outputs the quantized signal obtained as an output signal MOR. The D/A converter 66 converts into an analog signal the output signal MOR which is a one-bit digital signal, and outputs the converted analog signal as the feedback signal FB.

Since other configurations and operations are the same as those of the delta-sigma A/D converter 201 according to Embodiment 1, the detailed explanation thereof will not be repeated here.

In this way, even in the configuration using the first-order delta-sigma modulator, as is the case with the delta-sigma A/D converter 201 according to Embodiment 1 of the present invention, it is possible to remove an idle tone, and in addition, it is possible to prevent the input voltage range from narrowing because no dither signal is added to the input section. It is also possible to control a tone due to channel-to-channel interference, by using, as a dither signal, a pseudo random signal which does not have correlation between channels.

It should be understood by those skilled in the art that the embodiments disclosed in the present description are given by way of illustration only and are not restrictive in all the points. The scope of the present invention is illustrated not by the explanatory description given above but the scope of the appended claims, and it is meant that various modifications, combinations, and alterations may occur depending on design requirements and other factors insofar as they are within the scope of the appended claims or the equivalents thereof.

What is claimed is:

1. A delta-sigma A/D converter for converting a first analog input signal into a first digital signal, and converting a second analog input signal into a second digital signal, the delta-sigma A/D converter comprising:

a first quantizer that quantizes a received signal and outputs a quantized signal;

a first D/A converter that converts the quantized signal outputted by the first quantizer into an analog signal, and outputs the analog signal;

a first operation unit that outputs a signal indicative of a difference of the first analog input signal and the analog signal outputted by the first D/A converter;

a first integrator that integrates the signal outputted by the first operation unit and outputs an integrated signal;

a first dither circuit that generates a first dither signal;

a second operation unit that adds the first dither signal to the integrated signal outputted by the first integrator and outputs an added signal to the first quantizer;

a second quantizer that quantizes a received signal and outputs a quantized signal;

a second D/A converter that converts the quantized signal outputted by the second quantizer into an analog signal, and outputs the analog signal;

a third operation unit that outputs a signal indicative of a difference of the second analog input signal and the analog signal outputted by the second D/A converter;

a second integrator that integrates the signal outputted by the third operation unit and outputs an integrated signal;

a second dither circuit that generates a second dither signal different from the first dither signal; and a fourth operation unit that adds the second dither signal to the integrated signal outputted by the second integrator and outputs an added signal to the second quantizer.

2. The delta-sigma A/D converter according to claim 1, wherein the first dither circuit and the second dither circuit generate DC voltages with the same polarity and different voltage levels with each other, as the first dither signal and the second dither signal, respectively.

3. The delta-sigma A/D converter according to claim 2, further comprising:

a third integrator that integrates the signal outputted by the second operation unit and outputs an integrated signal to the first quantizer; and a fourth integrator that integrates the signal outputted by the fourth operation unit and outputs an integrated signal to the second quantizer.

4. The delta-sigma A/D converter according to claim 1, wherein the first dither circuit and the second dither circuit generate analog signals converted from digital signals with different values with each other at plural phases of timing, as the first dither signal and the second dither signal, respectively.

5. The delta-sigma A/D converter according to claim 4, further comprising:

a third integrator that integrates the output signal of the first integrator and outputs an integrated signal; and a fourth integrator that integrates the output signal of the second integrator and outputs an integrated signal, wherein the second operation unit adds the first dither signal to the integrated signal outputted by the third integrator and outputs an added signal to the first quantizer, and wherein the fourth operation unit adds the second dither signal to the integrated signal outputted by the fourth integrator and outputs an added signal to the second quantizer.

6. The delta-sigma A/D converter according to claim 1, wherein the first dither circuit generates a DC voltage as the first dither signal, and wherein the second dither circuit generates an analog signal converted from a digital signal with a changing value, as the second dither signal.

7. The delta-sigma A/D converter according to claim 6, further comprising:

a third integrator that integrates the signal outputted by the second operation unit and outputs an integrated signal to the first quantizer; and a fourth integrator that integrates the output signal of the second integrator and outputs an integrated signal, wherein the fourth operation unit adds the second dither signal to the integrated signal outputted by the fourth integrator and outputs an added signal to the second quantizer.

8. A delta-sigma A/D converter for converting a first analog input signal into a first digital signal, and converting a second analog input signal into a second digital signal, the delta-sigma A/D converter comprising:

a first quantizer that quantizes a received signal and outputs a quantized signal;

a first D/A converter that converts the quantized signal outputted by the first quantizer into an analog signal, and outputs the analog signal;

a first dither circuit that generates a DC voltage as a first dither signal;

a first operation unit that outputs a signal indicative of a resultant signal of the first analog input signal to which the first dither signal is added and from which the analog signal outputted by the first D/A converter is subtracted;

a first integrator that integrates the signal outputted by the first operation unit and outputs an integrated signal to the first quantizer; and a second quantizer that quantizes a received signal and outputs a quantized signal;

a second D/A converter that converts the quantized signal outputted by the second quantizer into an analog signal, and outputs the analog signal;

a second operation unit that outputs a signal indicative of a difference of the second analog input signal and the analog signal outputted by the second D/A converter;

a second integrator that integrates the signal outputted by the second operation unit and outputs an integrated signal;

a second dither circuit that generates a second dither signal with a changing voltage level; and a third operation unit that adds the second dither signal to the integrated signal outputted by the second integrator and outputs an added signal to the second quantizer.

9. The delta-sigma A/D converter according to claim 8, wherein the second operation unit outputs a signal indicative of a resultant signal of the second analog input signal to which the first dither signal is added, and from which the analog signal outputted by the second D/A converter is subtracted.

* * * * *